(12) United States Patent
Chuang et al.

(10) Patent No.: US 11,342,488 B2
(45) Date of Patent: May 24, 2022

(54) LIGHT EMITTING DIODE CHIP AND LIGHT EMITTING DIODE DEVICE

(71) Applicant: Genesis Photonics Inc., Tainan (TW)

(72) Inventors: Tung-Lin Chuang, Tainan (TW); Yi-Ru Huang, Tainan (TW); Yu-Chen Kuo, Tainan (TW); Yan-Ting Lan, Tainan (TW); Chih-Ming Shen, Tainan (TW); Jing-En Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 16/531,148

(22) Filed: Aug. 5, 2019

(65) Prior Publication Data

US 2020/0075821 A1   Mar. 5, 2020

Related U.S. Application Data

(60) Provisional application No. 62/714,098, filed on Aug. 3, 2018, provisional application No. 62/816,922, filed on Mar. 12, 2019, provisional application No. 62/865,997, filed on Jun. 25, 2019.

(51) Int. Cl.
| | |
|---|---|
| *H01L 27/15* | (2006.01) |
| *H01L 33/60* | (2010.01) |
| *H01L 33/36* | (2010.01) |
| *H01L 25/075* | (2006.01) |

(Continued)

(52) U.S. Cl.
CPC .......... *H01L 33/60* (2013.01); *H01L 25/0753* (2013.01); *H01L 33/145* (2013.01); *H01L 33/36* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 7,180,094 B2 * | 2/2007 | Seong | ............. H01L 33/42 |
| | | | 257/103 |
| 2011/0233586 A1 | 9/2011 | Kojima et al. | |

(Continued)

FOREIGN PATENT DOCUMENTS

| | | |
|---|---|---|
| CN | 104471727 | 3/2015 |
| CN | 106486572 | 3/2017 |

(Continued)

*Primary Examiner* — Hung K Vu
(74) *Attorney, Agent, or Firm* — JCIPRNET

(57) ABSTRACT

A light emitting diode chip including an epitaxy stacked layer, first and second electrodes and a first reflective layer is provided. The epitaxy stacked layer includes first-type and second-type semiconductor layers and a light-emitting layer. The first and second electrodes are respectively electrically connected to the first-type and second-type semiconductor layers. An orthogonal projection of the light-emitting layer on the first-type semiconductor layer is misaligned with an orthogonal projection of the first electrode on the first-type semiconductor layer. The first reflective layer is disposed on the epitaxy stacked layer, the first and second electrodes. An orthogonal projection of the first reflective layer on the second-type semiconductor layer is misaligned with an orthogonal projection of the second electrode on the second-type semiconductor layer. Furthermore, a light emitting diode device is also provided.

19 Claims, 70 Drawing Sheets

(51) Int. Cl.
*H01L 33/14* (2010.01)
*H01L 33/62* (2010.01)

(56) References Cited

U.S. PATENT DOCUMENTS

| | | | |
|---|---|---|---|
| 2015/0333241 A1* | 11/2015 | Chen | ............... H01L 25/0753 |
| | | | 257/93 |
| 2015/0364643 A1 | 12/2015 | Sumitomo et al. | |
| 2018/0130924 A1 | 5/2018 | Ko et al. | |
| 2018/0145224 A1* | 5/2018 | Kim | ............... H01L 33/502 |

FOREIGN PATENT DOCUMENTS

| | | |
|---|---|---|
| CN | 107919420 | 4/2018 |
| CN | 107968143 | 4/2018 |
| EP | 2423984 | 2/2012 |
| JP | 2005072422 | 3/2005 |
| KR | 20180016181 | 2/2018 |
| WO | 2018117382 | 6/2018 |

* cited by examiner

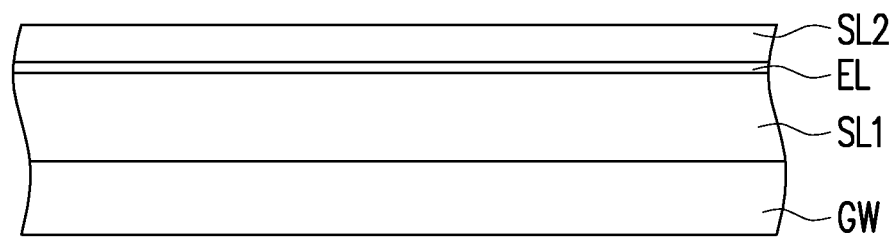
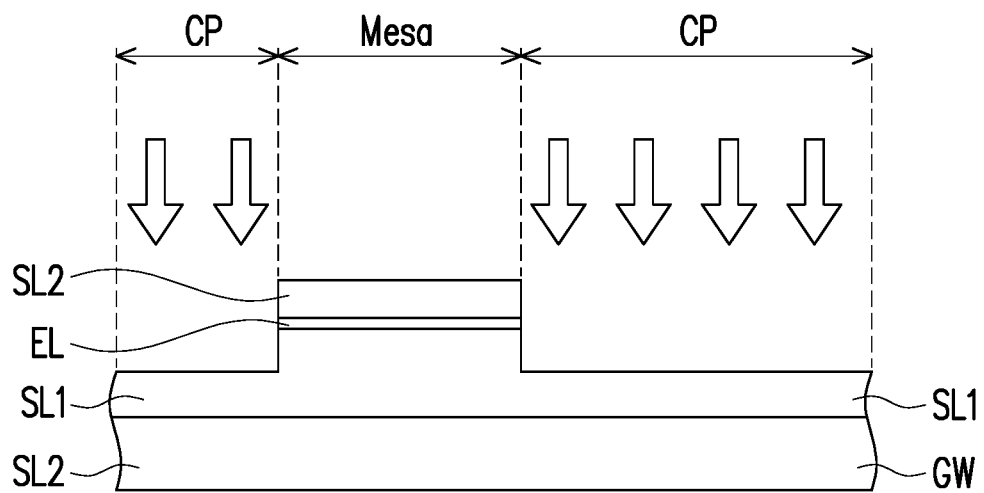
FIG. 2B
FIG. 2C

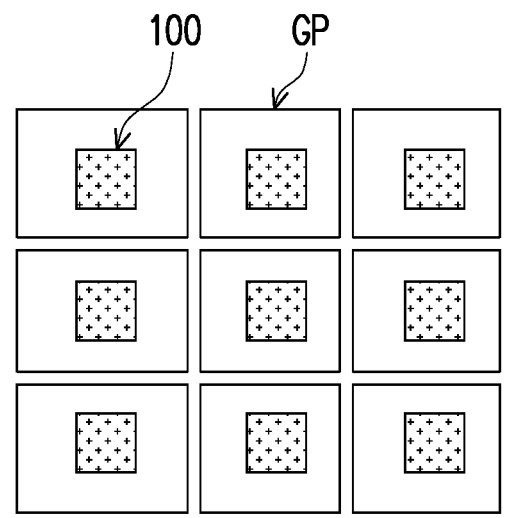
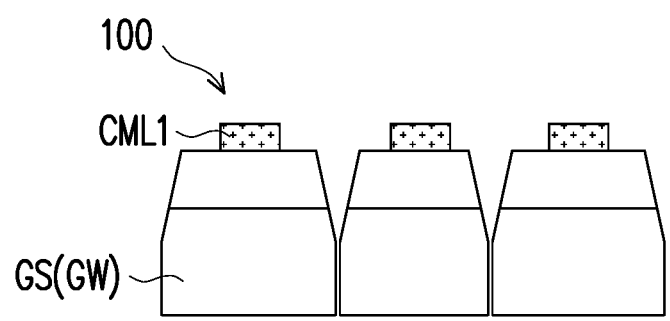
FIG. 2M

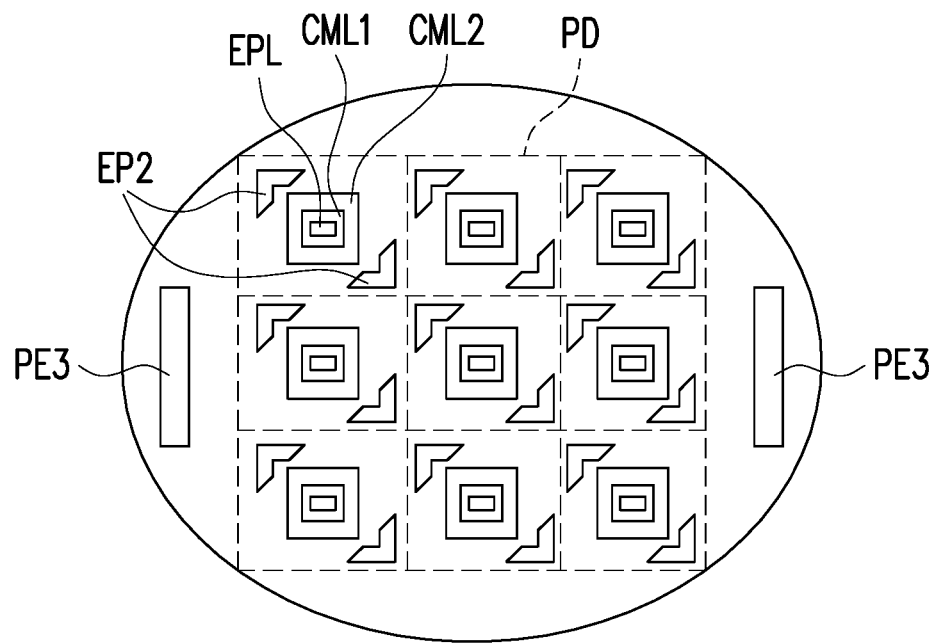
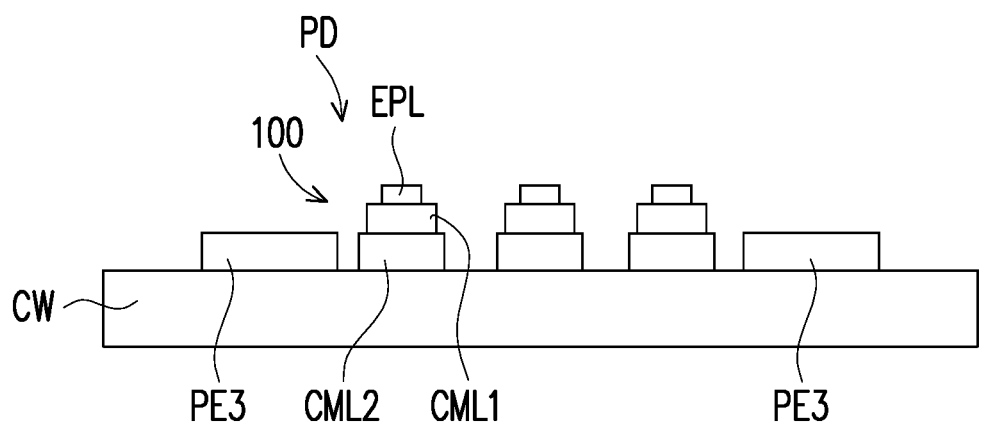
FIG. 2P

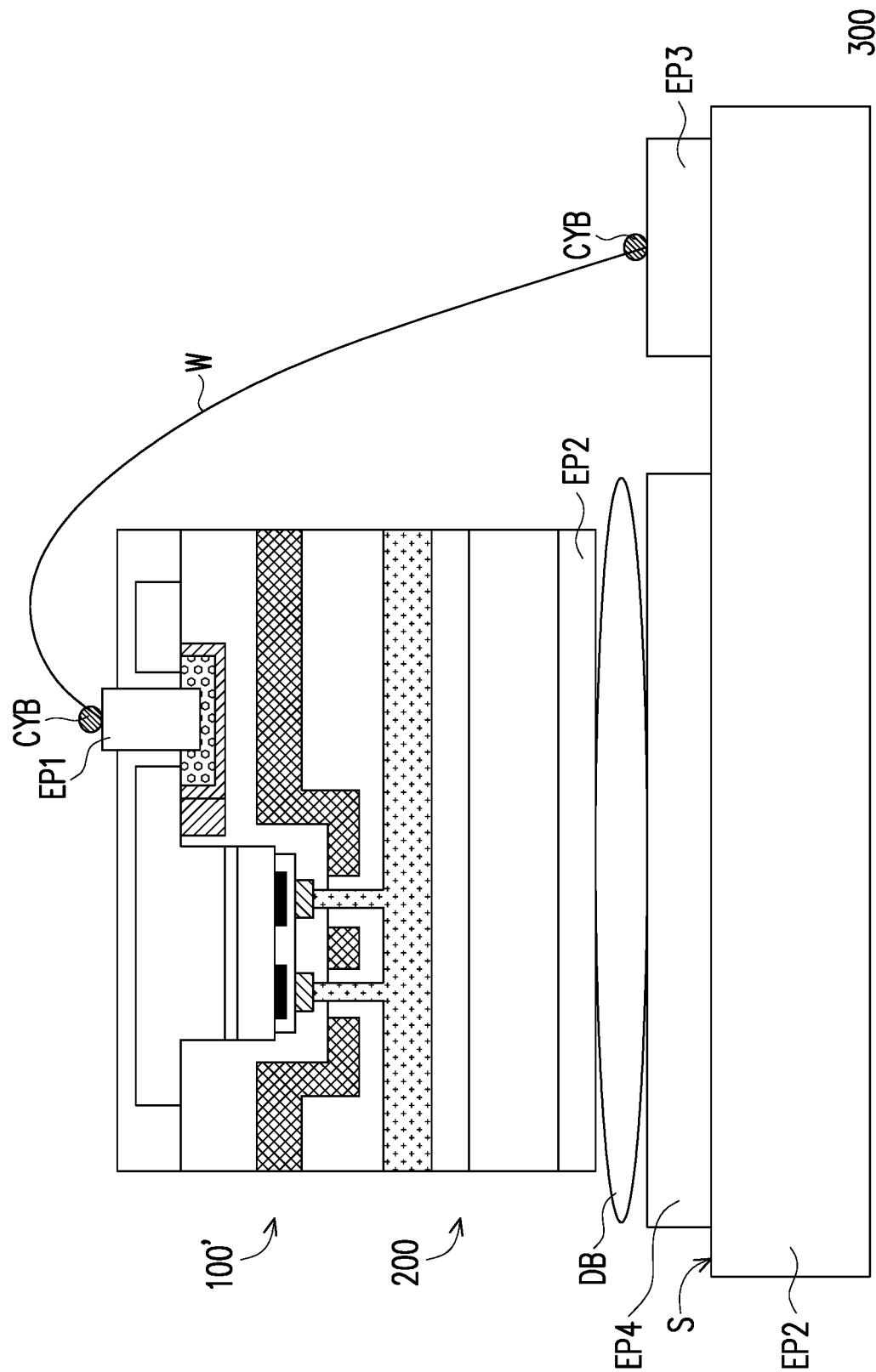

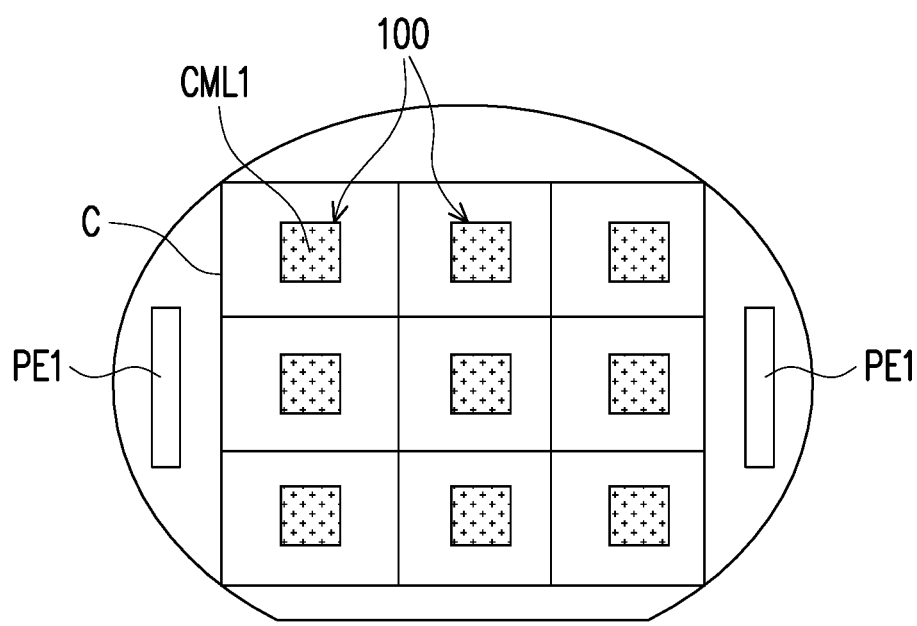
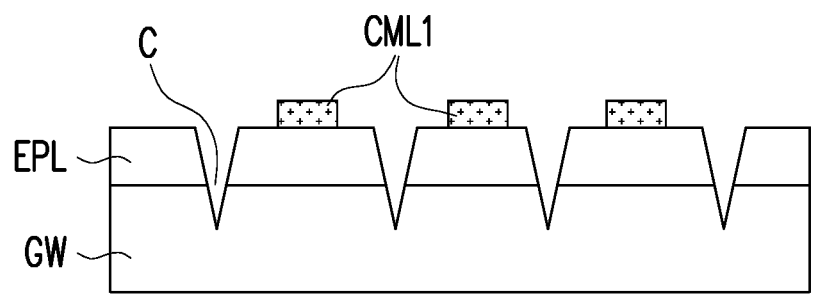
FIG. 4M

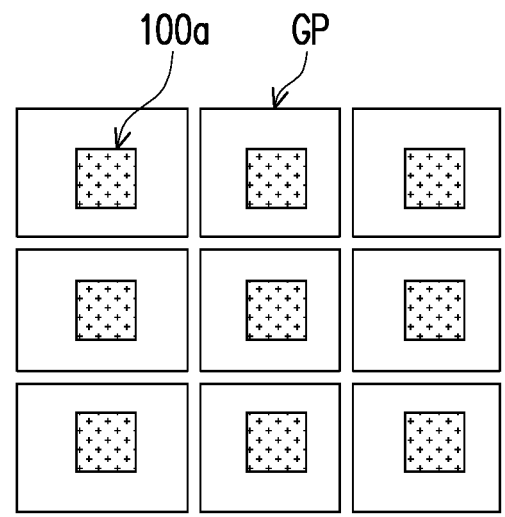
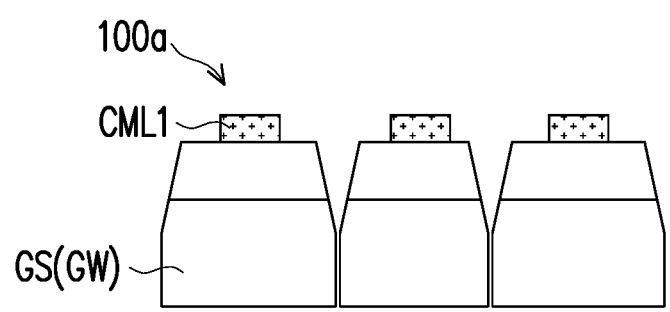
FIG. 4N

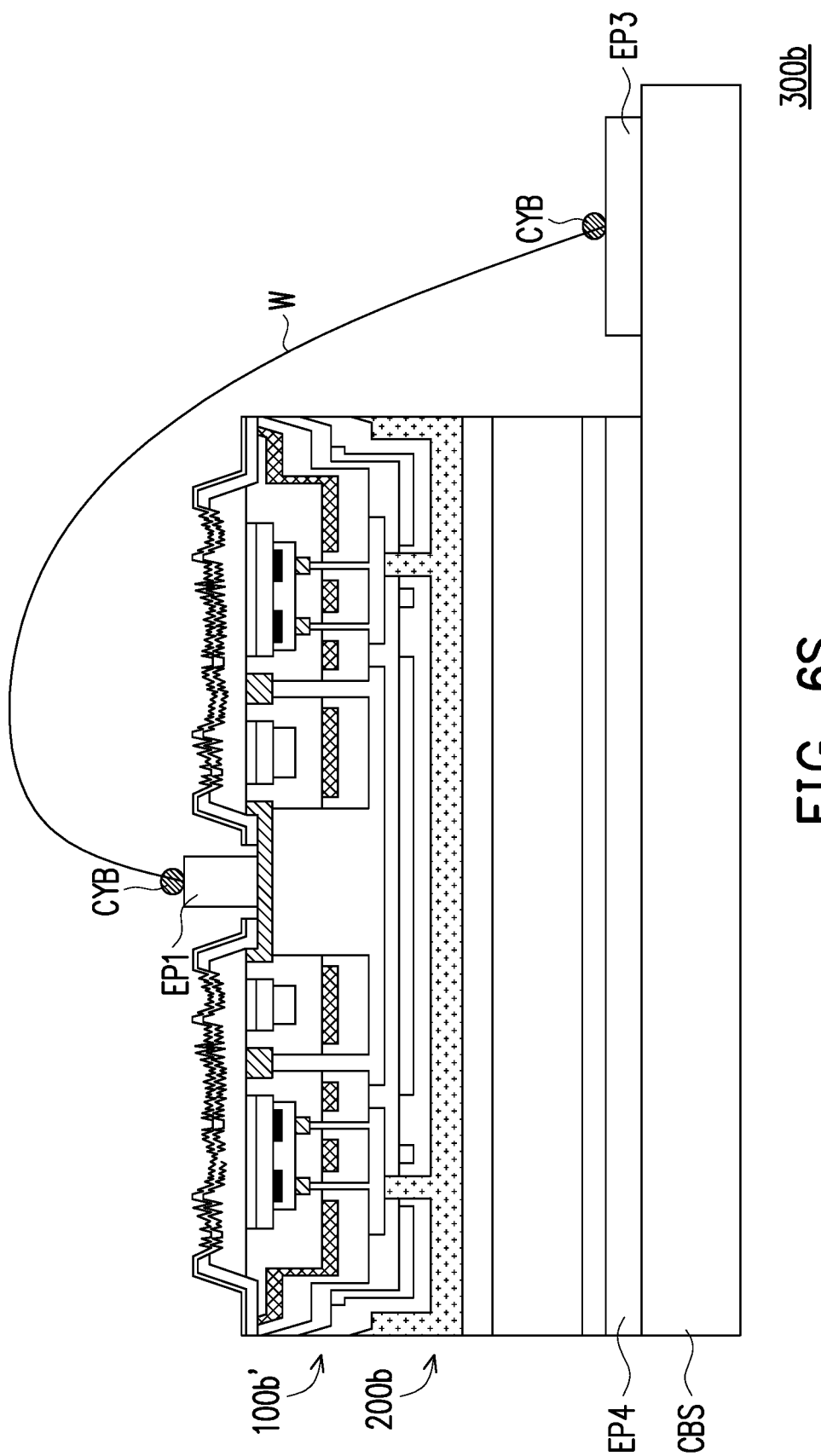

LIGHT EMITTING DIODE CHIP AND LIGHT EMITTING DIODE DEVICE

CROSS-REFERENCE TO RELATED APPLICATION

This application claims the priority benefits of U.S. provisional application Ser. No. 62/714,098, filed on Aug. 3, 2018, U.S. provisional application Ser. No. 62/816,922, filed on Mar. 12, 2019, and U.S. provisional application Ser. No. 62/865,997, filed on Jun. 25, 2019. The entirety of each of the above-mentioned patent applications is hereby incorporated by reference herein and made a part of this specification.

TECHNICAL FIELD

The invention relates an optoelectronic element, and more particularly, relates to a light emitting diode chip, a light emitting diode device and a light emitting diode module.

BACKGROUND

A light emitting diode (LED) is an illuminating semiconductor electronic element widely used (as traffic lights, headlights, outdoor large display panels, mobile phone backlights, etc.) due to high energy conversion efficiency, short reaction time, long life, small size and high reliability. At present, those skilled in the art are continually striving to improve luminous efficiency and brightness of the light emitting diode.

SUMMARY

The invention provides a light emitting diode chip, a light emitting diode device and a light emitting diode module, which are capable of providing high luminous efficiency.

An embodiment of the invention provides a light emitting diode chip including an epitaxy stacked layer, a first electrode, a second electrode and a first reflective layer. The epitaxy stacked layer includes a first-type semiconductor layer, a light-emitting layer and a second-type semiconductor layer. The light-emitting layer is located between the first-type semiconductor layer and the second-type semiconductor layer. The first electrode is disposed on the first-type semiconductor layer, and electrically connected to the first-type semiconductor layer. The light-emitting layer's orthogonal projection on the first-type semiconductor layer is misaligned with the first electrode's orthogonal projection on the first-type semiconductor layer. The second electrode is disposed on the second-type semiconductor layer, and electrically connected to the second-type semiconductor layer. The first reflective layer is disposed on the epitaxy stacked layer, the first electrode and the second electrode. The first reflective layer's orthogonal projection on the second-type semiconductor layer is misaligned with the second electrode's orthogonal projection on the second-type semiconductor layer.

An embodiment of the invention provides a light emitting diode device including aforesaid light emitting diode chip, a first electrode pad and a carrier substrate. The first electrode pad is disposed on one side of the light emitting diode chip, and electrically connected to the first electrode. The carrier substrate is disposed on another side of the light emitting diode chip, and electrically connected to the second electrode. The carrier substrate has a first surface and a second surface opposite to each other. The light emitting diode chip and the first electrode are disposed on the first surface.

An embodiment of the invention provides a light emitting diode module including aforesaid light emitting diode device, a circuit substrate, a third electrode pad and a fourth electrode pad. The third electrode pad is electrically connected to the circuit substrate, and the third electrode pad is electrically connected to the first electrode pad. The fourth electrode pad is electrically connected to the circuit substrate, and the fourth electrode pad is electrically connected to a second electrode pad.

In an embodiment of the invention, the light emitting diode chip further includes a first reflective stacked layer including a first insulation layer, a first reflective layer and a second insulation layer. The first reflective layer is located between the first insulation layer and the second insulation layer. The first insulation layer is disposed on the epitaxy stacked layer, the first electrode and the second electrode and has a plurality of first via holes. The first reflective layer is disposed on the first insulation layer and has a plurality of second via holes. The second via holes' orthogonal projections on the second-type semiconductor layer are overlapped with the second electrode's orthogonal projection on the second-type semiconductor layer. The second insulation layer is disposed on the first reflective layer and has a plurality of third via holes. The first via holes, the second via holes and the third via holes expose the second electrode, and an orthogonal projection area of the second via hole on the second-type semiconductor layer is greater than or equal to orthogonal projection areas of the first via hole or the third via hole on the second-type semiconductor layer. The orthogonal projection areas of the first via hole and the third via hole are equal.

In an embodiment of the invention, the light emitting diode chip further includes a first connection metal layer. The first connection metal layer is disposed on the second insulation layer and electrically connected to the second electrode through the first via holes, the second via holes and the third via holes.

In an embodiment of the invention, the first reflective stacked layer further includes a second reflective layer. The second reflective layer is disposed on the first reflective layer and located between the second insulation layer and the first insulation layer. The second reflective layer has a plurality of fourth via holes. The fourth via holes' orthogonal projections on the second-type semiconductor layer are overlapped with the second electrode's orthogonal projection on the second-type semiconductor layer. The fourth via hole's orthogonal projection area on the second-type semiconductor layer is greater than or equal to the second via hole's orthogonal projection area on the second-type semiconductor layer, or the fourth via hole's orthogonal projection area on the second-type semiconductor layer is greater than or equal to the first via hole's or the third via hole's orthogonal projection areas on the second-type semiconductor layer. The first via holes, the second via holes, the third via holes and the fourth via holes expose the second electrode.

In an embodiment of the invention, the light emitting diode chip further includes a first connection metal layer. The first connection metal layer is disposed on the second insulation layer and electrically connected to the second electrode through the first via holes, the second via holes, the third via holes and the fourth via holes.

In an embodiment of the invention, the light emitting diode chip further includes a second reflective stacked layer. The second reflective stacked layer is disposed on the first reflective stacked layer. The second reflective stacked layer includes a third insulation layer, a third reflective layer and a fourth insulation layer. The third reflective layer is located between the third insulation layer and the fourth insulation layer. The third insulation layer is disposed on the first reflective stacked layer and has a plurality of fifth via holes. The third reflective layer is disposed on the third insulation layer and has a plurality of sixth via holes. The sixth via holes' orthogonal projections on the second-type semiconductor layer are overlapped with a portion of the second electrode's orthogonal projection on the second-type semiconductor layer. The fourth insulation layer is disposed on the second reflective layer and has a plurality of seventh via holes. The fifth via holes, the sixth via holes and the seventh via holes expose the portion of the second electrode, and an orthogonal projection area of the sixth via hole on the second-type semiconductor layer is greater than or equal to orthogonal projection areas of the fifth via hole or the seventh via hole on the second-type semiconductor layer. The orthogonal projection areas of the fifth via hole and the seventh via hole are equal. The orthogonal projection area of the sixth via hole of the third reflective layer disposed on the third insulation layer on the second-type semiconductor layer is greater than or equal to the orthogonal projection area of the second via hole of the first reflective layer disposed on the first insulation layer on the second-type semiconductor layer. The orthogonal projection areas of the first via hole on the first insulation layer, the third via hole on the second insulation layer, the fifth via hole on the third insulation layer and the seventh via hole on the fourth insulation layer on the second-type semiconductor layer are equal.

In an embodiment of the invention, the light emitting diode chip further includes a first connection metal layer, a first current conductive layer and a second current conductive layer. The first connection metal layer is disposed on the second reflective stacked layer. The first current conductive layer and the second current conductive layer are located between the first reflective stacked layer and the second reflective stacked layer. The first current conductive layer is disposed on the first electrode and electrically connected to the first electrode. The second current conductive layer is disposed on the second electrode and electrically connected to the second electrode. The first connection metal layer is electrically connected to the second connection metal layer through the fifth via holes, the sixth via holes and the seventh via holes.

In an embodiment of the invention, the first electrode further includes a plurality of first electrode portions separated apart from each other, and the second electrode further includes a plurality of second electrode portions separated apart from each other. The second electrode portions are disposed around the first electrode portions. The first current conductive layer is electrically connected to the first electrode portions separated apart from each other, and the second current conductive layer is electrically connected to the second electrode portions separated apart from each other. The first connection metal layer is electrically connected to the second electrodes separated apart from each other through the second current conductive layer.

In an embodiment of the invention, one of the first electrode portions is used as an etching block layer.

In an embodiment of the invention, the first electrode further includes at least one main portion and a plurality of finger portions extending from the main portion. The finger portions extend towards an edge of the light emitting diode chip, and the second electrode further includes a plurality of electrode portions separated apart from each other.

In an embodiment of the invention, the light emitting diode chip further includes an etching block layer. The etching block layer is disposed on the first-type semiconductor layer. The main portion covers the etching block layer.

In an embodiment of the invention, the light emitting diode chip further includes a current block layer and an ohmic contact layer. The current block layer and the ohmic contact layer are disposed between the second electrode and the second-type semiconductor layer, and the ohmic contact layer covers the current block layer.

In an embodiment of the invention, the epitaxy stacked layer has a platform portion and a cave portion. The platform portion includes a portion of the first-type semiconductor layer, the light-emitting layer and the second-type semiconductor layer. The cave portion includes another portion of the first-type semiconductor layer. The second electrode is disposed on the platform portion, and the first electrode is disposed on the cave portion.

In an embodiment of the invention, one of the first electrode portions is used as an etching block layer, and the first-type semiconductor layer and the etching block layer has a via hole. The first electrode pad is disposed in the via hole.

In an embodiment of the invention, the light emitting diode chip further includes an etching block layer. The etching block layer is disposed on the first-type semiconductor layer. The main portion covers the etching block layer, and the first-type semiconductor layer and the etching block layer have a via hole. The first electrode pad is disposed in the via hole.

In an embodiment of the invention, the light emitting diode chip further includes a second connection metal layer. The second connection metal layer is disposed on the first surface of the carrier substrate. The light emitting diode chip is bonded and electrically connected to the second connection metal layer on the carrier substrate through the first connection metal layer.

In an embodiment of the invention, the carrier substrate is a conductive substrate.

In an embodiment of the invention, the light emitting diode chip further includes a second electrode pad. The second electrode pad is disposed on the second surface of the carrier substrate.

Based on the above, in the light emitting diode chip, the light emitting diode device and the light emitting diode module according to the embodiments of the invention, because the light-emitting layer is misaligned with the first electrode, most of the light beam will not be shielded by the first electrode but output when the light-emitting layer emits light. Further, because the first reflective layer is misaligned with the second electrode, most of the light beam will be output due to reflection of the first reflective layer when the light-emitting layer emits light. A small portion of the light beam will be output due to reflection of the second electrode. Therefore, the light emitting diode chip, the light emitting diode device and the light emitting diode module can have good luminous efficiency. Moreover, when the light emitting diode module is to be assembled, because the first electrode pad of the light emitting diode module has the same electrical property as the surrounding first-type semiconductor layer (the uppermost layer of the epitaxy stacked layer), when a wire of the first electrode pad is deviated and thus connected to an uppermost semiconductor layer of the epitaxy stacked layer in the wire bonding process, the possibility of short circuit and current leakage caused by different electrical properties can be significantly reduced.

As a result, not only can a window be increased, stability of the light emitting diode module during assembly can also be increased.

To make the aforementioned more comprehensible, several embodiments accompanied with drawings are described in detail as follows.

DETAILED DESCRIPTION

Figure 1A:
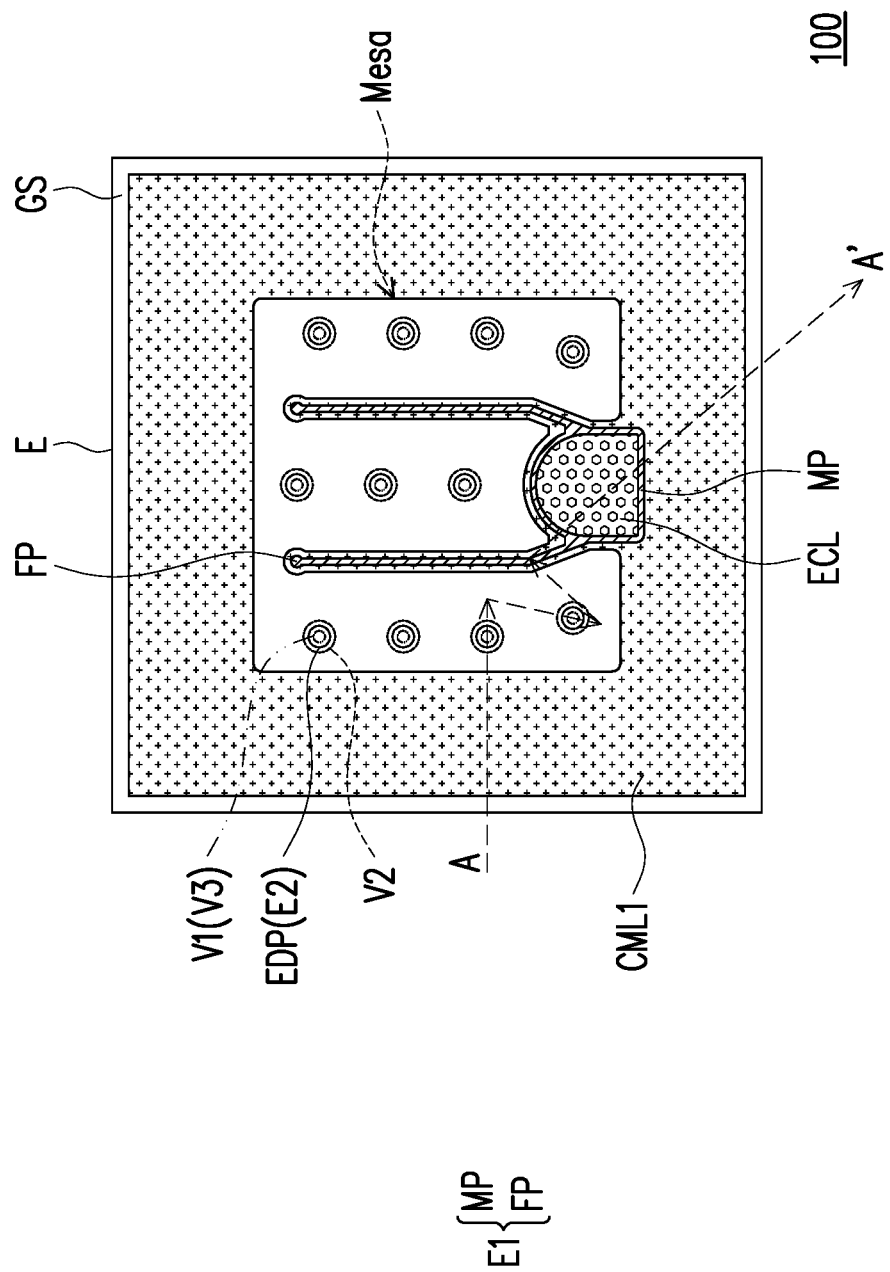
FIG. 1A is a top view of a light emitting diode chip in a first embodiment of the invention.
Figure 1B:
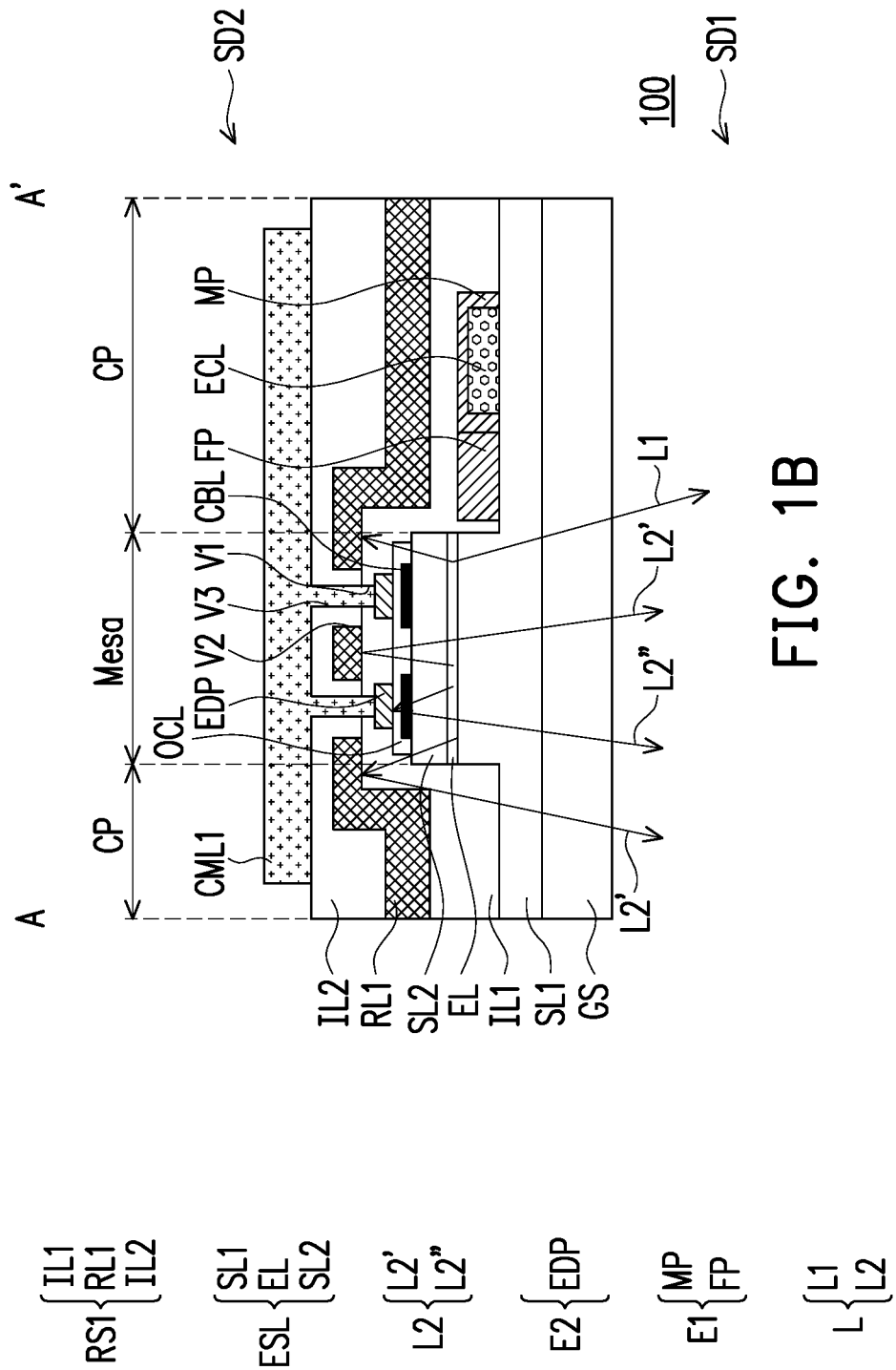
FIG. 1B is a cross-sectional view of the light emitting diode chip of FIG. 1A.
Figure 1C:
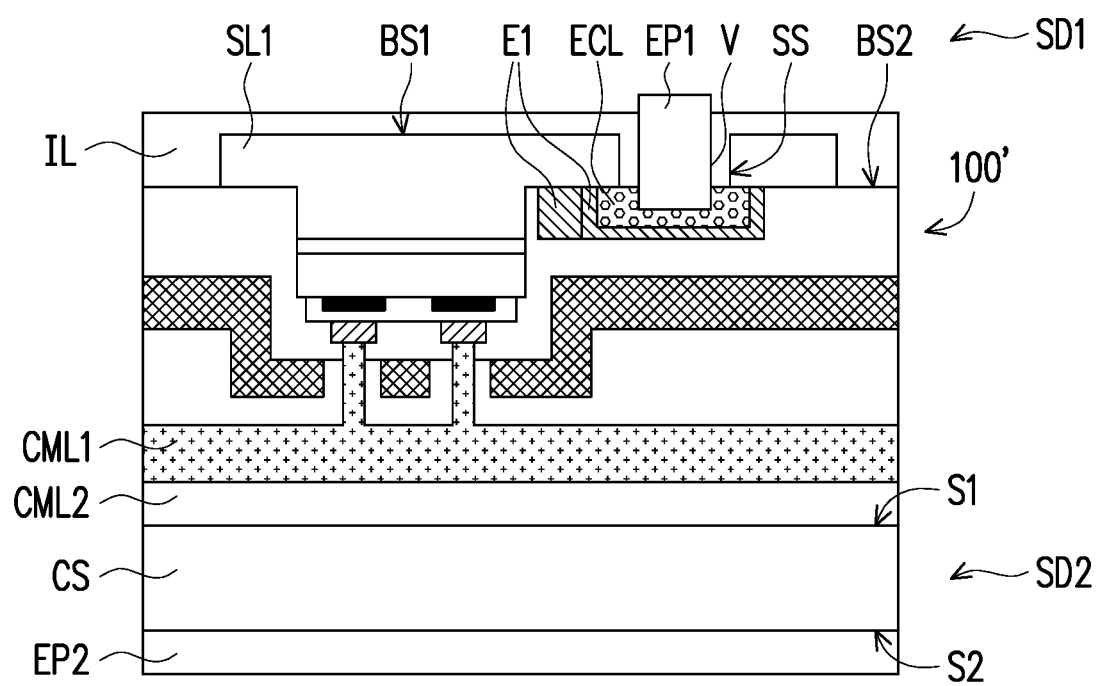
FIG. 1C is a cross-sectional view of a light emitting diode device using the light emitting diode chip of FIG. 1A.
Figure 1D:
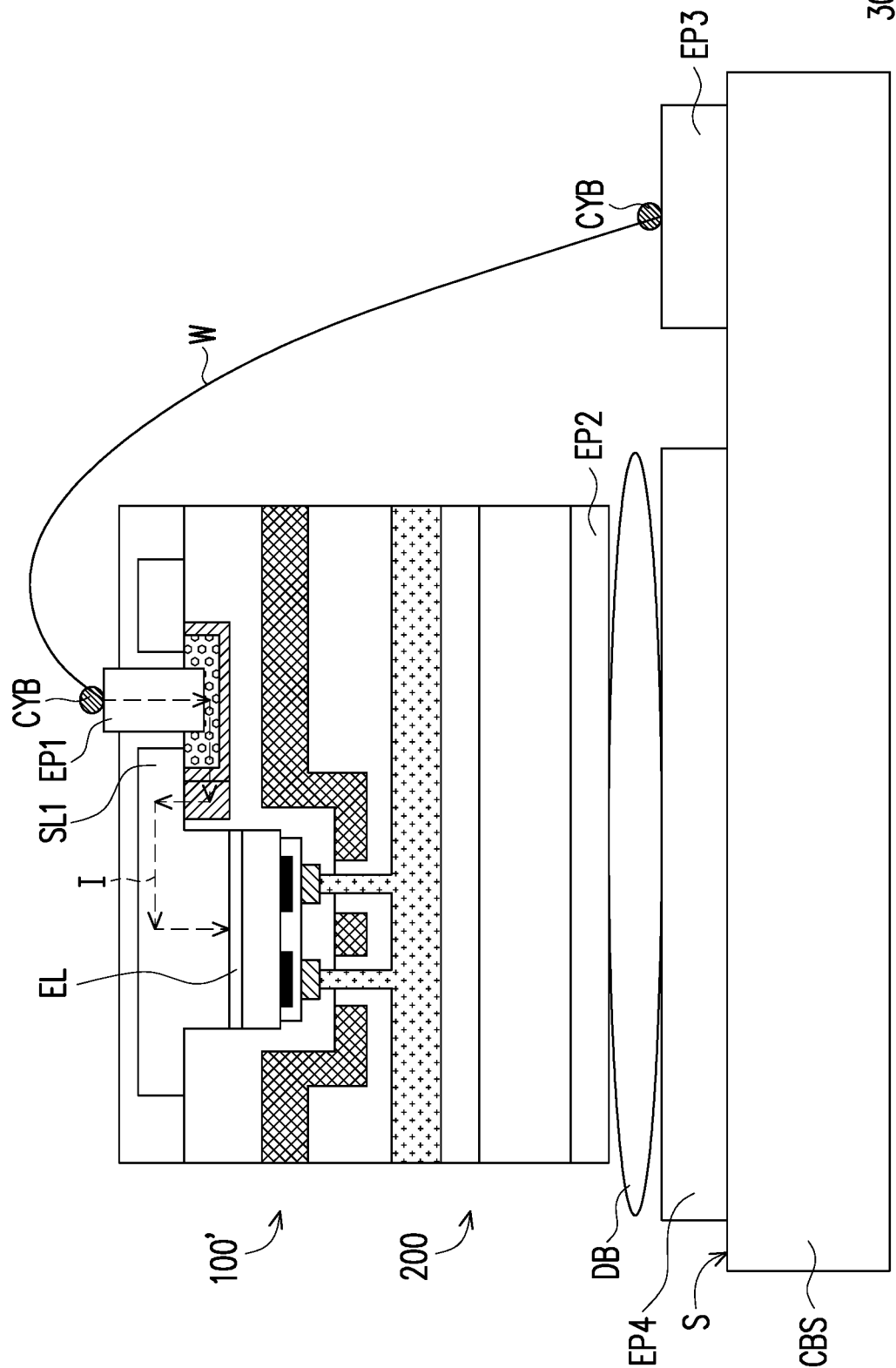
FIG. 1D is a cross-sectional view of a light emitting diode module using the light emitting diode chip of FIG. 1A.
Figure 1E:
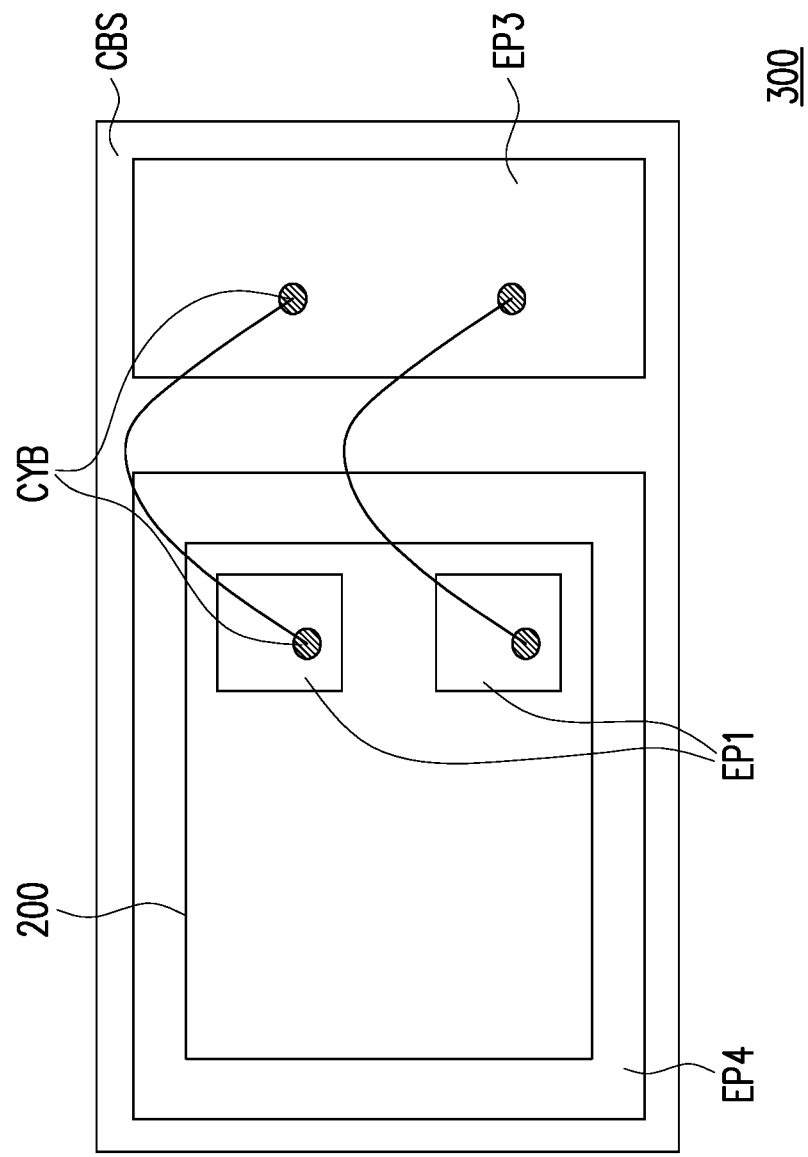
FIG. 1E is a top view of the light emitting diode module of FIG. 1D.

FIG. 1A is a top view of a light emitting diode chip in a first embodiment of the invention. FIG. 1B is a cross-sectional view of the light emitting diode chip of FIG. 1A. FIG. 1C is a cross-sectional view of a light emitting diode device using the light emitting diode chip of FIG. 1A. FIG. 1D is a cross-sectional view of a light emitting diode module using the light emitting diode chip of FIG. 1A. FIG. 1E is a top view of the light emitting diode module of FIG. 1D.

Referring to FIG. 1A and FIG. 1B, in this embodiment, a light emitting diode chip 100 includes a growth substrate GS, an epitaxy stacked layer ESL, first and second electrodes E1 and E2, an etching block layer ECL, an ohmic contact layer OCL, a current block layer CBL, and a first reflective stacked layer RS1 and a first connection metal layer CML1. Disposition relationship between the above elements will be described in detail in the following paragraphs.

The growth substrate GS is a substrate for growing the epitaxy stacked layer ESL, such as a sapphire substrate, a gallium nitride (GaN) substrate, a silicon carbide (SiC) substrate, a silicon substrate, a gallium arsenide (GaAs) substrate or other substrates suitable for growing the epitaxy stacked layer ESL. The invention is not limited in this regard. In this embodiment, the growth substrate GS is a patterned substrate with a surface on which a periodic pattern (the pattern is not shown) is provided (e.g., a patterned sapphire substrate). In certain embodiments, the surface of the growth substrate GS used to prepare growing of the epitaxy stacked layer ESL is provided with, for example, an unintentionally doped semiconductor layer, which is used as a nucleation layer or a buffer layer made of, for example, gallium arsenide (GaAs), gallium phosphide (GaP), aluminum indium gallium phosphide (AlInGaP), gallium nitride (GaN) or aluminum nitride (AlN), but not limited thereto. In other embodiments, the growth substrate GS may not be provided with the unintentionally doped semiconductor layer, but not limited thereto.

The epitaxy stacked layer ESL includes a first-type semiconductor layer SL1, a light-emitting layer EL (a.k.a. an active layer) and a second-type semiconductor layer SL2. The light-emitting layer EL is located between the first-type semiconductor layer SL1 and the second-type semiconductor layer SL2. The first-type semiconductor layer SL1 is in contact with the growth substrate GW. In detail, the epitaxy stacked layer ESL includes a platform portion Mesa and a cave portion CP. The platform portion Mesa includes a portion of the first-type semiconductor layer SL1, the light-emitting layer EL and the second-type semiconductor layer SL2. The cave portion CP includes another portion of the first-type semiconductor layer SL1.

The first-type and second-type semiconductor layers SL1 and SL2 have electrical properties opposite to each other. In detail, the first-type and second-type semiconductor layers SL1 and SL2 are, for example, intrinsic semiconductors doped with N-type and P-type dopants, respectively, and are respectively used as N-type and P-type doped semiconductor layers. A material of the intrinsic semiconductor used by the first-type and second-type semiconductor layers SL1 and SL2 and the light-emitting layer EL may be gallium nitride (GaN), indium gallium nitride (InGaN), gallium phosphide (GaP), aluminum indium gallium phosphide (AlInGaP) or aluminum gallium nitride (AlGaN), but not limited thereto. A structure of the light-emitting layer EL is, for example, a multiple quantum well (MQW) layer formed by alternately stacking a plurality of well layers and a plurality of barrier layers or single quantum well (SQW) layer, but not limited thereto.

A material of the first and second electrodes E1 and E2 is, for example, a metal material with selected species including, for example, chromium (Cr), aluminum (Al), titanium (Ti), nickel (Ni), platinum (Pt), gold (Au) or a combination thereof, but not limited thereto. The first electrode E1 is disposed on the first-type semiconductor layer SL1 of the cave portion CP and in contact with the first-type semiconductor layer SL1 to be electrically connected thereto. The second electrode E2 is disposed on the second-type semiconductor layer SL2 of the platform portion Mesa, and electrically connected to the second-type semiconductor layer SL2 through the ohmic contact layer OCL. The light-emitting layer EL's orthogonal projection on the first-type semiconductor layer SL1 is misaligned with the first electrode E1's orthogonal projection on the first-type semiconductor layer SL1. In other words, the light-emitting layer EL and the first electrode E1 do not overlap each other.

Referring to FIG. 1A, the first electrode E1 includes a main portion MP and a plurality of finger portions FP extending therefrom. The numbers of the main portion MP and the finger portions FP are one and two, respectively. In other embodiments not shown, the body portion may be two or more, and each of which has a plurality of finger portions extending therefrom. Those skilled in the art can set the numbers according to the requirements, and the invention is not limited thereto. These finger portions FP extend towards an edge E of the light emitting diode chip 100, and an interval is provided between the finger portions FP and the edge E of the light emitting diode chip 100. On the other hand, the second electrode E2 includes a plurality of electrode portions EDP separated apart from each other, and the interval is provided between any two of the electrode portions EDP. A part of these electrode portions EDP is located on two sides of these finger portions FP, and a part of these electrode portions EDP is located between the two finger portions FP.

A material of the etching block layer ECL may be Cr, AL, Ti, Ni, Pt, Au, W, CuW or a combination thereof or indium tin oxide. The function of the etching block layer ECL will be described later. Referring to FIG. 1B, in this embodiment, the etching block layer ECL is disposed on the first-type semiconductor layer SL1 of the cave portion CP and in contact with the first-type semiconductor layer SL1. The main portion MP of the first electrode E1 covers the etching block layer ECL.

The current block layer CBL is, for example, a material layer having a high resistance value that can make the current less likely to pass through its position. In this embodiment, the material of the current block layer CBL may be, for example, a dielectric material, such as silicon oxide (SiOx), silicon nitride (SiNx) or Distributed Bragg Reflector (DBR), but not limited thereto. The current block layer CBL is, for example, a patterned current block layer. At least one current block layer CBL is disposed on the second-type semiconductor layer SL2 of the platform portion Mesa and in contact with the second-type semiconductor layer SL2.

The ohmic contact layer OCL is, for example, a material layer that can form an ohmic contact with an interface of the second-type semiconductor layer SL2, and made of, for example, ITO, Ni/Au, Au/Be, Au/Ge or other suitable metals or alloys. The invention is not limited in this regard. The ohmic contact layer OCL is disposed on the second-type semiconductor layer SL2 and the current block layer CBL of the platform portion Mesa and in contact with the second-type semiconductor layer SL2 and the current block layer CBL. Further, because the ohmic contact layer OCL covers the current block layer CBL, current flowing towards the ohmic contact layer OCL will bypass a region where the current block layer CBL is located so that current can be transferred in the ohmic contact layer OCL more evenly. Therefore, the ohmic contact layer OCL may also be regarded to as a current spreading layer.

The first reflective stacked layer RS1 includes a first insulation layer IL1, a first reflective layer RL1 and a second insulation layer IL2. The first insulation layer IL1 is disposed on the epitaxy stacked layer ESL, the first and second electrodes E1 and E2, the ohmic contact layer OCL and the current block layer CBL and covers the above elements. The first reflective layer RL1 is located between the first and second insulation layers IL1 and IL2. The first insulation layer IL1 has a plurality of first via holes V1. The first reflective layer RL1 has a plurality of second via holes V2. The second insulation layer IL2 has a plurality of third via holes V3. A size of the second via hole V2 is greater than a size of the first via hole V1 or the third via hole V3, and the sizes of the first via hole V1 and the third via hole V3 are substantially equal. The first, second and third via holes V1 to V3 collectively expose the second electrode E2. More specifically, one first via hole V1 and one third via hole V3 are located in a range of one second via hole V2. In addition, the first reflective layer RL1's orthogonal projection on the second-type semiconductor layer SL2 is misaligned with the second electrode E2's orthogonal projection on the second-type semiconductor layer SL2. That is to say, the first reflective layer RL1 is overlapped with the second electrode E2. From another perspective, the second via holes V2's orthogonal projections included by the first reflective layer RL1 on the second-type semiconductor layer SL2 are overlapped with the second electrode E2's orthogonal projection on the second-type semiconductor layer SL2.

It should be noted that, the first to third via holes are not necessarily in the size relationship described above. In other embodiments, the size of the second via hole may be equal to the size of the first via hole (the third via hole), and those skilled in the art can design the size the via hole according to their own design requirements. The invention is not limited in this regard.

A material of the first and second insulation layers IL1 and IL2 may be silicon dioxide, polyimide (PI), organic polymer material, organic adhesive or other suitable insulation materials, but not limited thereto.

The first reflective layer RL1 is a material layer with reflective function, which may be Distributed Bragg Reflector (DBR), Al, Al/Cu, Ag, Ag/Cu, Au, other suitable metals or alloys, or insulation layers with reflective function. Among them, Distributed Bragg Reflector is an optical stacked layer formed by a plurality of layers with high and low refractive indexes stacked in a periodic arrangement, but is not limited thereto. In this embodiment, the first reflective layer RL1 may be Al, Al/Cu, Ag, Ag/Cu, Au, other suitable metals or alloys, but are electrically floating. In other words, the first reflective layer RL1 is not in communication with a current path in the light emitting diode chip 100.

A material of the first connection metal layer CML1 may be Au, Au—Sn, Sn/Ag/Cu (SAC), Sn/Bi, Sn/Ag, Au/In, Bi, Ag, Ni, Ti, Al, Cu or Ag. The first connection metal layer CML1 is disposed on the second insulation layer IL2 and electrically connected to the second electrode E2 through the first, second and third via holes V1 to V3. In this embodiment, the first connection metal layer CML1 is a metal layer used to connect to an external element, and a specific function thereof will be described later.

As described above, in the light emitting diode chip 100 of the present embodiment, the light-emitting layer EL's orthogonal projection on the first-type semiconductor layer SL1 is misaligned with the first electrode E1's orthogonal projection on the first-type semiconductor layer SL1 (i.e., the light-emitting layer EL and the first electrode E1 do not overlap each other). Accordingly, when the light-emitting layer EL emits a light beam L (including light beams L1 and L2), the light beam L1 is less likely shielded by the first electrode E1 and is thus output from the light emitting diode chip 100 in a direction towards a first side SD1 of the light emitting diode chip 100. The first side SD1 is a light output side. On the other hand, the second via holes V2 of the first reflective layer RL1's orthogonal projections on the second-type semiconductor layer SL2 are overlapped with the second electrode E2's the orthogonal projection on the second-type semiconductor layer SL2 (i.e., the first reflective layer RL1 and the second electrode E2 do not overlap each other). Accordingly, when the light beam L2 is output towards another side SD2 of the light emitting diode chip 100, (most of) a light beam L2' in the light beam L2 is reflected by the first reflective layer RL1 and thus output in the direction towards the first side SD1, and a light beam L2" is further reflected by the second electrode E2 and thus output in the direction towards the first side SD1. Therefore, the light emitting diode chip 100 of the present embodiment has good luminous efficiency.

Further, because the finger portion FP extends in the direction towards the edge E of the light emitting diode, current can be transferred to the light-emitting layer EL located at a different position along an extending direction of the finger portion FP. Therefore, the light emitting diode chip 100 of the present embodiment can further improve luminous efficiency.

Referring to FIG. 1C, FIG. 1C is a cross-sectional view of a light emitting diode device 200 using the light emitting diode chip 100 of FIG. 1A and FIG. 1B. The light emitting diode device 200 includes a light emitting diode chip 100' similar to that of FIG. 1A, a carrier substrate CS, a first electrode pad EP1, a second electrode pad EP2, a second connection metal layer CML2. It should be noted that, FIG. 1C only shows the differences from FIG. 1A and the related elements mentioned in the following paragraphs. The rest of elements can refer to the same reference numbers in FIG. 1A. Disposition relationship between the above elements will be described in detail in the following paragraphs.

The light emitting diode chip 100' is similar to the light emitting diode chip 100 so that most of the description thereof is as described in the above paragraph and thus not repeated hereinafter. Their major difference is described as follows. The light emitting diode chip 100' does not have the growth substrate GS. Further, the light emitting diode chip 100' includes an insulation layer IL. The insulation layer IL covers a bottom surface BS1 and a side surface SS of the first-type semiconductor layer SL1 and a portion of a bottom surface BS2 of the second-type semiconductor layer SL2. The insulation layer IL and the etching block layer ECL collectively have a via hole V.

The carrier substrate CS is, for example, a substrate for carrying the light emitting diode chip 100', which is, for example, a silicon substrate, a CuW substrate, a Mo substrate, a gallium nitride substrate, a sapphire substrate or a silicon carbide substrate, but not limited thereto. The carrier substrate CS is disposed on one side (SD2) of the light emitting diode chip 100' and has first and second surfaces S1 and S2 opposite to each other. The first surface S1 is a surface facing the light emitting diode chip 100', and the second surface S2 is a surface facing away form the light emitting diode chip 100'.

A material of the first and second electrode pads EP1 and EP2 is, for example, Cr, Al, Ti, Ni, Pt, Cu, Au, Ti, Sn/Ag/Cu, Au/Sn or a combination thereof. The first and second electrode pads EP1 and EP2 are disposed on the first side SD1 and the second side SD2 of the light emitting diode chip 100', respectively. The first electrode pad E1 is disposed in the via hole V, in contact with the etching block layer ECL, and electrically connected to the first electrode E1 through the etching block layer ECL. The second electrode pad EP2 is disposed on the second surface S2 and electrically connected to the carrier substrate CS.

A material of the second connection metal layer CML2 is selected to be similar to the material of the first connection metal layer CML1, which is not repeated hereinafter. The second connection metal layer CML2 is disposed on the first surface S1, and in contact with the carrier substrate CS and the first connection metal layer CML1. In this embodiment, the light emitting diode chip 100' can be bonded to the second connection metal layer CML2 on the carrier substrate CS through the first connection metal layer CML1.

As described above, in the present embodiment, because the light emitting diode chip 100' similar to that in the embodiment of FIG. 1A is used, the light emitting diode device 200 can also have good luminescent efficiency.

Referring to FIG. 1D, FIG. 1D is a cross-sectional view of a light emitting diode module 300 using the light emitting diode chip 100 of FIG. 1A and FIG. 1B. The light emitting diode device 300 includes the light emitting diode device 200 of FIG. 1C, a circuit substrate CBS, and third and fourth electrode pads EP3 and EP4. It should be noted that, FIG. 1D only shows the differences from FIG. 1C and the related elements mentioned in the following paragraphs. The rest of elements can refer to the same reference numbers in FIG. 1A and FIG. 1C. Disposition relationship between the above elements will be described in detail in the following paragraphs.

Description regarding the light emitting diode device 200 is similar to the description in the foregoing paragraphs, which are not repeated hereinafter.

The circuit substrate CBS is, for example, a substrate on which a circuit layer (not shown) is provided.

A material of the third and fourth electrode pads EP3 and EP4 is selected to be similar to the material of the first electrode pad EP1, which is not repeated hereinafter. The third and fourth electrode pads EP3 and EP4 are disposed on a surface S of the circuit substrate CBS. Further, one of the third and fourth electrode pads EP3 and EP4 is greater than the other one. The third electrode pad EP3 is electrically connected to the first electrode pad EP1 through a wire W, and the fourth electrode pad EP4 is electrically connected to the second electrode pad EP2 through a die bonding material DB (e.g., a solder paste or a silver paste). In other embodiments, the fourth electrode pad EP4 can be electrically connected to the second electrode pad EP2 in direct contact with each other, and the invention is not limited thereto. Accordingly, the circuit substrate CBS can input a current I to the light emitting diode device 200 through, for example, the third electrode pad EP3. After passing through the wire W, the first electrode pad EP1, the etching block layer ECL and the first electrode E1 in sequence, the current I is transferred in horizontal direction in the first-type semiconductor layer SL1. Next, the current I is transferred substantially in vertical direction to the light-emitting layer EL so that the light-emitting layer EL emits light, and is then returned to the circuit substrate CBS from the fourth electrode pad EP4.

It should be noted that, the method of connecting the first and third electrode pads EP1 and EP3 through the wire W is, for example, a wire bonding process. A crystal ball CYB (a wire contact) is formed at junctions of the wire W to the first and third electrode pads. The crystal ball CYB is soldered to the first electrode pad EP1.

As described above, in the present embodiment, because the light emitting diode chip 100' similar to that in the embodiment of FIG. 1A is used, the light emitting diode module 300 can also have good luminescent efficiency. In addition, referring to FIG. 1E, the first electrode pad EP1 is disposed in the via hole V, and the first-type semiconductor layer SL1 having the same electrical property as the first electrode pad EP1 is provided around the via hole V. Therefore, when the light emitting diode module 300 is to be assembled, the possibility that the first electrode pad EP1 may be connected to the surrounding first-type semiconductor layer SL1 (an uppermost layer of the epitaxy stacked layer) due to deviation of the wire W in the wire bonding process can be significantly reduced. Moreover, since the surrounding semiconductor layer has the same electrical property as the first electrode pad EP1, the probability of short circuit and leakage can be significantly reduced. At the same time, process window and stability of the light emitting diode module 300 during assembly can be increased.

Figure 2A:
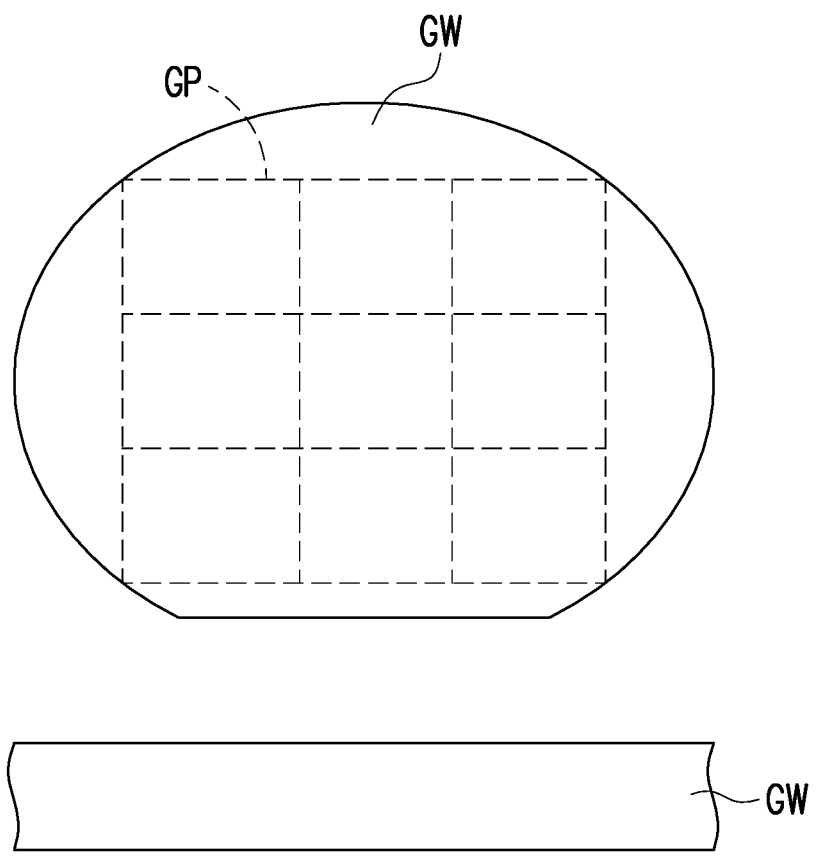
FIG. 2A to FIG. 2X are diagrams illustrating a manufacturing process of the light emitting diode chip, the light emitting diode device and the light emitting diode module of FIG. 1A, FIG. 1C, and FIG. 1D.
Figure 2D:
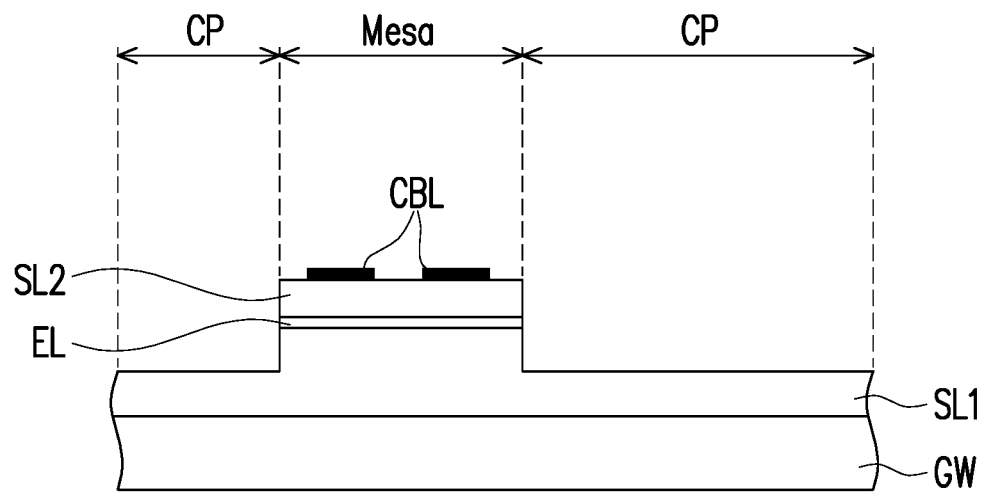
Figure 2E:
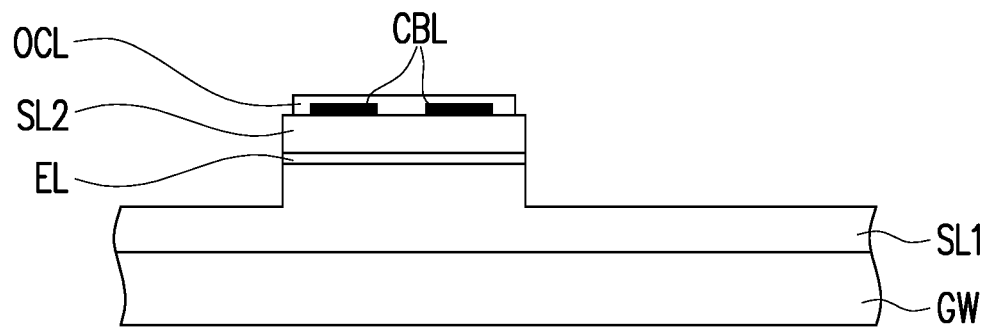
Figure 2F:
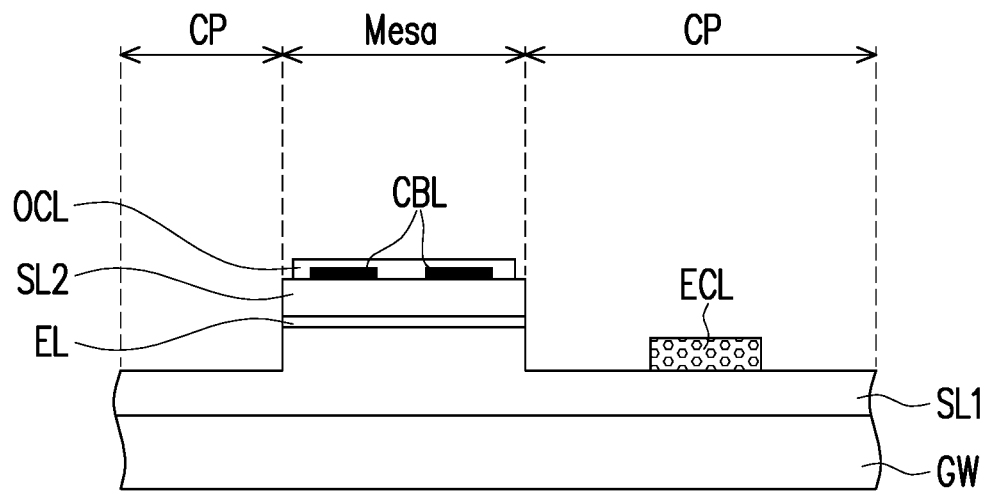
Figure 2G:
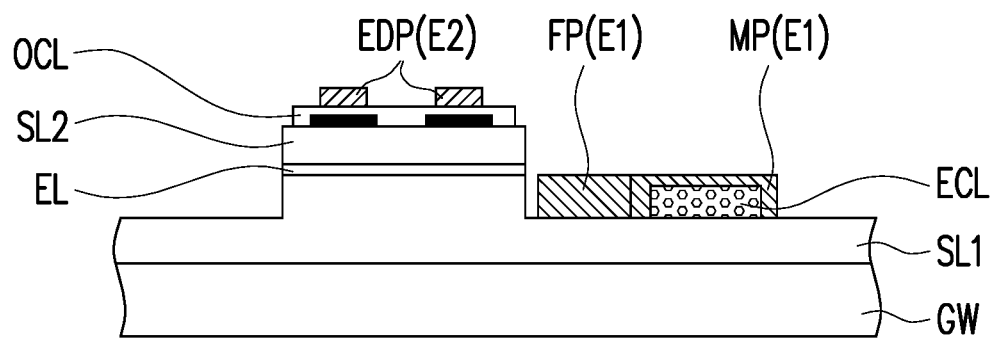
Figure 2H:
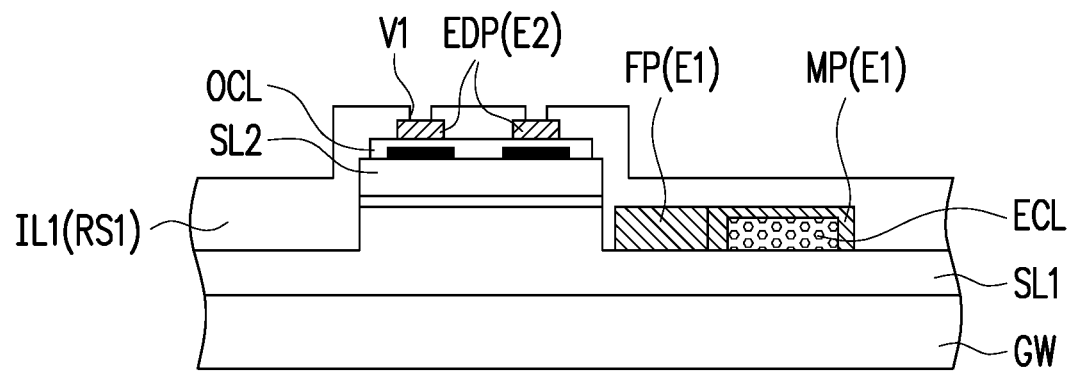
Figure 2I:
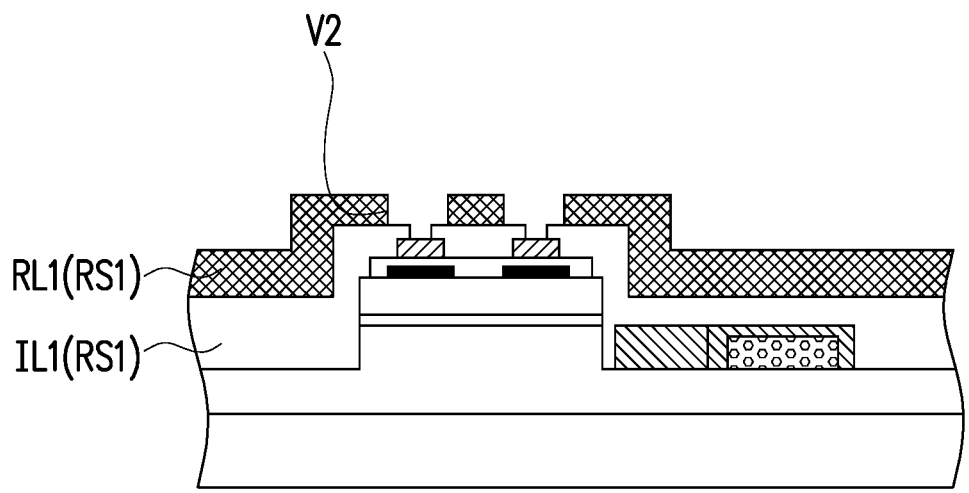
Figure 2J:
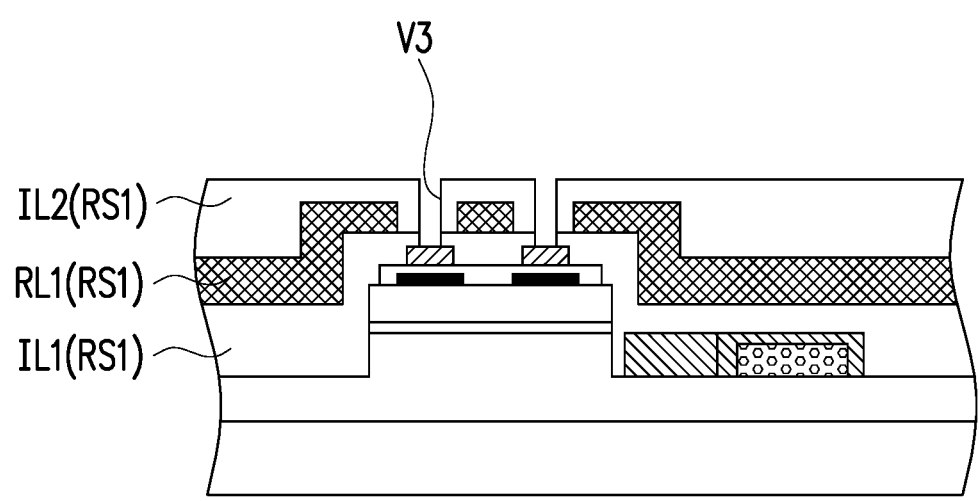
Figure 2K:
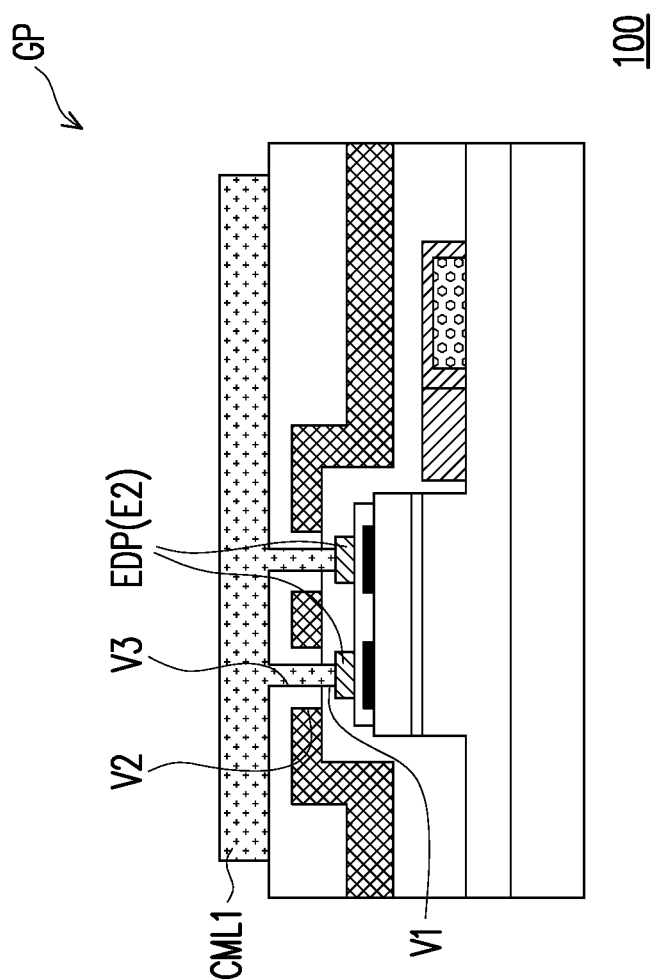
Figure 2L:
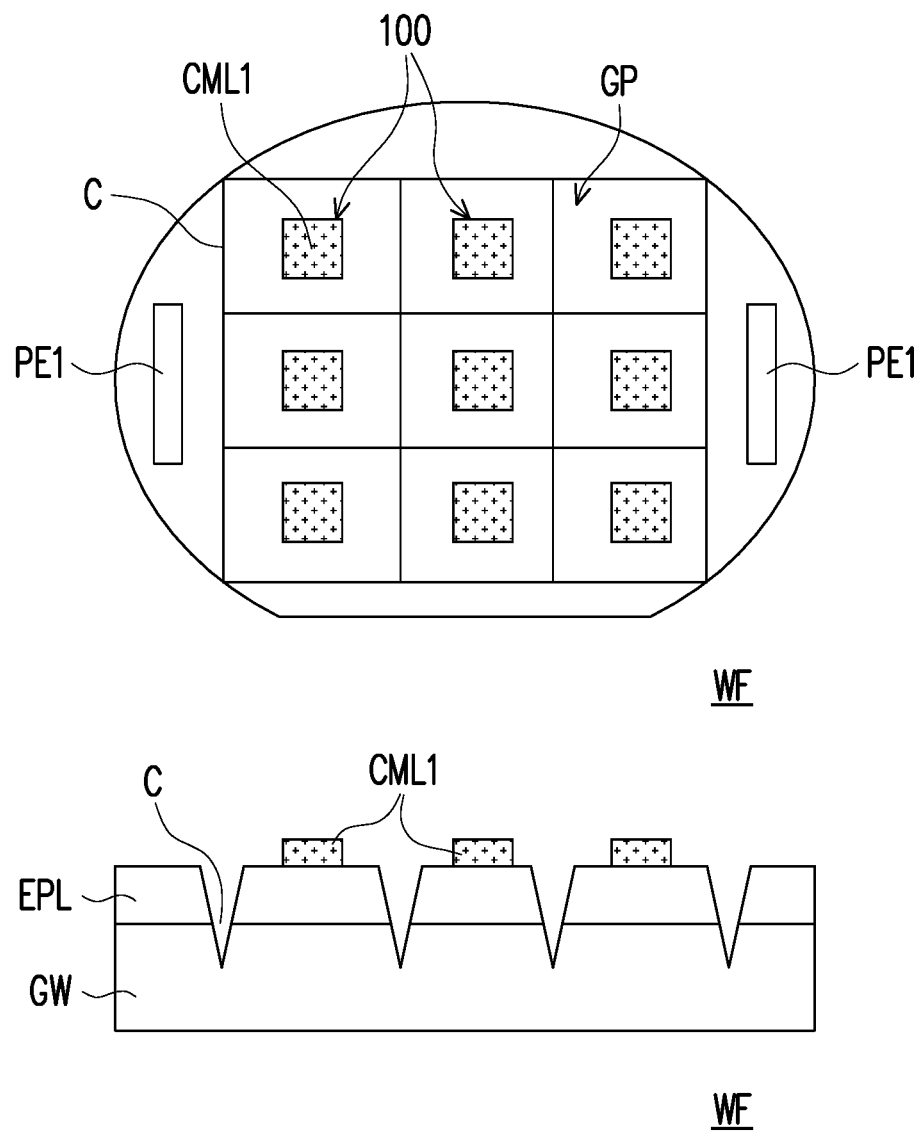
Figure 2N:
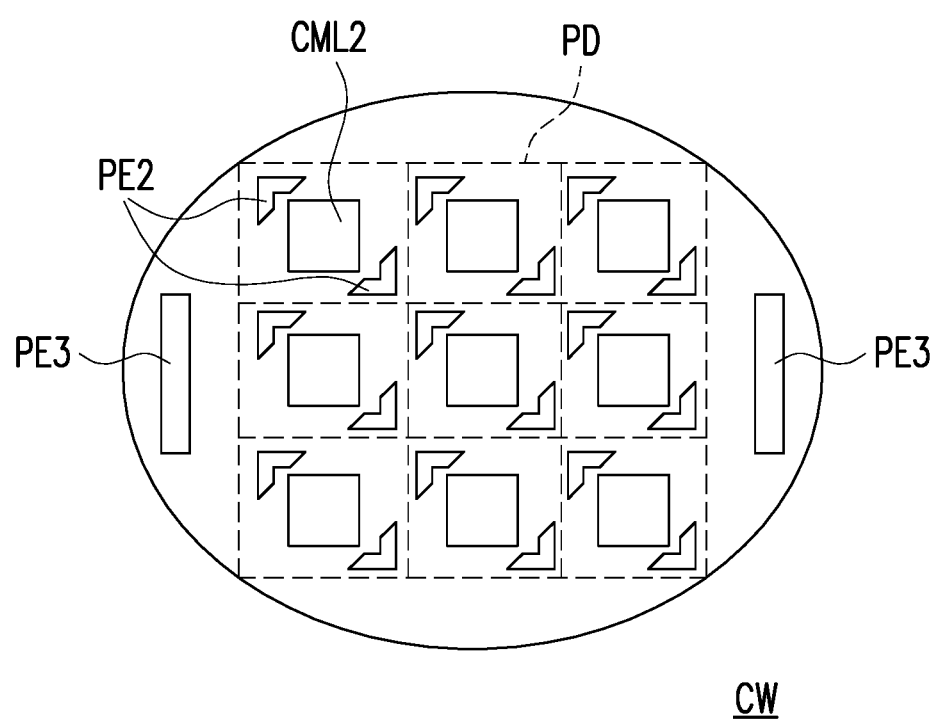
Figure 20:
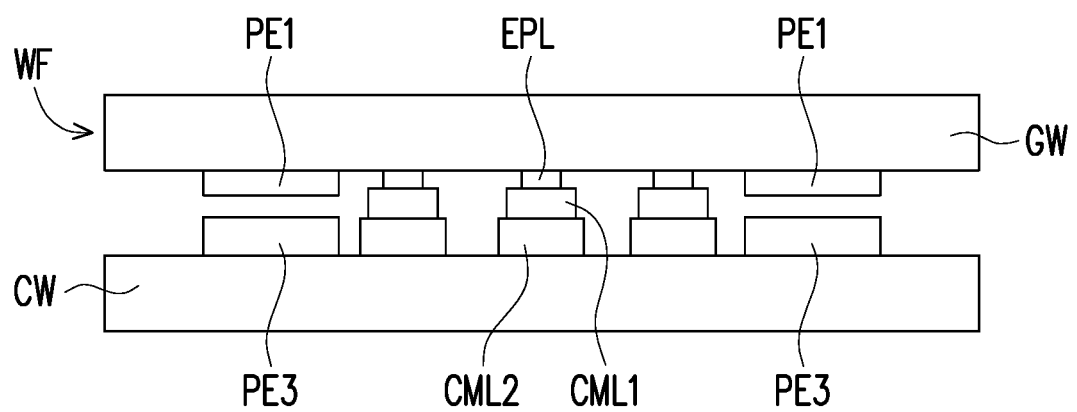
Figure 2Q:
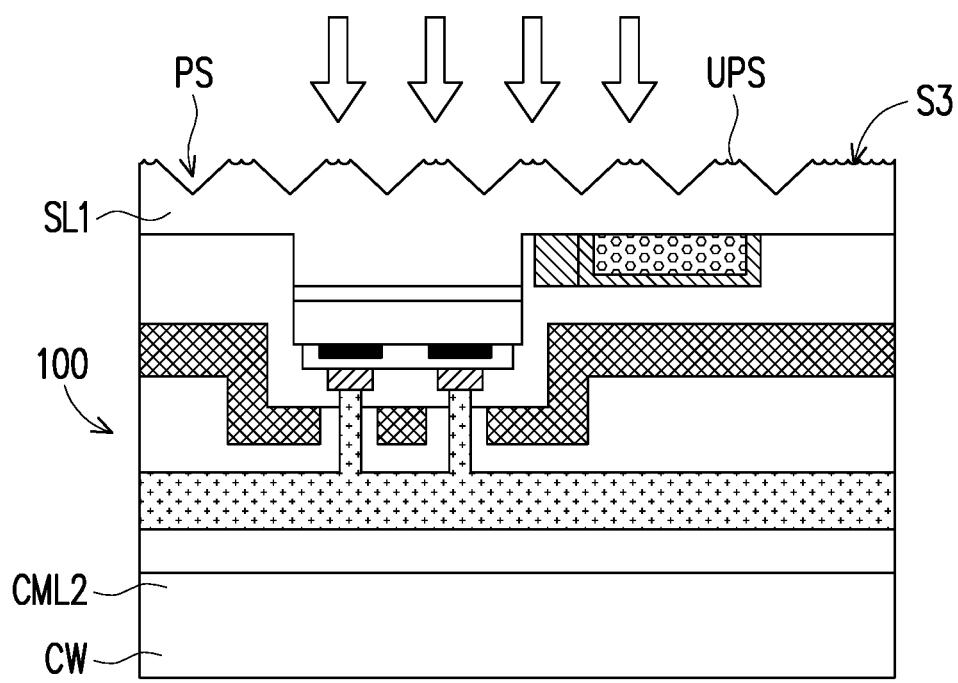
Figure 2R:
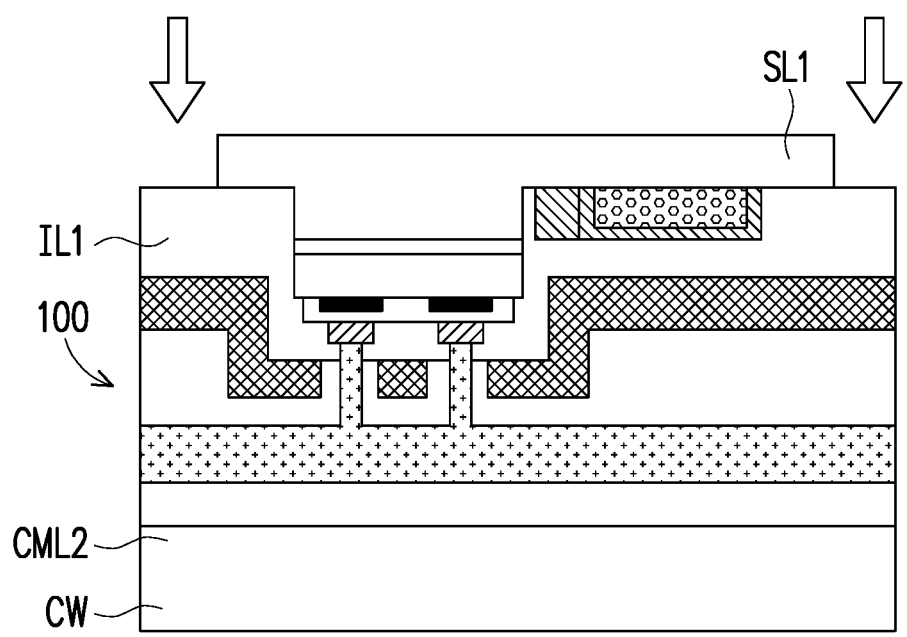
Figure 2S:
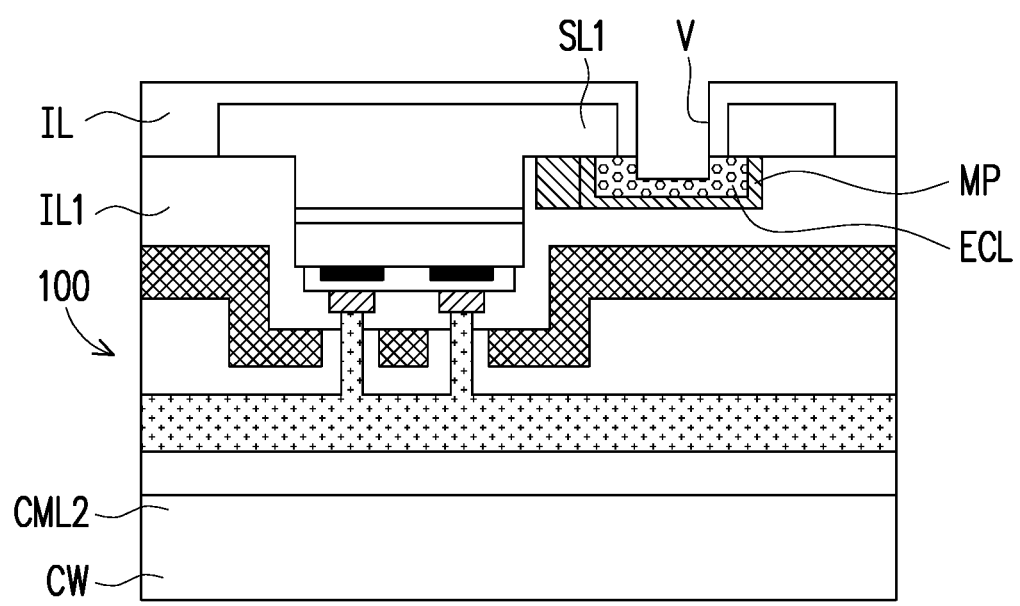
Figure 2T:
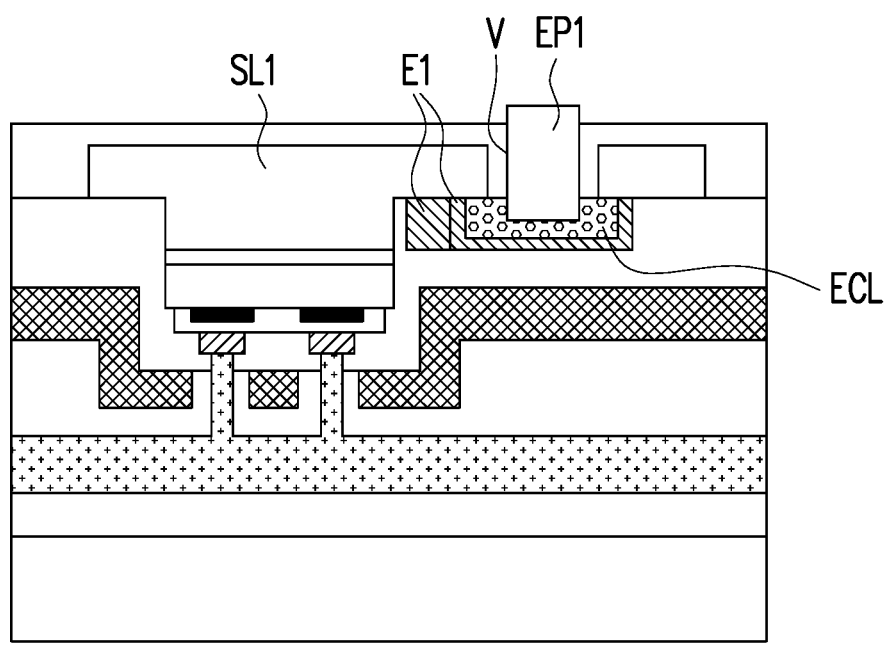
Figure 2U:
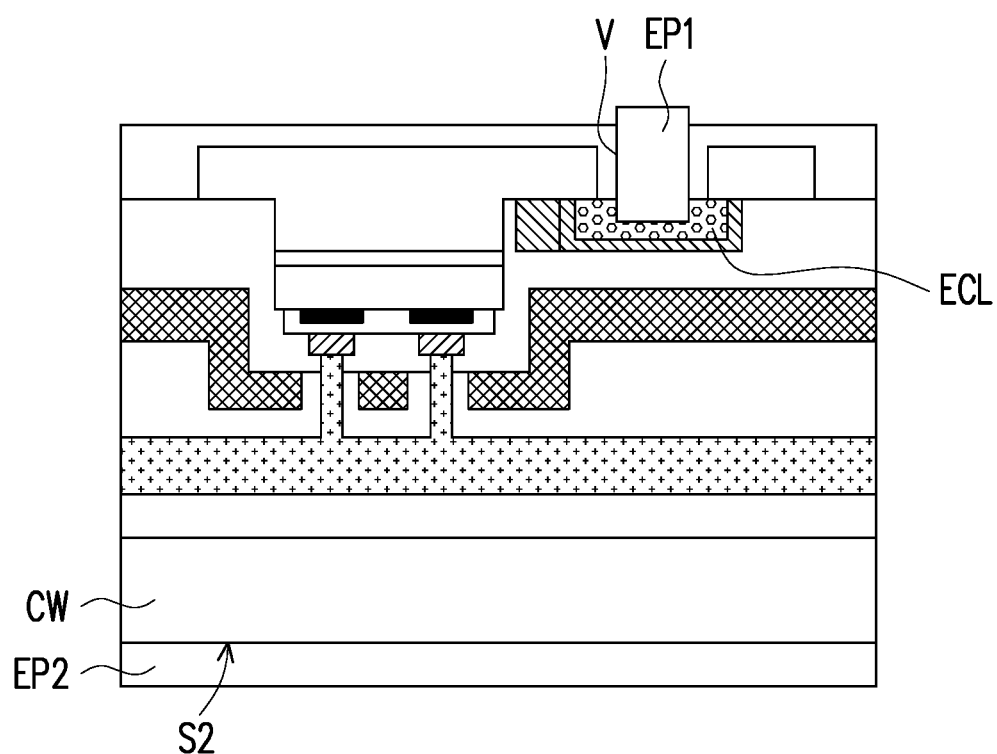
Figure 2V:
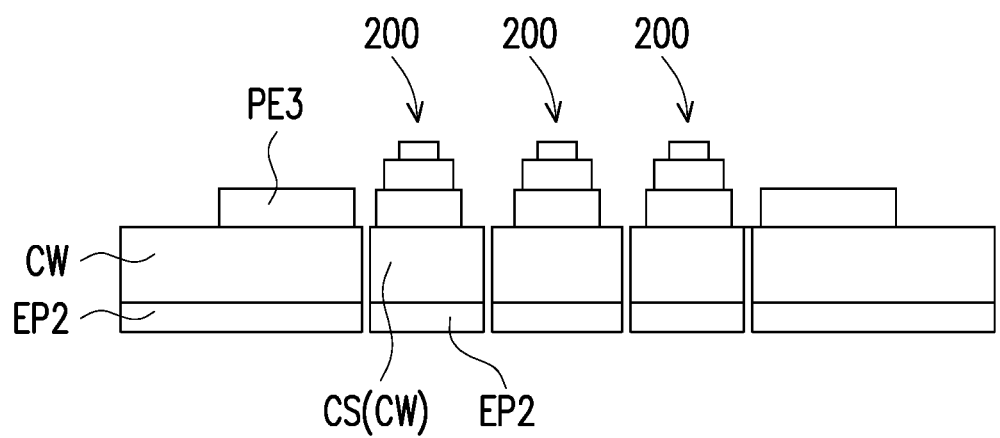
Figure 2W:
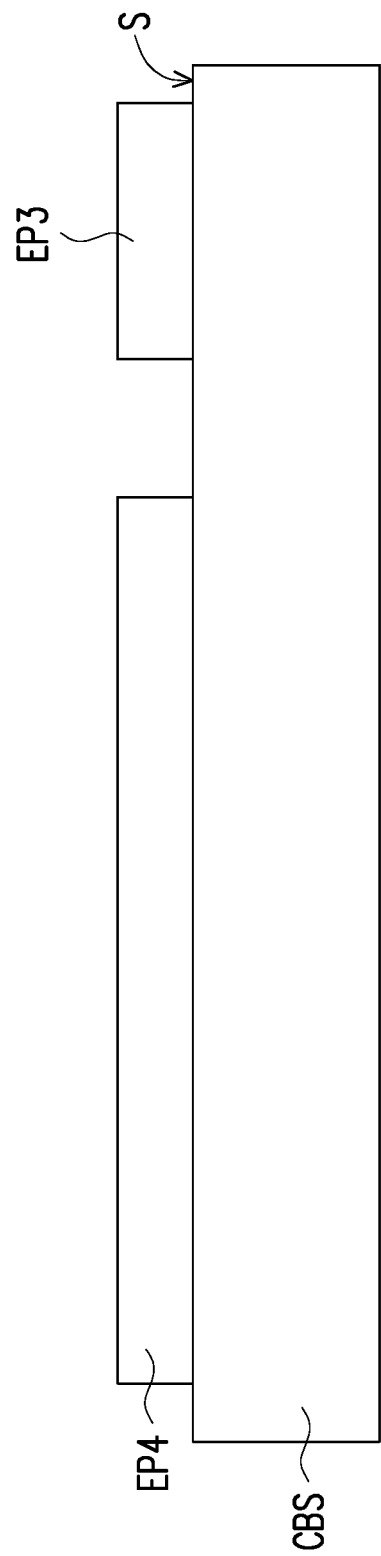

FIG. 2A to FIG. 2W are diagrams illustrating a manufacturing process of the light emitting diode chip, the light emitting diode device and the light emitting diode module of FIG. 1A, FIG. 1C, and FIG. 1D.

Referring to FIG. 2A, a growth wafer GW is provided. A material of the growth wafer GW is the same as that of the growth substrate GS, and thus not be repeated hereinafter. In this embodiment, the growth wafer GW is a patterned wafer such as a patterned sapphire wafer. The growth wafer GW is provided with a plurality of growth blocks GP, for example. In the following paragraphs or drawings, one of the growth blocks GP is taken as an example to illustrate the growth of the light emitting diode chip 100.

Referring to FIG. 2B, the epitaxy stacked layer ESL is formed on the growth wafer GW. The epitaxy stacked layer ESL includes the first-type semiconductor layer SL1, the light-emitting layer EL and the second-type semiconductor layer SSL. That is to say, in the specific growth step of FIG. 2B, the first-type semiconductor layer SL1, the light-emitting layer EL, and the second-type semiconductor layer SSL are sequentially formed on the growth wafer GW. The method of growing the epitaxy stacked layer ESL includes, for example, a metal organic chemical-vapor deposition (MOCVD), a physical vapor deposition (PVD), a chemical vapor deposition (CVD), a sputter deposition method or other suitable related epitaxial process, but not limited thereto.

Referring to FIG. 2C, the epitaxy stacked layer ESL is etched to remove a portion of the second-type semiconductor layer SL2, a portion of the light-emitting layer EL and a portion of the first-type semiconductor layer SL1 so that the platform portion Mesa and the cave portion CP are formed by the exposed portion of the first-type semiconductor layer SL1 and a portion of the growth wafer GW (the actual exposure status is not shown). The method of etching includes, for example, a dry chemical etching, a wet chemical etching, a physical etching or a combination of the three, and the invention is not limited thereto.

Referring to FIG. 2D, a patterned current block layer CBL is formed on the second-type semiconductor layer SL2 of the platform portion Mesa.

Referring to FIG. 2E, the ohmic contact layer OCL is formed on the second-type semiconductor layer SL2 and covers the patterned current block layer CBL.

Referring to FIG. 2F, the etching block layer ECL is formed on the first-type semiconductor layer SL1 of the cave portion CP.

Referring to FIG. 2G, the first electrode E1 and the second electrode E2 are formed on the first-type semiconductor layer SL1 and the second-type semiconductor layer SL2 respectively. The first electrode E1 includes at least one main portion MP and a plurality of finger portions FP, and the main portion MP includes the etching block layer ECL.

The second electrode E2 includes the electrode portions EDP separated apart from each other.

Referring to FIG. 2H, the first insulation layer IL1 of the first reflective stacked layer RS1 is formed on the epitaxy stacked layer ESL and the first and second electrodes E1 and E2, and a portion of the first insulation layer IL1 is then etched so that the first insulation layer IL1 includes the first via holes V1. The method of etching is the same as the method of etching the epitaxy stacked layer ESL, and details are not repeated hereinafter.

Referring to FIG. 2I, the first reflective layer RL1 of the first reflective stacked layer RS1 is formed on the first insulation layer ILL The first reflective layer RL1 has the second via holes V2. It is worth mentioning that, the method of forming the first reflective layer RL1 is a lift-off process. In detail, a photoresist layer (not shown) is coated on the first insulation layer IL1 first. Next, a partial region of the photoresist layer is exposed and developed to remove the partial region of the photoresist layer, define the size and number of the second via hole V2 and a region outside the photoresist layer, and expose the first insulation layer IL1. Next, a material of the first reflective layer RL1 is deposited on the exposed photoresist layer, the region outside the photoresist layer and the exposed first insulation layer IL1. Lastly, the first reflective layer RL1 having the second via holes V2 is formed.

Referring to FIG. 2J, the second insulation layer IL2 of the first reflective stacked layer RS1 is formed on the first reflective layer RL1, and a portion of the second insulation layer IL2 is etched so that the second insulation layer IL2 has the third via holes V3. The method of etching is the same as the method of etching the epitaxy stacked layer ESL, and details are not repeated hereinafter. At this point, the first reflective stacked layer RS1 has been formed.

Alternatively, the wet etching or the dry etching or a combination of the two can be used to etch the second insulation layer IL2. In addition, in other embodiments, the first and third via holes V1 and V3 may also be formed together. That is to say, the first via holes V1 may not be formed first by etching the first insulation layer IL1 first, and instead, in addition to etching the second insulation layer IL2 in the step of FIG. 2J, the first insulation layer IL1 may also be etched to form the first and third via holes V1 and V3 at once. The invention is not limited in this regard.

Referring to FIG. 2K, the first connection metal layer CML1 is formed on the first reflective stacked layer RS1, and the first connection metal layer CML1 is filled in the first, second and third via holes V1 to V3 so that the first connection metal layer CML1 is electrically connected to the second electrode E2. At this point, the growth wafer GW is formed with a light emitting diode wafer WF having a plurality of the light emitting diode chips 100 after the above steps.

Referring to FIG. 2L, two first positioning elements PE1 are first disposed on two sides of the light emitting diode chips 100 in the light emitting diode wafer WF. Next, a scribing process is performed on the light emitting diode wafer WF. That is to say, a plurality of cuts C are formed in the epitaxy stacked layer ESL and the growth wafer GW and a portion of the growth wafer GW is removed so that the blocks GP of the growth wafer GW are cut out therefrom. Each of the blocks GP of the growth wafer GW includes, for example, one of the light emitting diode chips 100.

Referring to FIG. 2M, a breaking process is formed on the light emitting diode wafer WF along the cuts C to break the light emitting diode wafer WF along the cuts C so that the light emitting diode chips 100 are separated. In this embodiment, a splitting apparatus (not shown) may be used in the breaking process. The splitting apparatus may be, for example, a chopper, but not limited thereto. The portion of the growth substrate GW included by each of the blocks GP of the growth wafer is used as the growth substrate GS of the light emitting diode chip 100. At this point, these light emitting diode chips 100 have been substantially completed. It should be noted that, the cross section of the light emitting diode chip 100 in FIG. 2M is roughly shown, and the specific cross section thereof can refer to the cross section of FIG. 1A. In addition, in other embodiments, a wafer thinning process may be performed before the breaking process to reduce a thickness of the grown substrate GS of the grown wafer GW.

Next, a manufacturing method of the light emitting diode device 200 will be described in the following paragraphs.

Referring to FIG. 2N after the step of the scribing process in FIG. 2L, a carrier wafer CW is provided. The carrier wafer CW has a plurality of preset disposition regions PD respectively corresponding to the growth blocks GP. The second connection metal layer CML2 is disposed in each of the preset disposition regions PD. Two (or at least one) second positioning elements PE2 are disposed on diagonal positions of the second connection metal layer CML2. Two third positioning elements PE3 are also disposed on two sides of the preset disposition regions PD. The two third positioning elements PE3 correspond to the two first positioning elements PE1, respectively.

Referring to FIG. 2O, an aligning and bonding process is performed on the light emitting diode wafer WF of FIG. 2L and the carrier wafer CW of FIG. 2N so that the second connection metal layers CML2 on the carrier wafer CW are correspondingly boned and electrically connected to the first connection metal layers CML1 in the growth blocks GP, respectively. The light emitting diode wafer WF and the first, second and third positioning elements PE1 to PE3 on the carrier wafer CW are used for assisting the alignment so that the second connecting metal layers CML2 can be accurately bonded to the first metal connection layers CML1. In this embodiment, the first positioning elements PE1 are not bonded to the third positioning elements PE3, for example. In other embodiment, the first positioning elements PE1 are bonded to the third positioning elements PE3, but the invention is not limited thereto.

Referring to FIG. 2P, the growth wafer GW is removed. The method of removing the growth wafer GW includes a laser lift-off process or a wet chemical etching process. Because the high temperature of laser will make metal ions in an epitaxy stacked layer EPL revert to metal during the laser lift-off process, an etching process such as the wet chemical etching process can be performed on a surface of the epitaxy stacked layer ESL after the laser lift-off process to remove the metal (e.g., gallium). At this point, the light emitting diode chips 100 on the light emitting diode wafer WF are transferred and bonded to the carrier wafer CW.

It should be noted that, FIG. 2N to FIG. 2P follow the step of FIG. 2L, namely, many-to-many transferring steps by which the light emitting diode chips 100 is transferred to the preset disposition regions PD on the carrier wafer CW at once and then the entire growth wafer GW is removed. In other embodiments not shown, following the step of FIG. 2O, a one-to-one transferring and bonding step may also be performed, to transfer the separated light emitting diode chips 100 one by one to the second connection metal layer CML2. Then, the laser lift-off process or the wet chemical etching process may be used to remove the growth substrates GS of the light emitting diode chips 100 and remove the metal (e.g., gallium), but the invention is not limited thereto.

The light emitting diode chip 100 in one preset disposition region PD will be described in the following paragraphs.

Referring to FIG. 2Q, because the epitaxy stacked layer EPL is a periodic pattern previously formed on a surface of the growth wafer GW, a periodic structure PS is actually left on a surface of the first-type semiconductor layer SL1 after the growth wafer GW is removed. In this step, a thinning process is first performed on the first-type semiconductor layer SL1 of the epitaxy stacked layer EPL. The thinning process is, for example, performing the dry etching process or the wet chemical etching process to remove a portion of the first-type semiconductor layer SL1 and the unintentionally doped semiconductor layer, so as to expose a surface S3 of the first-type semiconductor layer SL1. Then, a surface roughening process is performed on the surface S3. The surface roughening process is, for example, performing the wet chemical etching process to form a non-periodic rough structure UPS on the surface S3.

Referring to FIG. 2R, the etching process is performed on a periphery of the first-type semiconductor layer SL1 to expose a portion of the first insulation layer IL1.

In other embodiments not shown, after the step of FIG. 2Q in which the thinning process is performed to remove the portion of the first-type semiconductor layer SL1 and the unintentionally doped semiconductor layer, it is also possible that the step of FIG. 2R is first performed to expose a portion of the first insulation layer IL1 by performing the etching process on the periphery of the first-type semiconductor layer SL1. Then, the surface roughening process is performed on the surface S3. The surface roughening process is, for example, performing the wet chemical etching process to form a non-periodic rough structure UPS on the surface S3.

Referring to FIG. 2S, the insulation layer IL is formed on the first-type semiconductor layer SL1 and the first insulation layer IL1. The insulation layer IL covers a bottom surface and a side surface of the first-type semiconductor layer SL1 and a partial surface of the first insulation layer IL1. Then, the dry etching process or the wet chemical etching process is performed at positions of the main portion MP and the etching block layer ECL, so as to form the via hole V and remove the first-type semiconductor layer SL1 and a portion of the etching block layer ECL in the via hole V. The function of the etching block slayer ECL is to prevent the main portion MP of the first electrode E1 from being etched by the dry etching process. A lateral surface of the etching block layer ECL is substantially aligned with a lateral surface of the insulation layer IL. Alternatively, the insulation layer IL is disposed in the via hole V and exposes the portion of the etching block layer ECL.

Referring to FIG. 2T, the first electrode pad EP1 is formed in the via hole V so that the first electrode pad EP1 is in contact with the etching block layer ECL. The first electrode pad EP1 can be electrically connected to the first-type semiconductor layer SL1 through the etching block layer ECL and the first electrode E1.

Referring to FIG. 2U, the second electrode pad EP2 is formed on the second surface S2 of the carrier wafer CW. At this point, a plurality of light emitting diode devices 200 have been formed on the carrier wafer CW, and each of the preset disposition regions PD is provided with one of the light emitting diode devices 200.

Referring to FIG. 2V, the cutting and breaking processes are performed on the carrier wafer CW carried with the light emitting diode devices 200 so that the light emitting diode devices 200 are separated apart from each other. At this point, the light emitting diode devices 200 have been substantially completed.

Next, a manufacturing method of the light emitting diode module 300 will be described in the following paragraphs.

Following the step of FIG. 2V, with reference to FIG. 2W, a circuit board CBS is provided, and third and fourth electrode pads EP3 and EP4 are formed on a surface S of the circuit board CBS.

Referring to FIG. 2X, the third and fourth electrode pads EP3 and EP4 are electrically connected to the first and second electrode pads EP1 and EP2, respectively. The method of electrically connecting them is described as follows. First of all, a die bonding material (e.g., a solder paste, a silver paste or other suitable materials) is formed on one of the third and fourth electrode pads EP3 and EP4 (e.g., the electrode pad EP4) and a die bonding process is performed. Next, the second electrode pad EP2 of the light emitting diode device 200 is bonded to the fourth electrode pad EP4 formed with the die bonding material, and then the first electrode pad EP1 of the light emitting diode device 200 is bonded to the third electrode pad EP3 by the wire bonding process. At this point, the light emitting diode module 300 has been substantially completed.

It should be noted that the following embodiments continue to use certain content from the foregoing embodiments, and description for the same technical contents is omitted. Descriptions regarding elements of the same name can refer to the certain content from the foregoing embodiments, which are not repeated in the following embodiments.

Figure 3A:
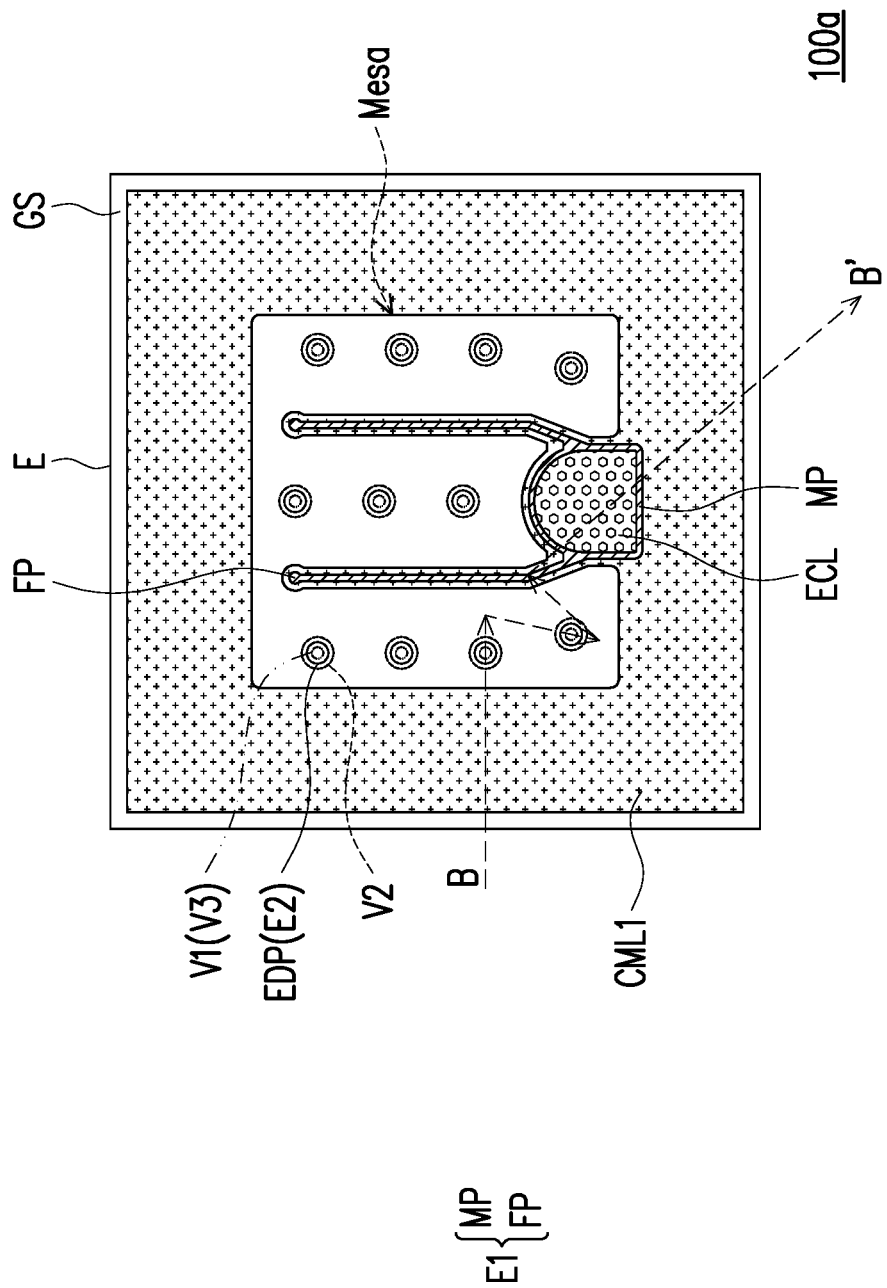
FIG. 3A is a top view of a light emitting diode chip in a second embodiment of the invention.
Figure 3B:
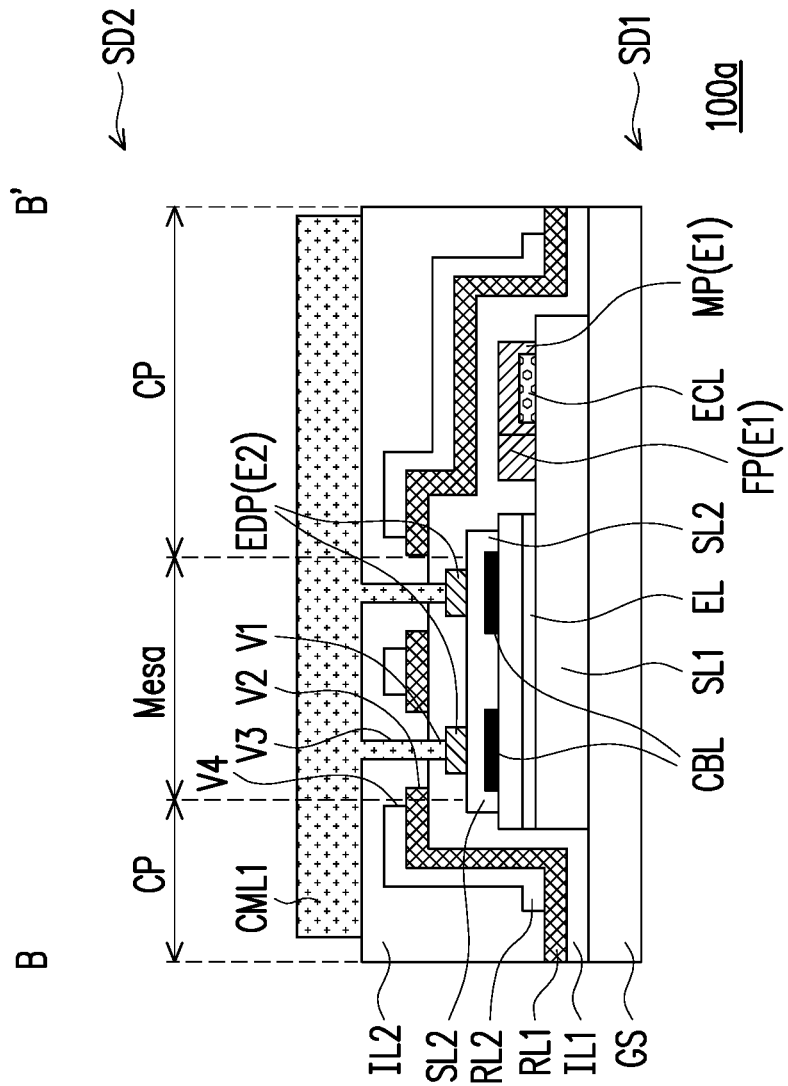
FIG. 3B is a cross-sectional view of the light emitting diode chip of FIG. 3A.
Figure 3C:
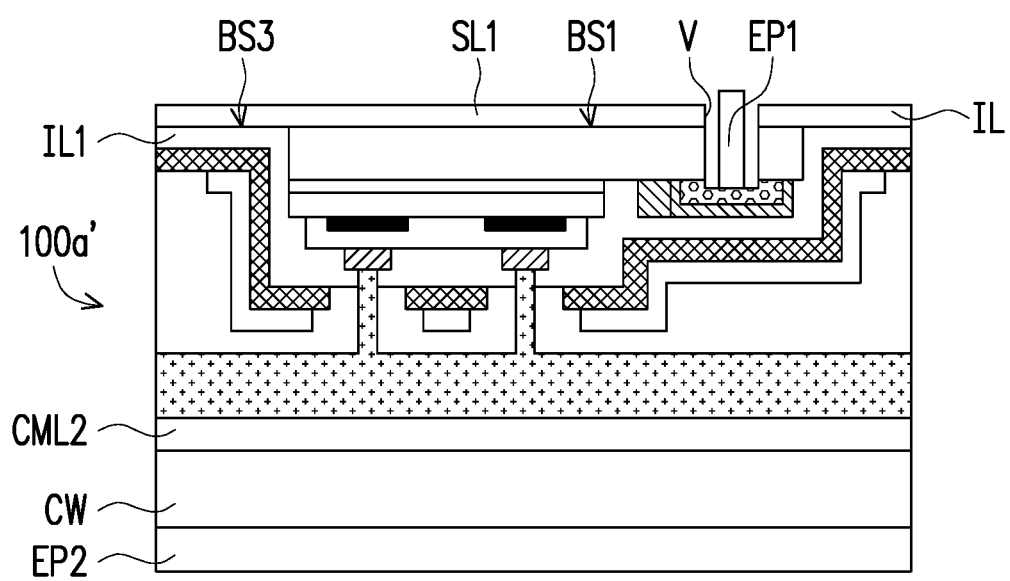
FIG. 3C is a cross-sectional view of a light emitting diode device using the light emitting diode chip of FIG. 3A.
Figure 3D:
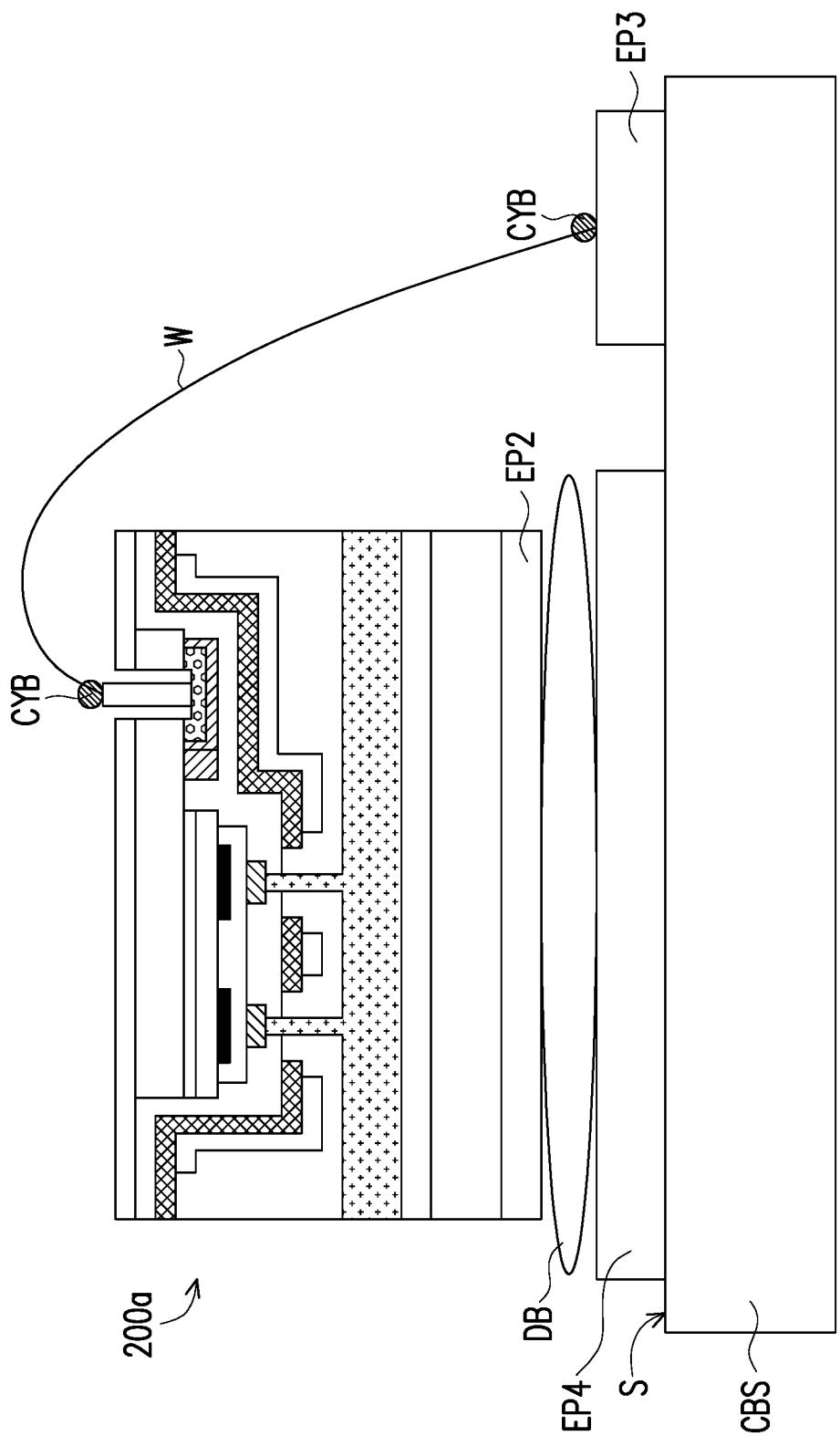
FIG. 3D is a cross-sectional view of a light emitting diode module using the light emitting diode chip of FIG. 3A.
Figure 3E:
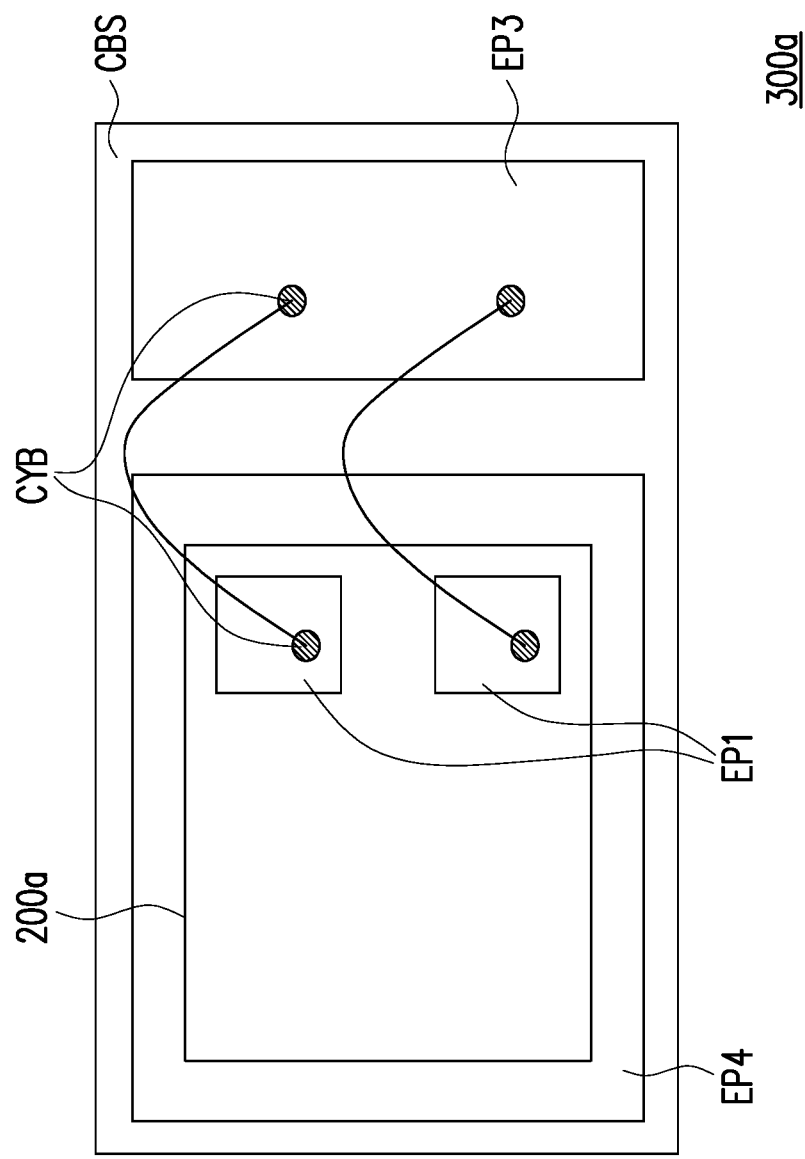
FIG. 3E is a top view of the light emitting diode module of FIG. 3D.

FIG. 3A is a top view of a light emitting diode chip in a second embodiment of the invention. FIG. 3B is a cross-sectional view of the light emitting diode chip of FIG. 3A. FIG. 3C is a cross-sectional view of a light emitting diode device using the light emitting diode chip of FIG. 3A. FIG. 3D is a cross-sectional view of a light emitting diode module using the light emitting diode chip of FIG. 3A. FIG. 3E is a top view of the light emitting diode module of FIG. 3D.

A light emitting diode chip 100a of FIG. 3A and FIG. 3B is substantially similar to the light emitting diode chip 100 of FIG. 1A. Their major difference is described as follows. In the light emitting diode chip 100a, a first reflective stacked layer RS1a further includes a second reflective layer RL2. The second reflective layer RL2 is a material layer with reflective function, which may be Distributed Bragg Reflector (DBR), Al, Al/Cu, Ag, Ag/Cu, Au, other suitable metals or alloys, or insulation layers with reflective function. Among them, Distributed Bragg Reflector is an optical stacked layer formed by a plurality of layers with high and low refractive indexes stacked in a periodic arrangement, but is not limited thereto. In this embodiment, the second reflective layer RL2 may be Al, Al/Cu, Ag, Ag/Cu, Au, other suitable metals or alloys, but are electrically floating. In other words, the second reflective layer RL2 is not in communication with a current path in the light emitting diode chip 100. The first reflective stacked layer RS1a of the present embodiment includes two reflective layers.

Specifically, the second reflective layer RL2 is disposed on the first reflective layer RL1 and located between the first and second insulation layers IL1 and IL2. The second reflective layer RL2 has a plurality of fourth via holes V4, and the fourth via holes V4's orthogonal projections on the second-type semiconductor layer SL2 are overlapped with the second electrode E2's orthogonal projection on the second-type semiconductor layer SL2. In other words, the second reflective layer RL2 and the second electrode E2 do not overlap.

Further, in this embodiment, a size of the fourth via hole V4 is greater than the size of any one of the first, second and third via holes V1 to V3. Also, one first, one second and one third via holes V1 to V3 are located in a range of one fourth via hole V4. The size relationship of the other via holes are similar to that of FIG. 1A, and thus not repeated hereinafter. Moreover, the first to fourth via holes V1 to V4 collectively expose the second electrode E2. The first connection metal layer CML1 is electrically connected to the second electrode E2 through the first to fourth via holes V1 to V4.

In other embodiments, the size of the fourth via hole may be equal to the size of the first, second or third via holes, and those skilled in the art may design the size of the via hole according to their own design requirements. The invention is not limited to above size relationship of the via holes.

As described above, compared to the light emitting diode chip 100 of FIG. 1A, although most of the light beam can be reflected by the first reflective layer RL1, a small portion of the light beam will still pass through the first reflective layer RL1. In the light emitting diode chip 100a of the present embodiment, the first reflective stacked layer RS 1a includes the second reflective layer RL2 in addition to the first reflective layer RL1. The second reflective layer RL2 can further reflect the small portion of the light beam passing through the first reflective layer RL1 which is then emitted in the direction towards the first side SD1. Therefore, the light emitting diode chip 100a has higher luminous efficiency.

Referring to FIG. 3C, a light emitting diode device 200a of FIG. 3C is substantially similar to the light emitting diode device 200 of FIG. 1C. Their major difference is described as follows. The light emitting diode device 200a uses a light emitting diode chip 100a' of FIG. 3A. The light emitting diode chip 100a' is similar to the light emitting diode chip 100a, but differs in that the light emitting diode chip 100a' includes the insulation layer IL. The insulation layer IL covers the bottom surface BS1 of the first-type semiconductor layer SL1 and a bottom surface BS3 of the first insulation layer ILL The insulation layer IL, the first-type semiconductor layer SL1 and the etching block layer ECL collectively have a via hole Va. Further, in this embodiment, the first electrode pad EP1 does not fill in the entire via hole Va, and has a gap with the first-type semiconductor layer SL1.

In other embodiments not shown, the insulation layer IL further extends into the via hole V and cover a portion of the etching block layer ECL. Also, the first electrode pad EP1 does not fill in the entire via hole Va, and has the gap with the first-type semiconductor layer SL1.

Referring to FIG. 3D, a light emitting diode module 300a of FIG. 3D is substantially similar to the light emitting diode module 300 of FIG. 1D. Their major difference is described as follows. The light emitting diode module 300a uses the light emitting diode device 200a' of FIG. 3D.

As described above, compared to the light emitting diode device 200 and the light emitting diode module 300 of FIG. 1C and FIG. 1D, the light emitting diode device 200a and the light emitting diode module 300a of FIG. 3C and FIG. 3D can have higher luminous efficiency.

Figure 4A:
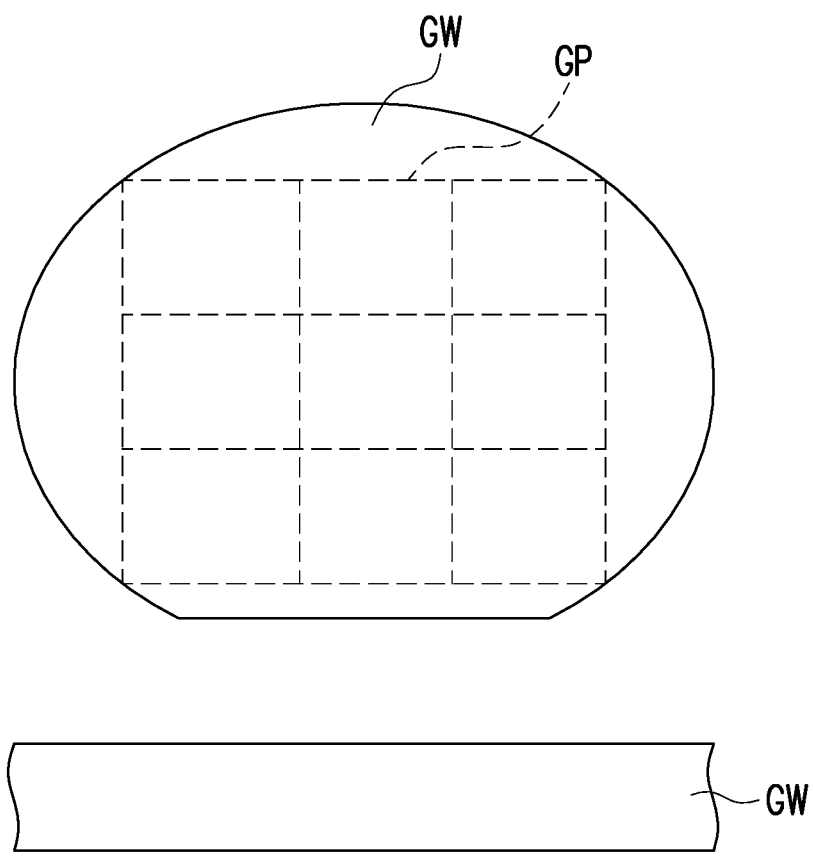
FIG. 4A to FIG. 4Y are diagrams illustrating a manufacturing process of the light emitting diode chip, the light emitting diode device and the light emitting diode module of FIG. 3A, FIG. 3C, and FIG. 3D.
Figure 4B:
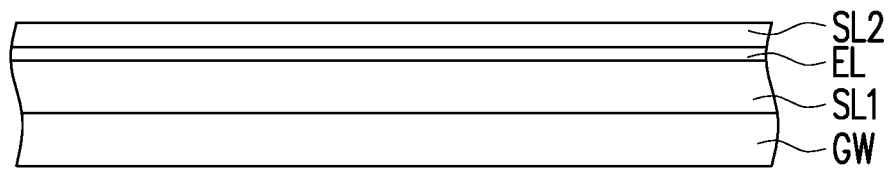
Figure 4C:
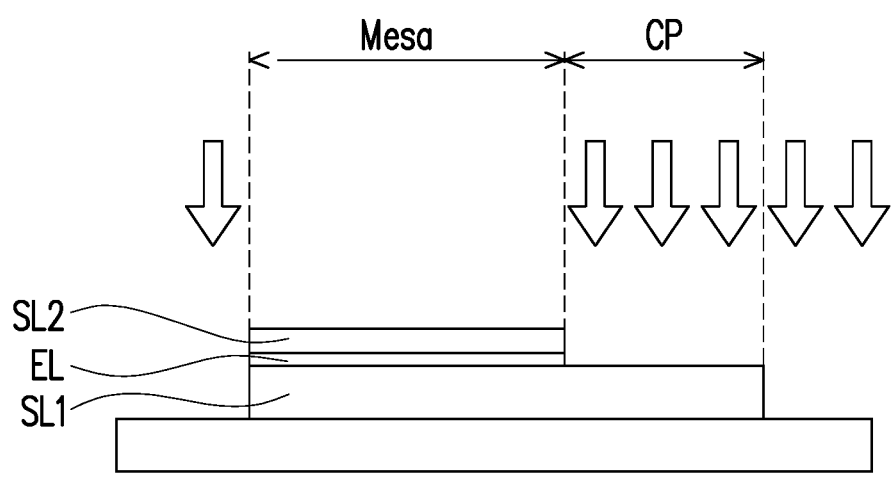
Figure 4D:
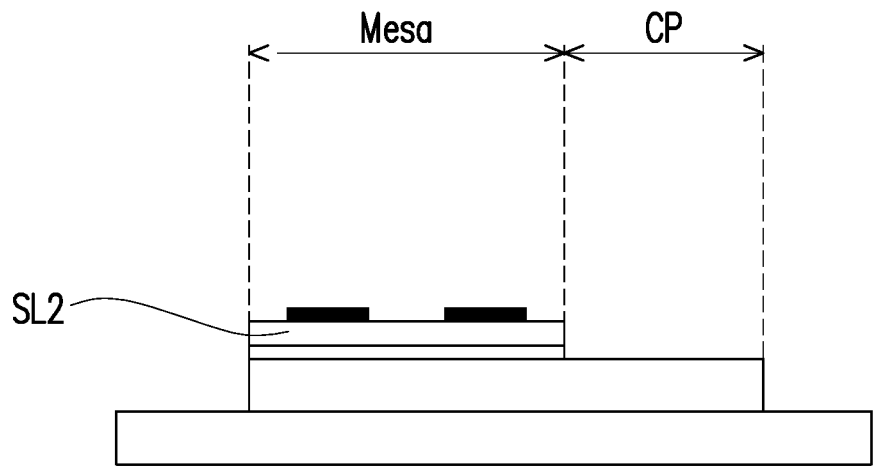
Figure 4E:
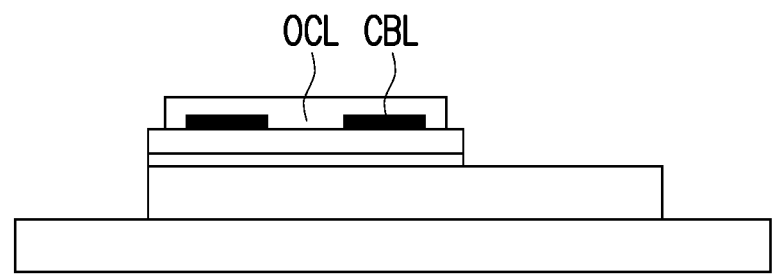
Figure 4F:
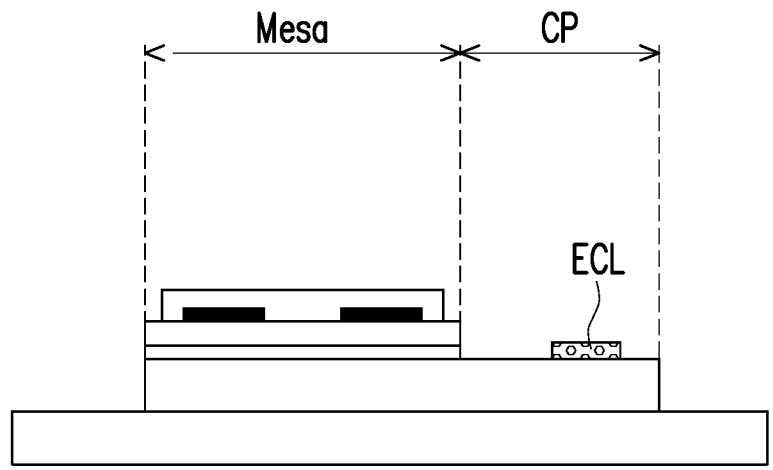
Figure 4G:
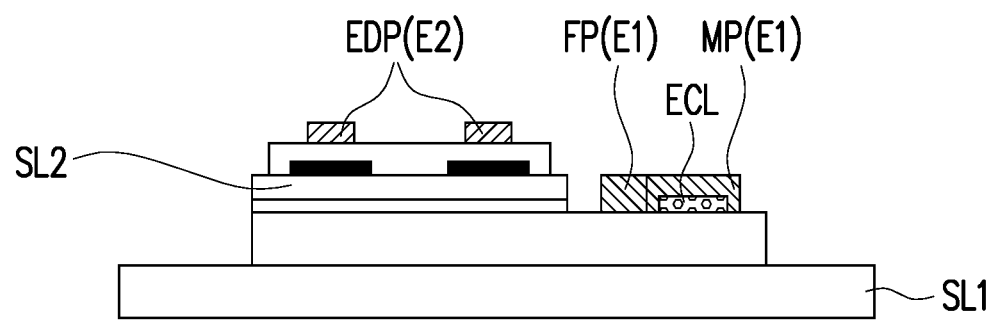
Figure 4H:
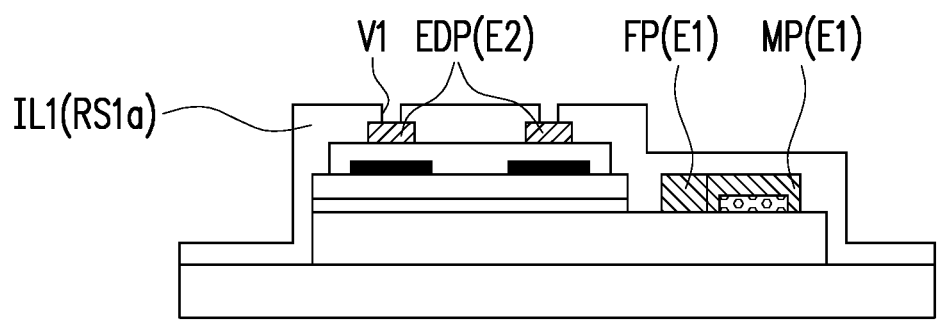
Figure 4I:
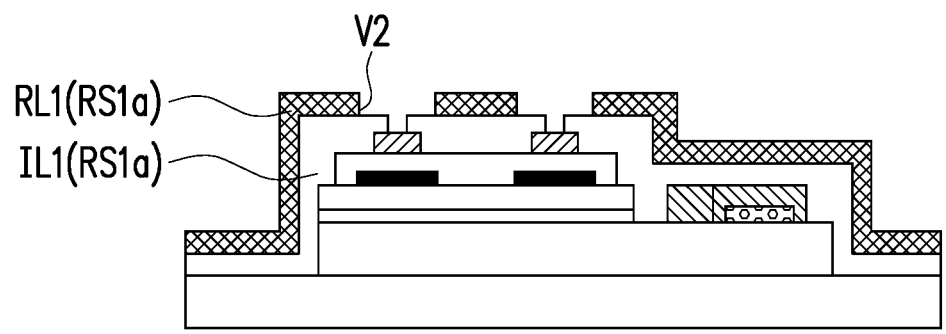
Figure 4J:
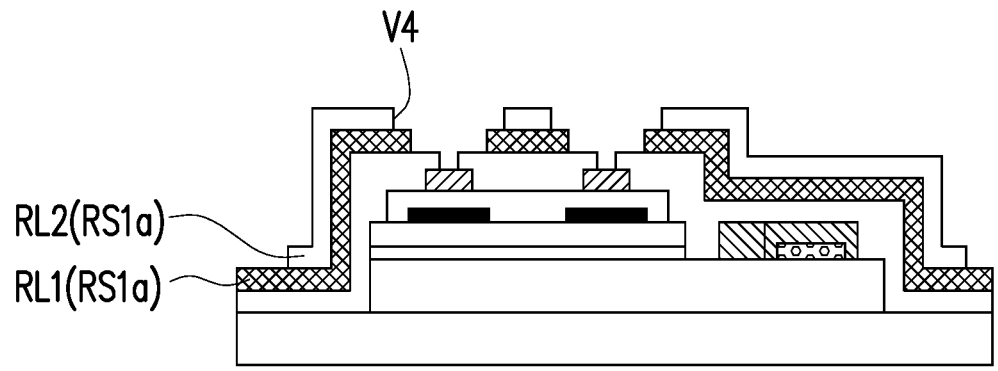
Figure 4K:
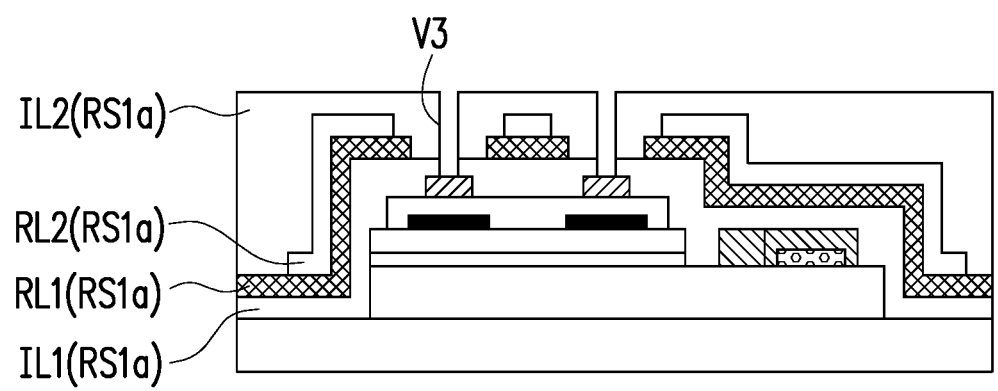
Figure 4L:
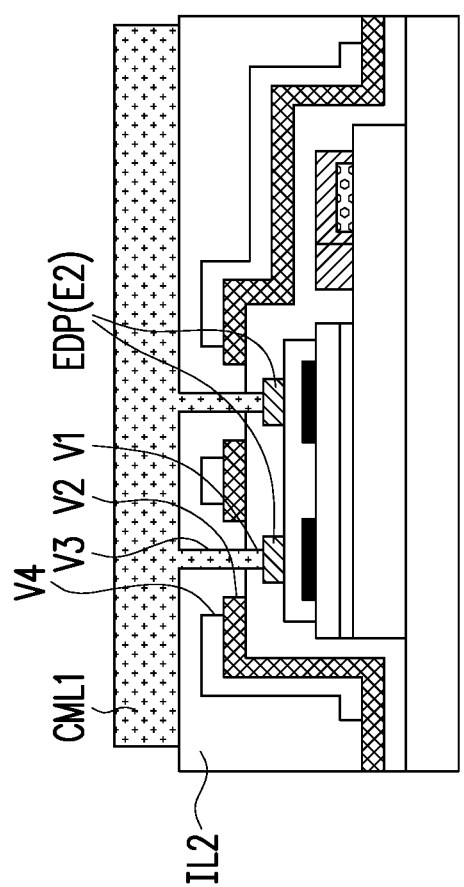
Figure 40:
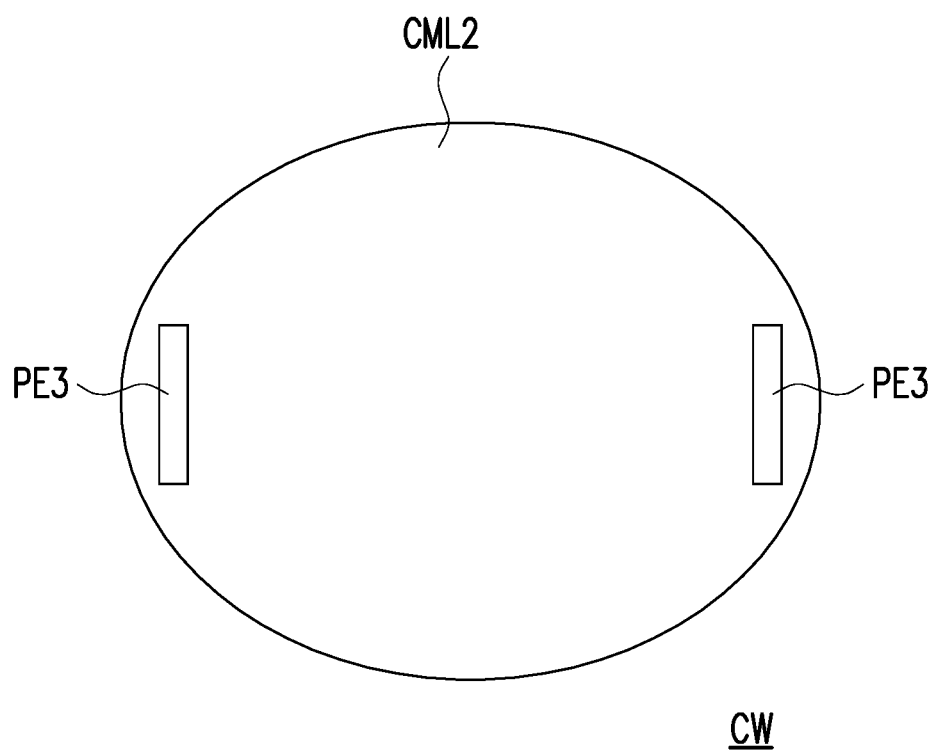
Figure 4P:
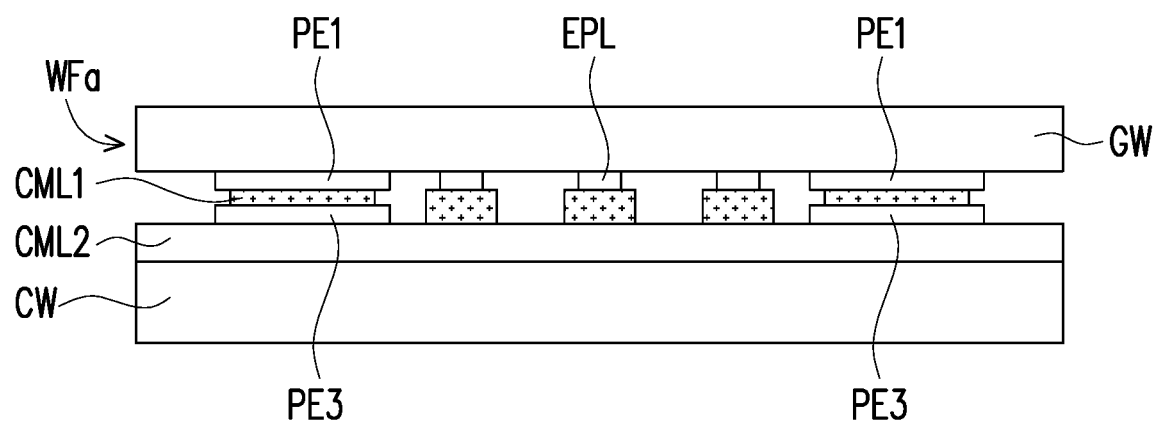
Figure 4Q:
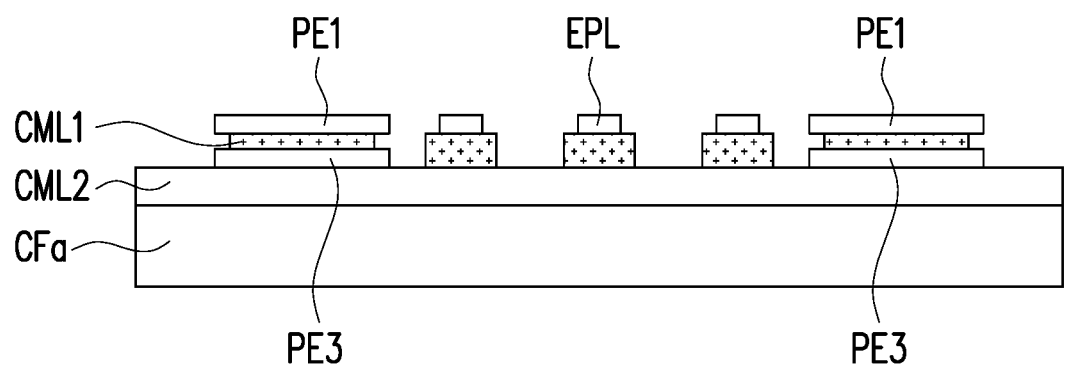
Figure 4R:
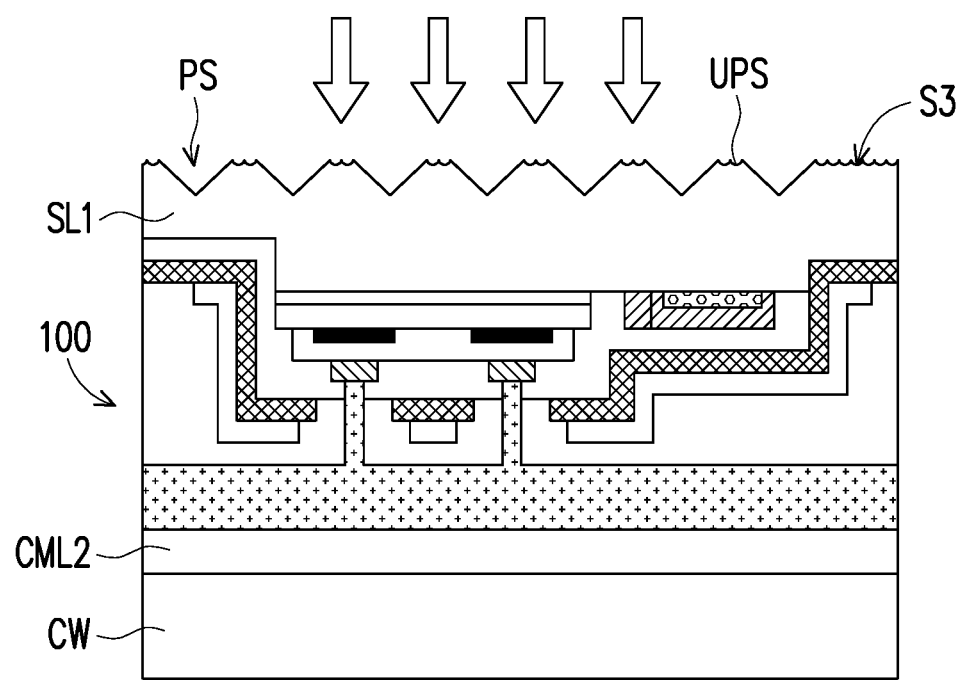
Figure 4S:
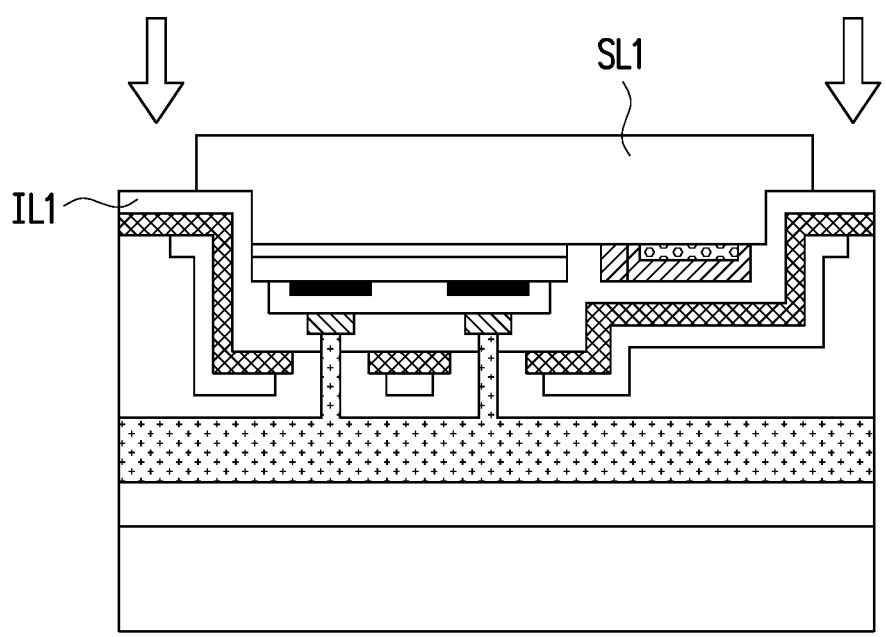
Figure 4T:
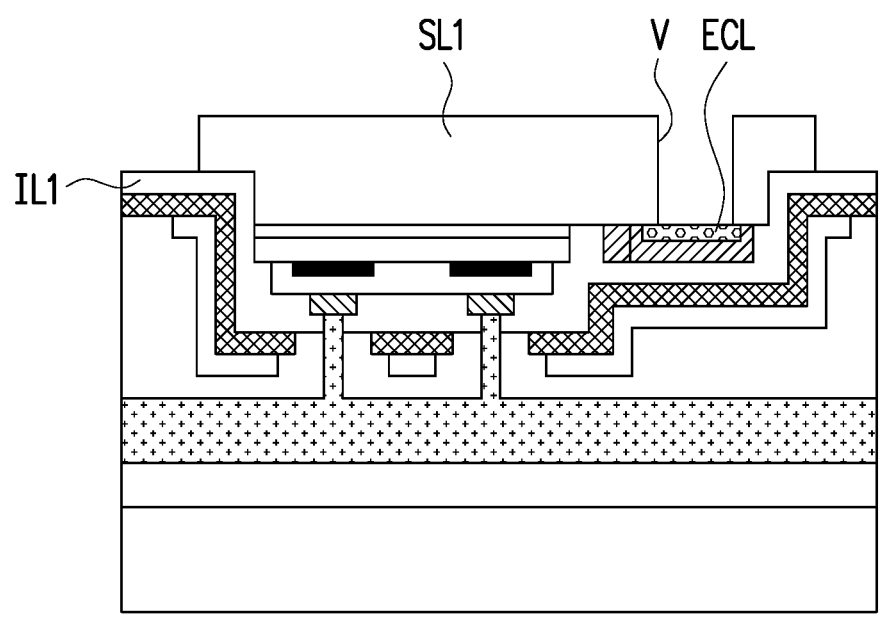
Figure 4U:
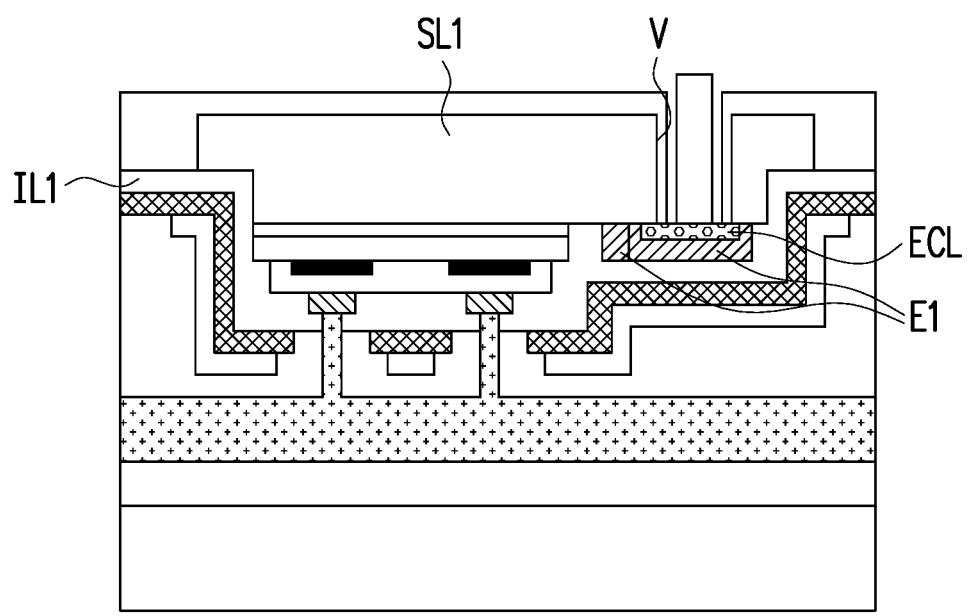
Figure 4V:
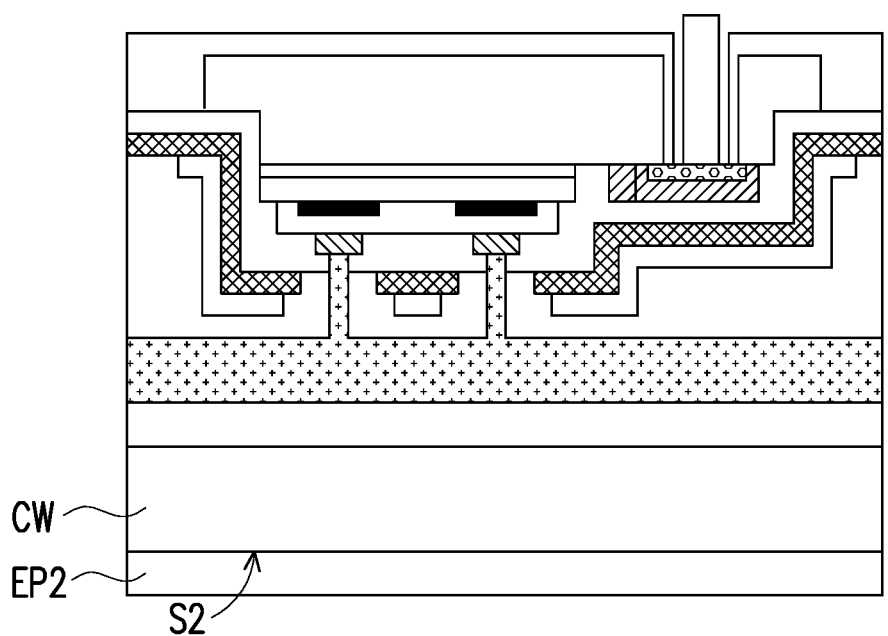
Figure 4W:
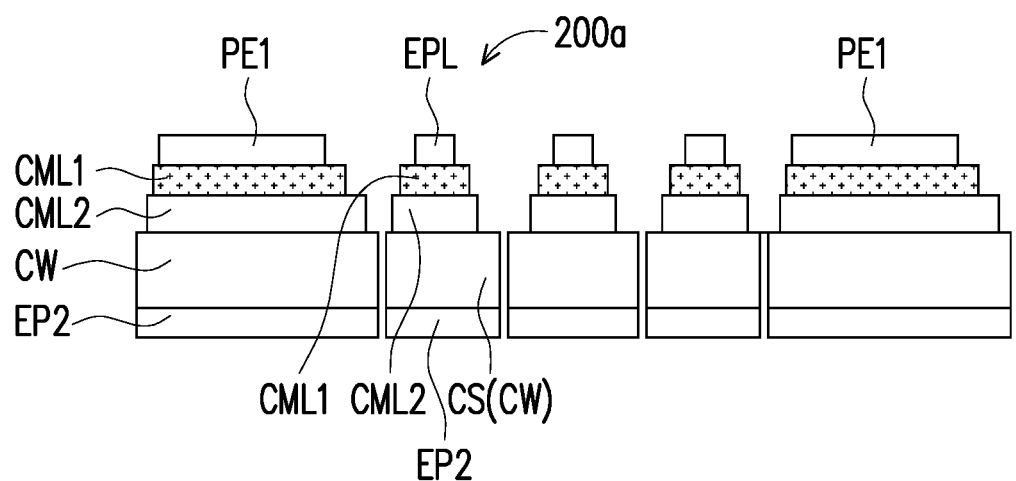
Figure 4X:
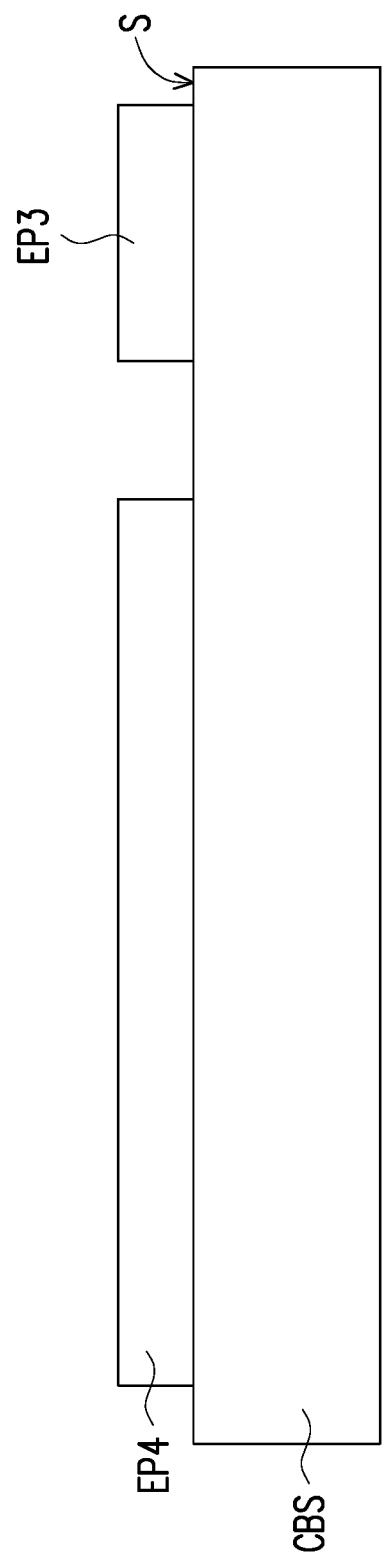
Figure 4Y:
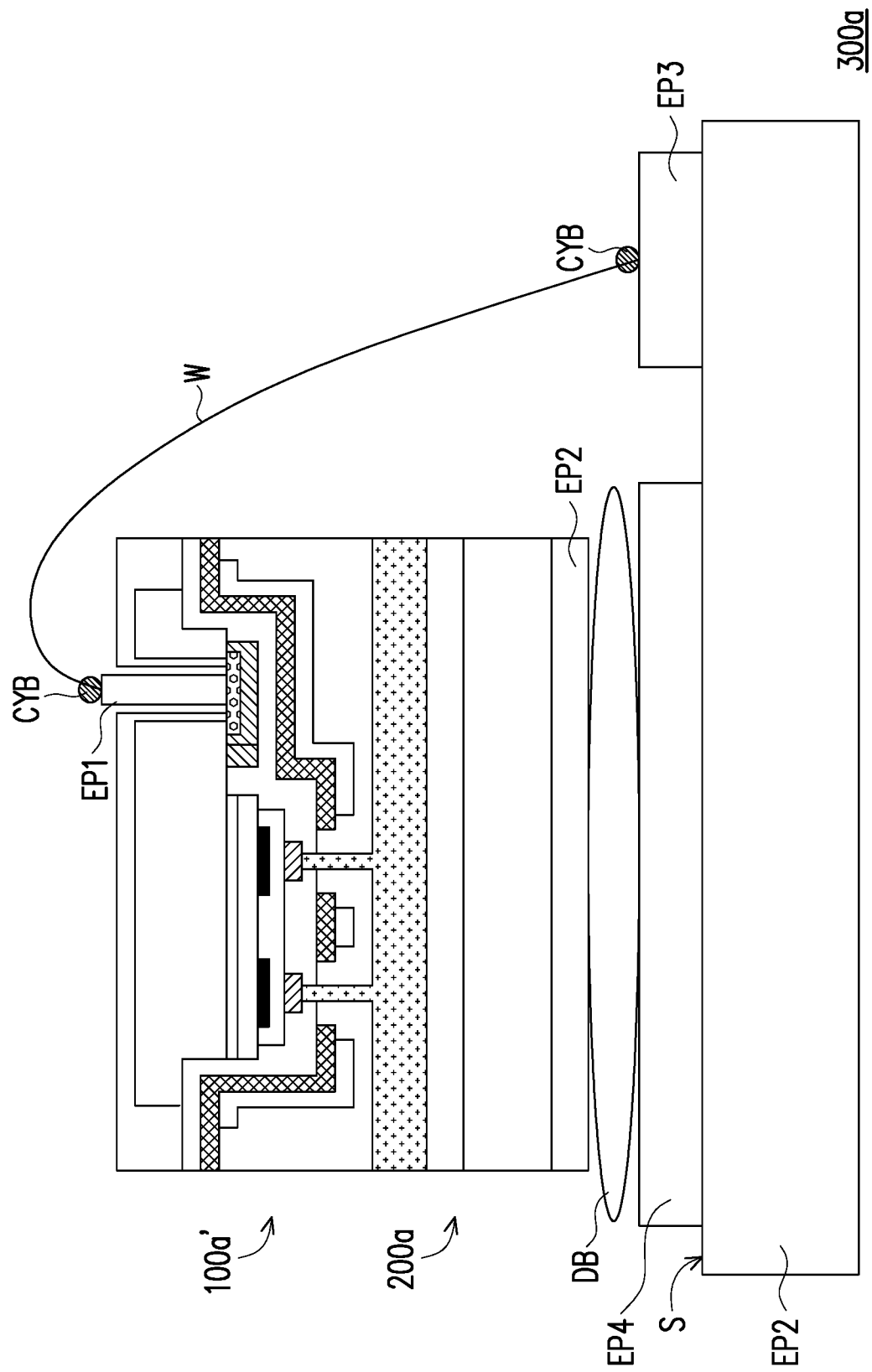

FIG. 4A to FIG. 4Y are diagrams illustrating a manufacturing process of the light emitting diode chip, the light emitting diode device and the light emitting diode module of FIG. 3A, FIG. 3C, and FIG. 3D.

Related descriptions of FIG. 4A to FIG. 4I are similar to those of FIG. 2A to FIG. 2I, and thus not repeated hereinafter. Following FIG. 4I, with reference to FIG. 4J, the second reflective layer RL2 of the first reflective stacked layer RS 1a is formed on the first reflective layer RL1. The second reflective layer RL2 has the fourth via holes V4. Similarly, the method of forming the second reflective layer RL2 is also similar to the method of forming the first reflective layer RL1 (i.e., the lift-off process), and thus not repeated hereinafter.

Related descriptions of FIG. 4K to FIG. 4L are similar to those of FIG. 2J to FIG. 2K, and thus not repeated hereinafter. At this point, the growth wafer GW is formed with a light emitting diode wafer WFa having a plurality of the light emitting diode chips 100a after the above steps.

Related descriptions of FIG. 4M to FIG. 4N are similar to those of FIG. 2L to FIG. 2M, and thus not repeated hereinafter. At this point, these light emitting diode chips 100a have been substantially completed.

Next, a manufacturing method of the light emitting diode device 200a will be described in the following paragraphs.

Referring to FIG. 4O after the step of the scribing process in FIG. 4M, the carrier wafer CW is provided. The entire surface of the carrier wafer CW is formed with the second connection metal layer CML2, and the third positioning elements PE3 are then formed thereon.

Referring to FIG. 4P, the aligning and bonding process is performed on the light emitting diode wafer WFa of FIG. 4M and the carrier wafer CW of FIG. 4O so that the light emitting diode chips 100a on the light emitting diode wafer WFa are bonded to the second connection metal layer CML2.

Referring to FIG. 4Q, the laser lift-off process or the wet chemical etching process are used to remove the growth substrates GW of the light emitting diode wafer WFa and remove the metal (e.g., gallium) so as to expose the epitaxy stacked layer EPL.

Related descriptions of FIG. 4R to FIG. 4W are similar to those of FIG. 2Q to FIG. 2V, and thus not repeated hereinafter. At this point, these light emitting diode devices 200a have been substantially completed.

Next, a manufacturing method of the light emitting diode module 300a will be described in the following paragraphs.

Related descriptions of FIG. 4X to FIG. 4Y are similar to those of FIG. 2W to FIG. 2X, and thus not repeated hereinafter. At this point, the light emitting diode module 300a has been substantially completed.

Figure 5A:
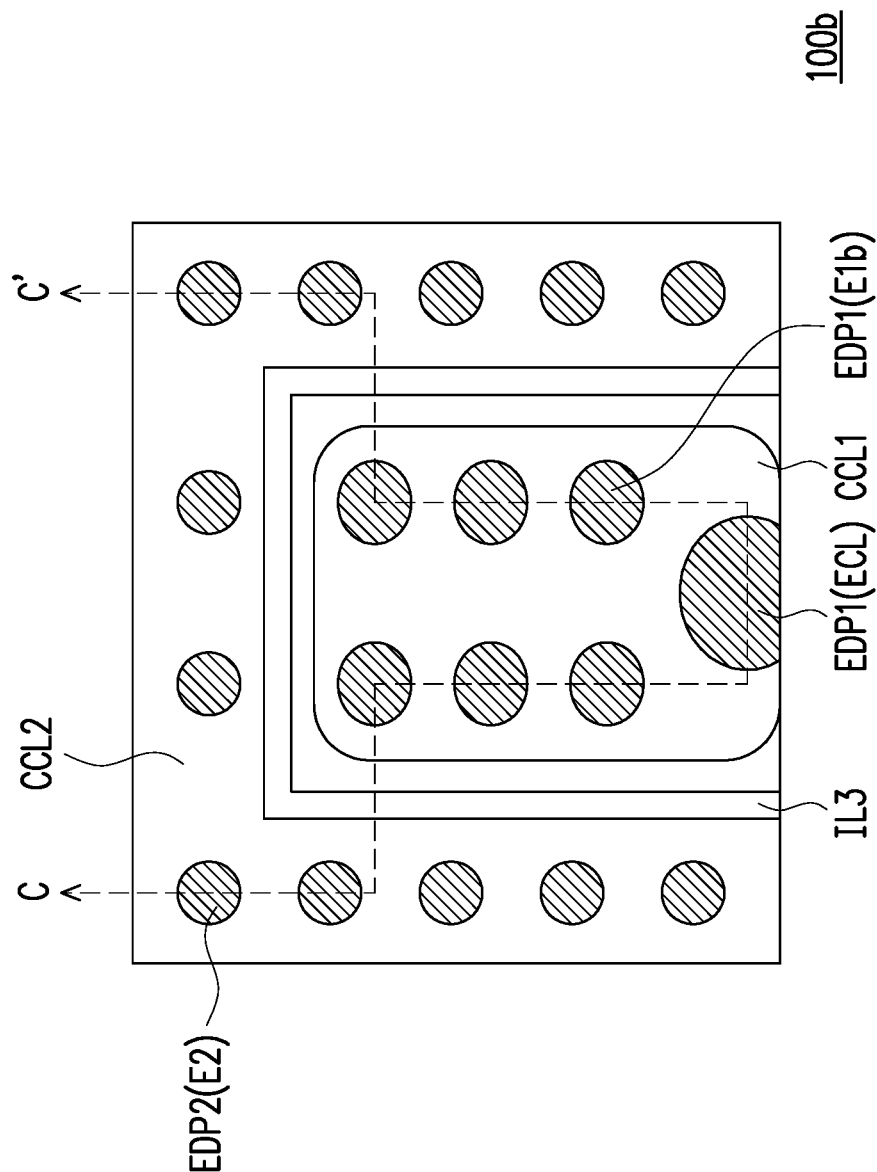
FIG. 5A is a cross-sectional view of a light emitting diode chip in a third embodiment of the invention.
Figure 5B:
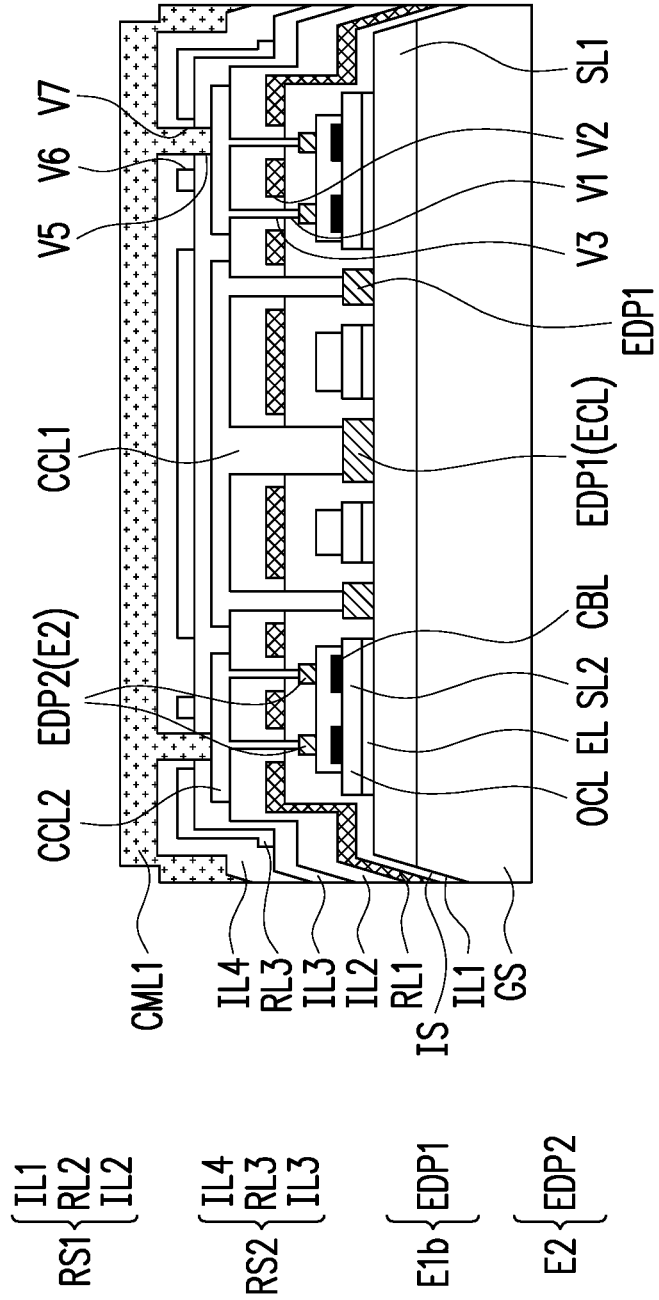
FIG. 5B is a top view of the light emitting diode chip of FIG. 5A.
Figure 5C:
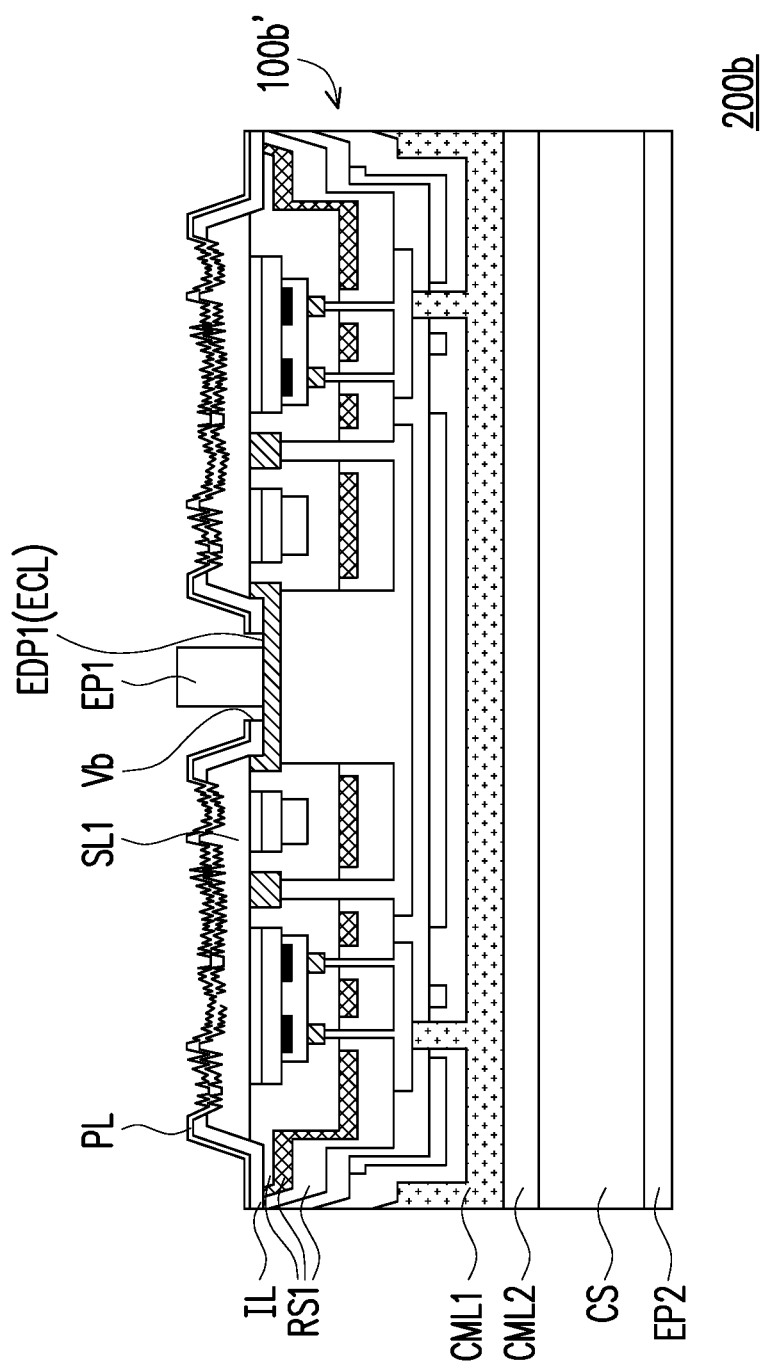
FIG. 5C is a cross-sectional view of a light emitting diode device using the light emitting diode chip of FIG. 5A.
Figure 5D:
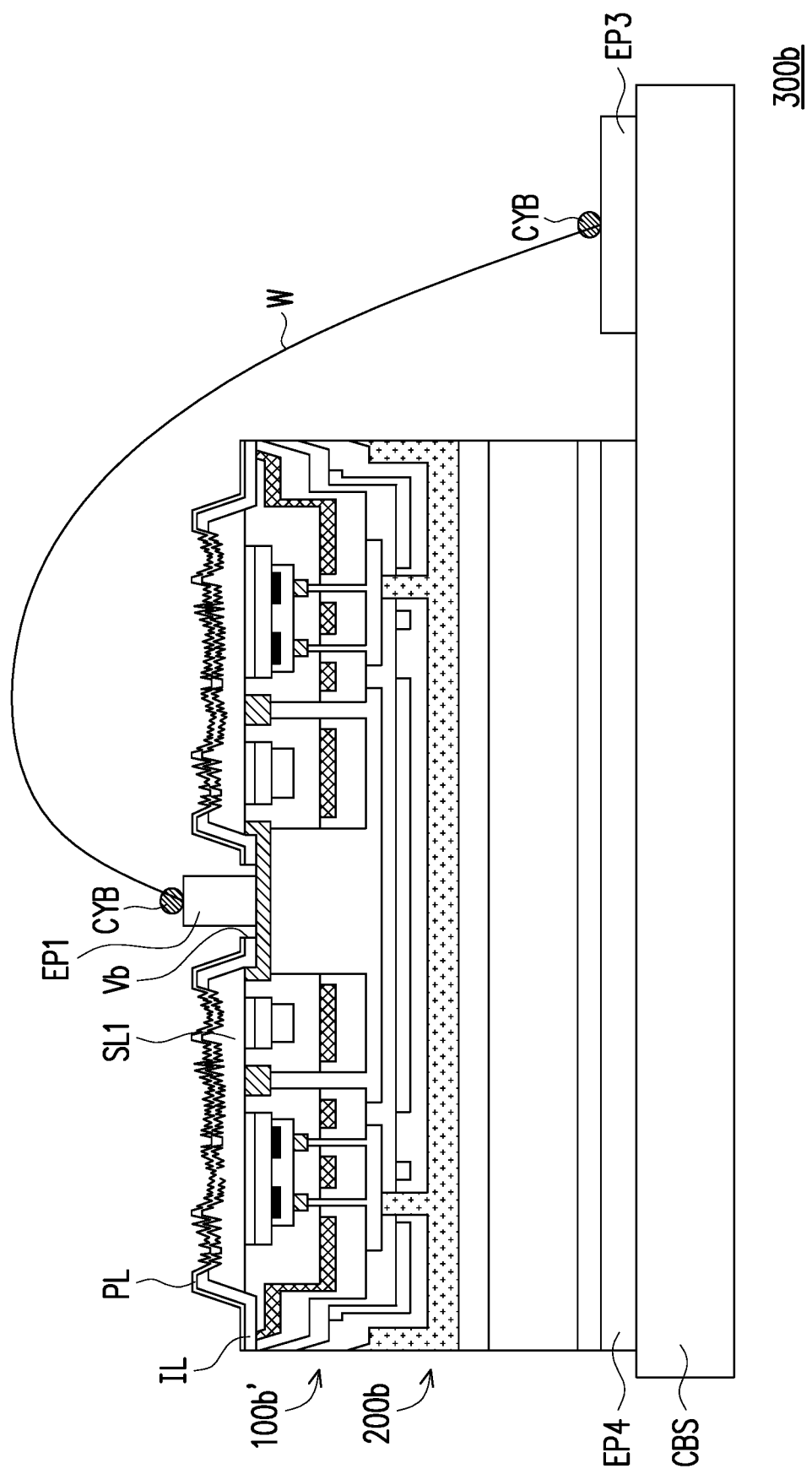
FIG. 5D is a cross-sectional view of a light emitting diode module using the light emitting diode chip of FIG. 5A.
Figure 5E:
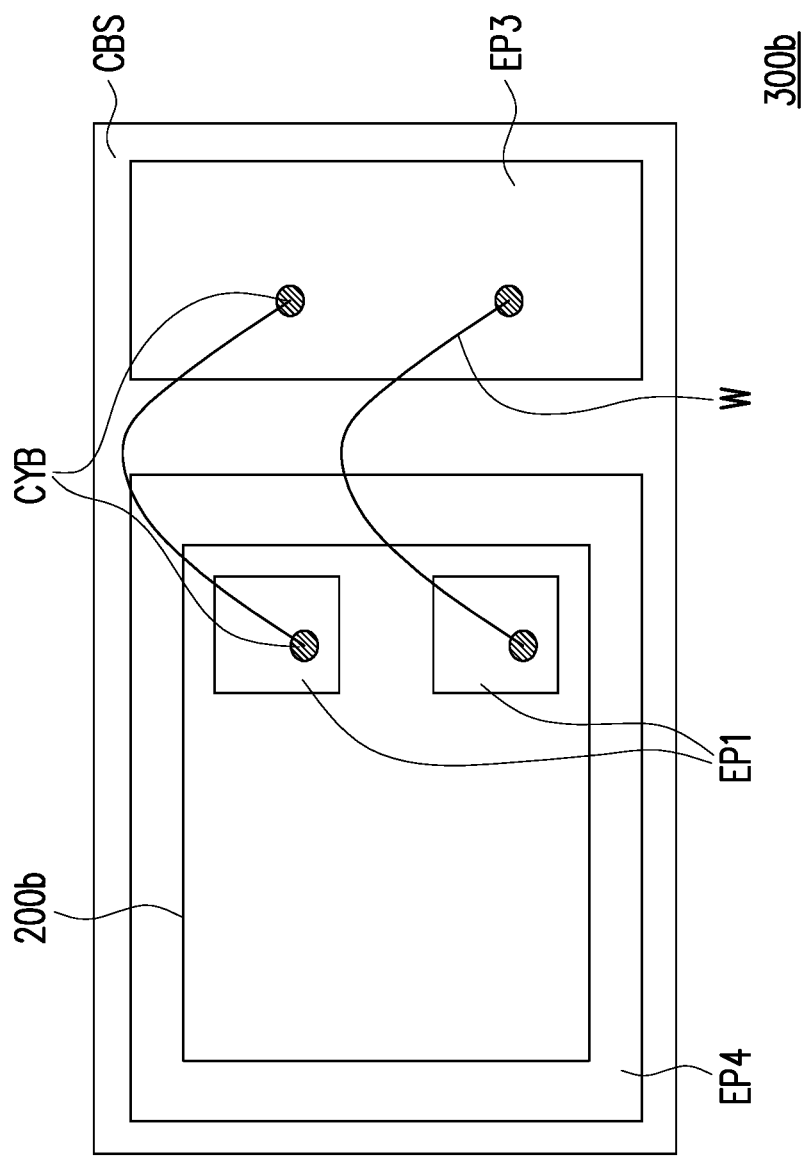
FIG. 5E is a top view of the light emitting diode module of FIG. 5D.

FIG. 5A is a cross-sectional view of a light emitting diode chip in a third embodiment of the invention. FIG. 5B is a top view of the light emitting diode chip of FIG. 5A. FIG. 5C is a cross-sectional view of a light emitting diode device using the light emitting diode chip of FIG. 5A. FIG. 5D is a cross-sectional view of a light emitting diode module using the light emitting diode chip of FIG. 5A. FIG. 5E is a top view of the light emitting diode module of FIG. 5D.

A light emitting diode chip 100b of FIG. 5A and FIG. 5B is substantially similar to the light emitting diode chip 100 of FIG. 1A. Their major difference is described as follows. Compared to the light emitting diode chip 100, the light emitting diode chip 100b further includes a second reflective stacked layer RS2, and first and second current conductive layers CCL1 and CCL2. Disposition relationship between the above elements will be described in detail in the following paragraphs.

The second reflective stacked layer RS2 includes a third insulation layer IL3, a third reflective layer RL3 and a fourth insulation layer IL4. The third reflective layer RL3 is located between the third and fourth insulation layers IL3 and IL4. The third insulation layer IL3 is disposed on the first reflective stacked layer RS1 and in contact with the first reflective layer RL1 or the second reflective layer RL2 of the first reflective stacked layer RS1. The third insulation layer IL3 has the fourth via holes V4. The third reflective layer RL3 has a plurality of fifth via holes V5. The fourth insulation layer IL4 has the sixth via holes V6. A size of the fifth via hole V5 is greater than a size of the fourth via hole V4 or the sixth via hole V6, and the sizes of the fourth via hole V4 and the sixth via hole V6 are substantially equal. More specifically, one fourth via hole V4 and one sixth via hole V6 are located in a range of one fifth via hole V5. The fourth via holes V4's orthogonal projections on the second-type semiconductor layer SL2 included by the third reflective layer RL3 are overlapped with a portion of the second electrode E2's orthogonal projection on the second-type semiconductor layer SL2. Further, in this embodiment, the first-type semiconductor layer SL1 and the growth substrate GS have an inclined surface IS, and portions of the first and second reflective layers RS1 and RS2 are conformally disposed on the inclined surface IS.

In other embodiments, the size of the sixth via hole may be equal to the sizes of the fifth and seventh via holes. The size of the sixth via hole may also be equal to the size of the first, second or third via holes, and those skilled in the art may design the size of the via hole according to their own design requirements. The invention is not limited in this regard.

A material of the third and fourth insulation layers IL3 and IL4 is selected to be similar to the material of the first and second insulation layers IL1 and IL2, which is not repeated hereinafter. The third reflective layer RL3 is a material layer with reflective function, which may be Distributed Bragg Reflector (DBR), Al, Al/Cu, Ag, Ag/Cu, Au, other suitable metals or alloys, or insulation layers with reflective function.

Among them, Distributed Bragg Reflector is an optical stacked layer formed by a plurality of layers with high and low refractive indexes stacked in a periodic arrangement, but is not limited thereto. In this embodiment, the third reflective layer RL3 may be Al, Al/Cu, Ag, Ag/Cu, Au, other suitable metals or alloys, but are electrically floating. In other words, the third reflective layer RL3 is not in communication with a current path in the light emitting diode chip 100b.

The first and second current conductive layers CCL1 and CCL2 are disposed between the first and second reflective stacked layers RS1 and RS2. Specifically, the first and second current conductive layers CCL1 and CCL2 are located on the same layer. The first current conductive layer CCL1 is disposed on the first electrode E1 and overlaps therewith. The second current conductive layer CCL2 is disposed on the second electrode E2 and overlaps therewith. The first current conductive layer CCL1 extends into the first, second and third via holes V1 to V3 to be in contact with the first electrode E1 and electrically connected thereto. The second current conductive layer CCL2 also extends into the first, second and third via holes V1 to V3 to be in contact with the second electrode E2 and electrically connected thereto.

On the other hand, the first connection metal layer CML1 is disposed on the second reflective stacked layer RS2, electrically connected to the second connection metal layer CCL2 through the fourth, fifth and sixth via holes V4 to V6 therein, and electrically connected to the second electrode E2 indirectly.

Further, referring to FIG. 5A, in this embodiment, a first electrode E1b further includes a plurality of first electrode portions EDP1 separated apart from each other, and the second electrode EP2 includes a plurality of second electrode portions EDP2 separated apart from each other. The second electrode portions EDP2 is disposed around the first electrode portions EDP1. Compared to the light emitting diode chip 100 of FIG. 1A, because the first electrode E1b of the light emitting diode chip 100b adopts the design of the separated apart first electrode portions EDP1, the proportion of area occupied by the first electrode E1b in the light emitting diode chip 100b is lower. Therefore, the light emitting diode chip 100b has higher luminous efficiency. In addition, one of the first electrode portions EDP1 is used as the etching block layer ECL.

As described above, compared to the light emitting diode chip 100 of FIG. 1A, in the light emitting diode chip 100b of the present embodiment, because the second reflective stacked layer RS2 is further disposed on the first reflective stacked layer RS1, the third reflective layer RL3 in the second reflective stacked layer RS2 can further reflect the portion of the light beam passing through the first reflective layer RL1 which is then in the direction towards the first side SD1. Therefore, the light emitting diode chip 100b has higher luminous efficiency. Further, since the second reflective stacked layer RS2 is provided with the reflective layer RL3 sandwiched by the two insulation layers IL3 and IL4, better protection function can be provided.

Referring to FIG. 5C, a light emitting diode device 200b of FIG. 5C is substantially similar to the light emitting diode device 200 of FIG. 1C. Their major difference is described as follows. The light emitting diode device 200b uses a light emitting diode chip 100b' of FIG. 5A. The light emitting diode chip 100b' is similar to the light emitting diode chip 100b, but differs in that the light emitting diode chip 100b' includes the insulation layer IL and a protection layer PL. The insulation layer IL covers the first-type semiconductor layer SL1 and the first reflective stacked layer RS1 and exposes the first electrode portion EDP1 used as the etching block layer ECL. The protection layer PL covers the insulation layer IL and the first-type semiconductor layer SL1. The insulation layer IL and the protection layer PL collectively have a via hole V', and the first electrode pad EP1 is disposed in the via hole V' and spaced apart from the insulation layer IL and the protection layer PL by an interval. In addition, since the first-type semiconductor layer SL1, the insulation layer IL and the protective layer PL have a non-periodic structure UPS, they can contribute to light extraction.

Referring to FIG. 5D, a light emitting diode module 300b of FIG. 5D is substantially similar to the light emitting diode module 300 of FIG. 1D. Their major difference is described as follows. The light emitting diode module 300a uses the light emitting diode device 200b of FIG. 5C.

As described above, compared to the light emitting diode device 200 and the light emitting diode module 300 of FIG. 1C and FIG. 1D, the light emitting diode device 200b and the light emitting diode module 300b of FIG. 5C and FIG. 5D have higher luminous efficiency.

Figure 6A:
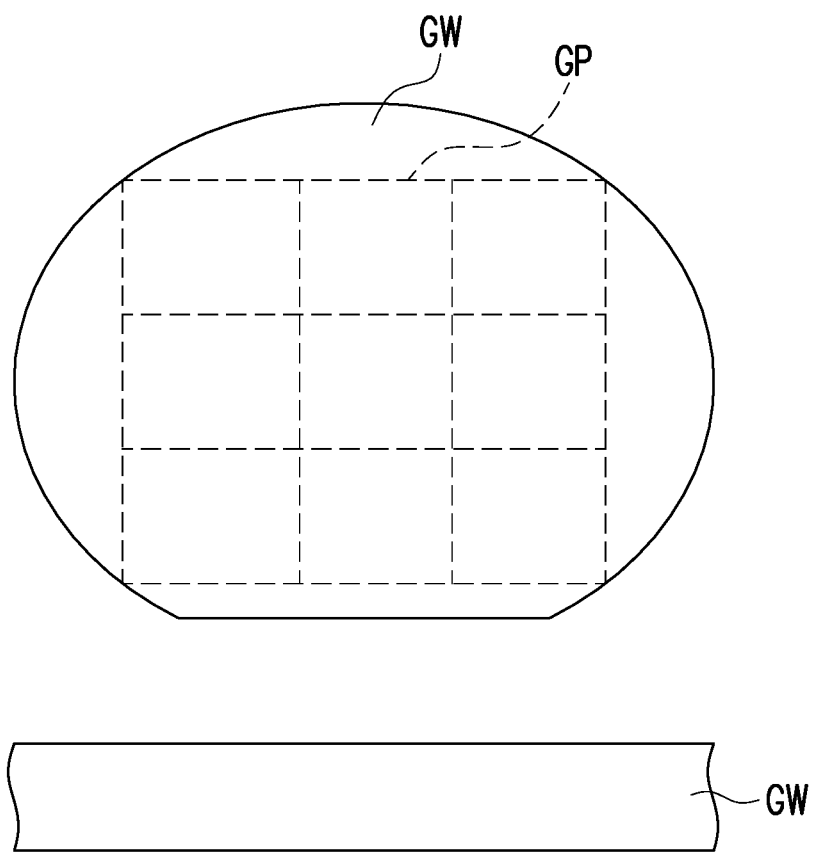
FIG. 6A to FIG. 6S are diagrams illustrating a manufacturing process of the light emitting diode chip, the light emitting diode device and the light emitting diode module of FIG. 5A, FIG. 5C, and FIG. 5D.

FIG. 6A to FIG. 6S are diagrams illustrating a manufacturing process of the light emitting diode chip, the light emitting diode device and the light emitting diode module of FIG. 5A, FIG. 5C, and FIG. 5D.

Figure 6B:
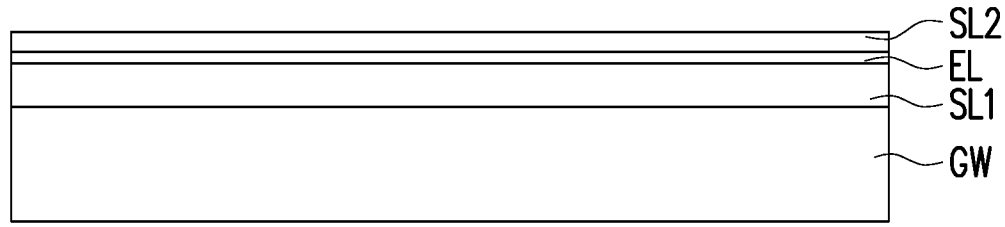

Descriptions of FIG. 6A and FIG. 6B are similar to related descriptions of FIG. 2A and FIG. 2B, and thus not repeated hereinafter.

Figure 6C:
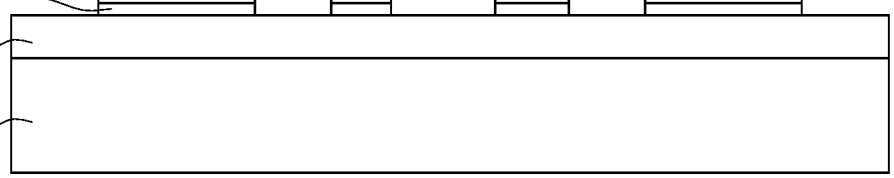

Referring to FIG. 6C, the epitaxy stacked layer ESL is etched to remove a portion of the second-type semiconductor layer SL2, a portion of the light-emitting layer EL and a portion of the first-type semiconductor layer SL1 so that a plurality of platform portions Mesa and a plurality of cave portions CP are formed. The method of etching includes, for example, a dry chemical etching, a wet chemical etching, a physical etching or a combination of the three, and the invention is not limited thereto.

Figure 6D:
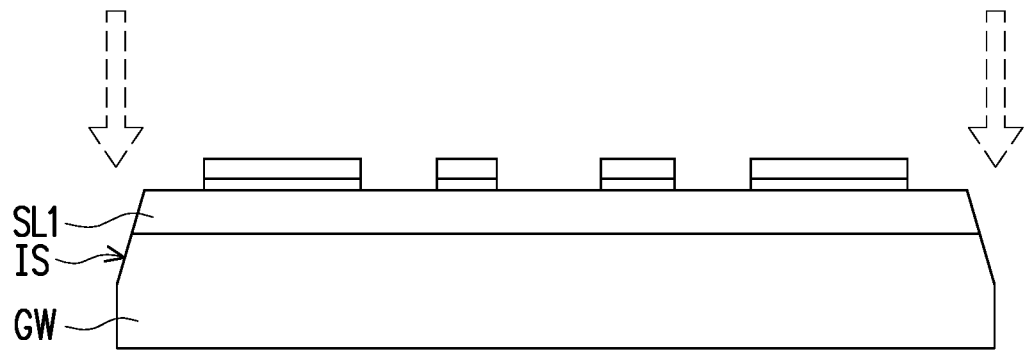

Referring to FIG. 6D, the scribing process is performed on the edge of the growth block EP to cut through the first-type semiconductor layer SL1 and a portion of the growth wafer GW so that the first-type semiconductor layer SL1 and the growth wafer GW collectively have the inclined surface IS.

Figure 6E:
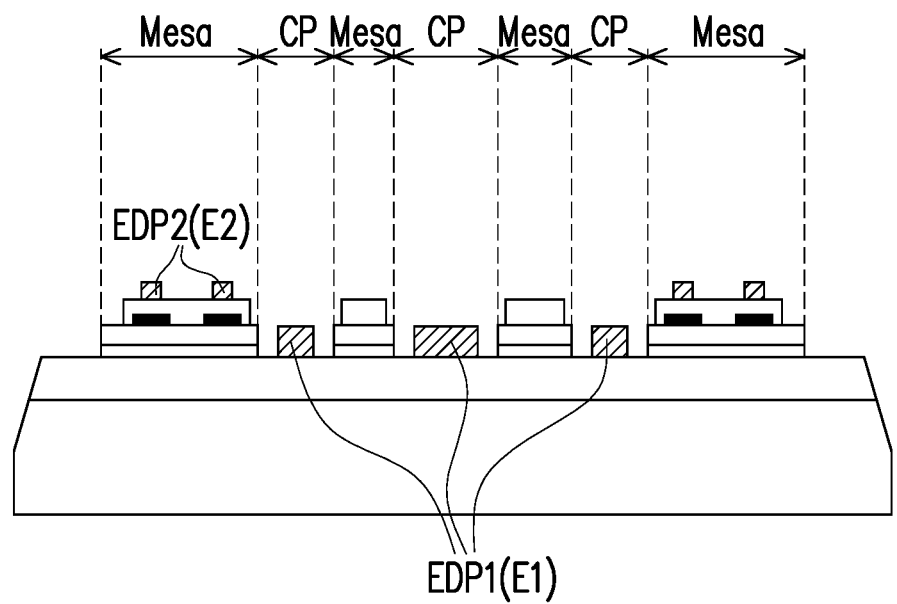

Referring to FIG. 6E, the patterned current block layer CBL, the ohmic contact layer OCL and the second electrode E2 are sequentially formed on a portion of the platform portions Mesa. The ohmic contact layer OCL is formed on another portion of the platform portions Mesa, and the first electrode E1 is formed on the cave portions CP. The first and second electrodes E1 and E2 respectively include the first electrode portions EDP1 separated apart from each other and the second electrode portions EDP1 separated apart from each other.

Figure 6F:
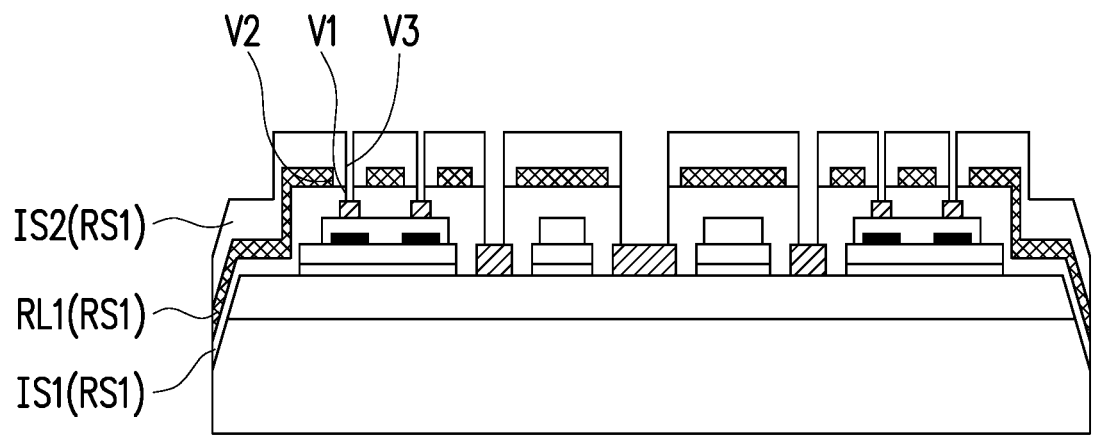

Referring to FIG. 6F, descriptions of FIG. 6F are similar to related descriptions of FIG. 2H and FIG. 2J, and thus not repeated hereinafter. Their major difference is described as follows. A portion of the first reflective stacked layer RS1 is formed on the inclined surface IS.

Figure 6G:
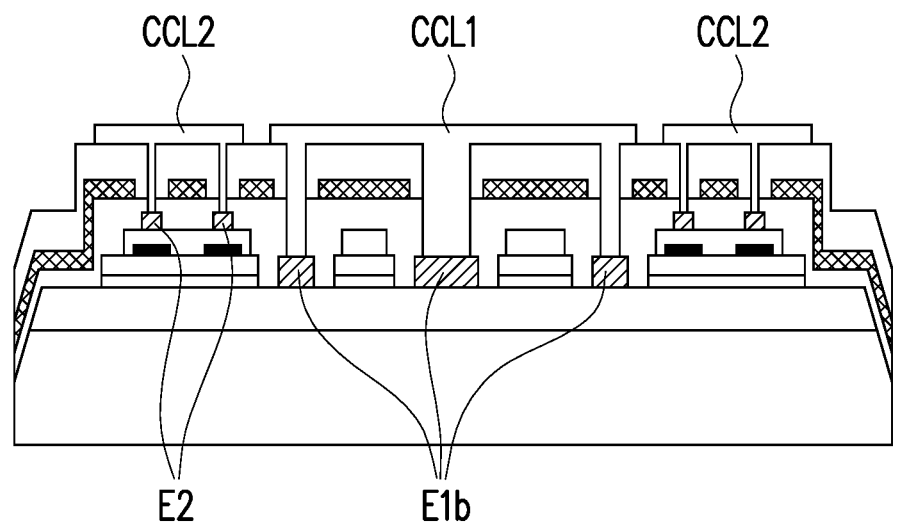

Referring to FIG. 6G, the first and second current conductive layers CCL1 and CCL2 are formed on the first reflective stacked layer RS1. The first and second current conductive layers CCL1 and CCL2 are overlapped with the first and second electrodes E1b and E2, respectively. The first current conductive layer CCL1 is electrically connected to the first electrode portions EDP1 separated apart from each other, and the second current conductive layer CCL2 is electrically connected to the second electrode portions EDP2 separated apart from each other.

Figure 6H:
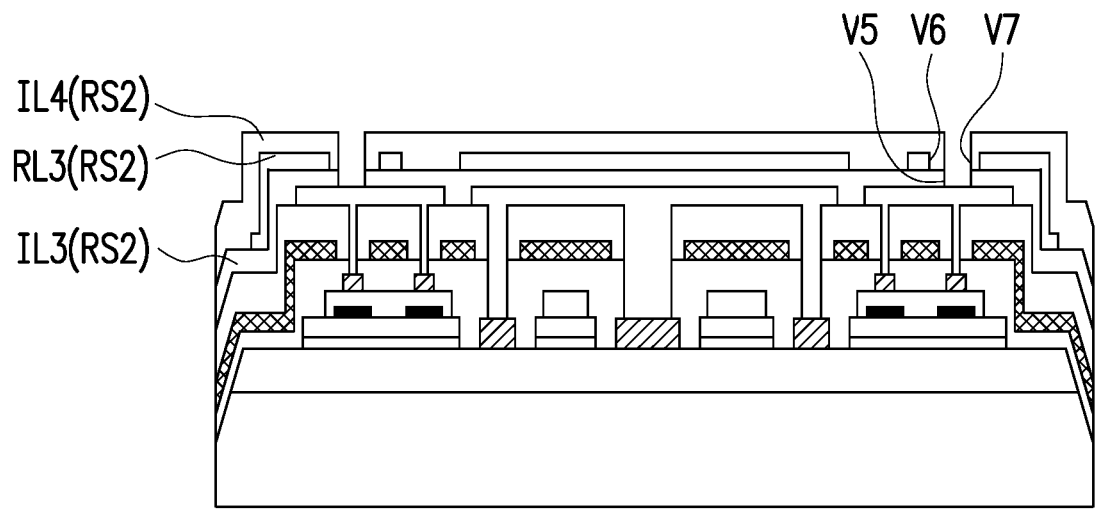

Referring to FIG. 6H, the second reflective stacked layer RS2 is formed on the first reflective stacked layer RS1. This step includes the following. The third insulation layer IL3 of the second reflective stacked layer RS2 is first formed on the first reflective stacked layer RS1, the first and second current conductive layers CCL1 and CCL2 and the growth wafer GW. The third insulation layer IL3 has the fifth via holes V5. Then, the third reflective layer RL3 of the second reflective stacked layer RS2 is formed on the third insulation layer IL3. The third reflective layer RL3 has the sixth via holes V6. The method of forming the third reflective layer RL3 is similar to the method of forming the first reflective layer RL1, and thus not repeated hereinafter. Lastly, the fourth insulation layer IL4 of the second reflective stacked layer RS2 is formed on the third reflective layer RL3. The fourth insulation layer IL4 has the seventh via holes V7. At this point, the second reflective stacked layer RS2 has been formed.

Figure 6I:
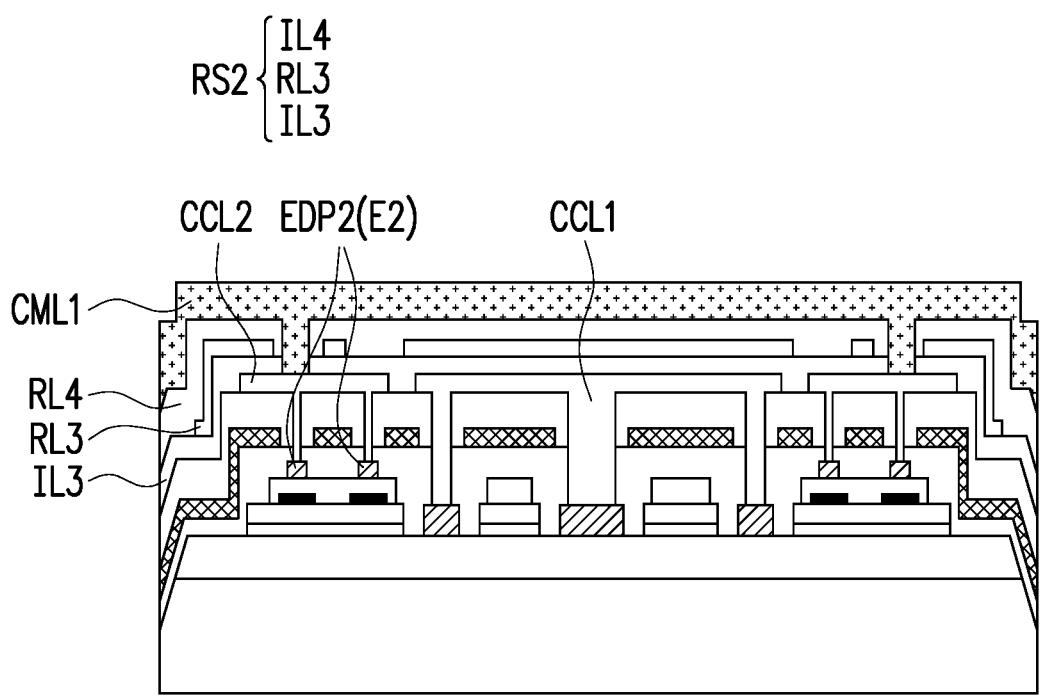

Referring to FIG. 6I, the first connection metal layer CML1 is formed on the second reflective stacked layer RS2, and the first connection metal layer CML1 is filled in the fifth, sixth and seventh via holes V5 to V7 so that the first connection metal layer CML1 is electrically connected to the second electrode E2 through the second current conductive layer CCL2. Further, a portion of the first connection metal layer CML1 covers the inclined surface IS. At this point, the growth wafer GW is formed with a light emitting diode wafer WFb having a plurality of the light emitting diode chips 100 after the above steps. If only one of the light emitting diode chips 100b is to be formed, it can be fabricated by the method of FIG. 2L to FIG. 2M, which are not repeated hereinafter.

Next, a manufacturing method of the light emitting diode device 200b will be described in the following paragraphs.

Figure 6J:
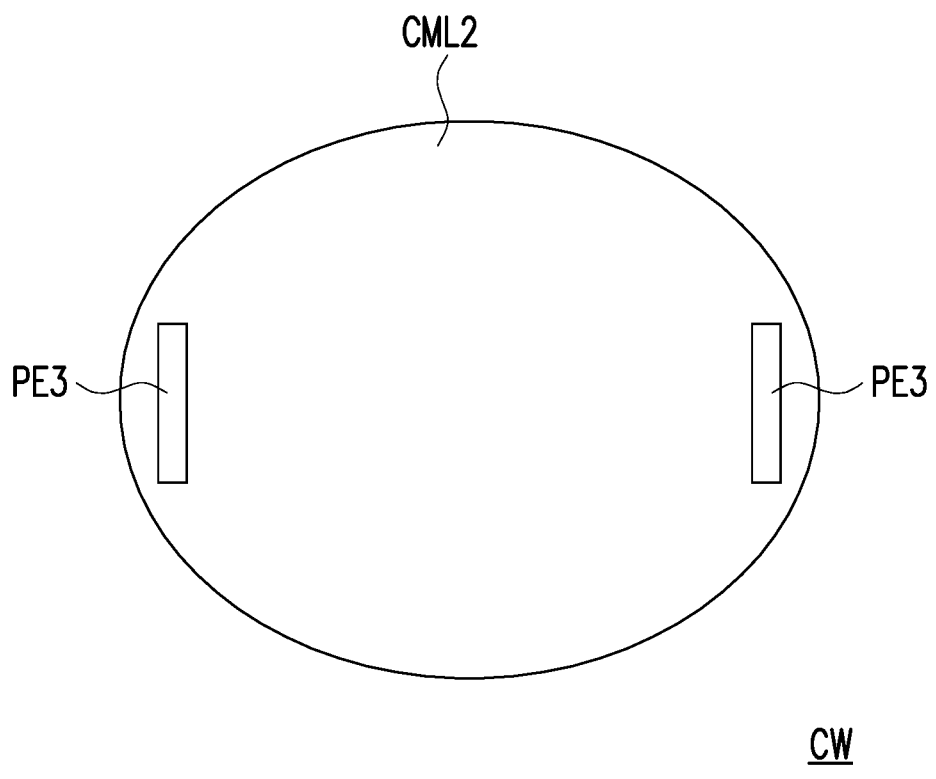
Figure 6K:
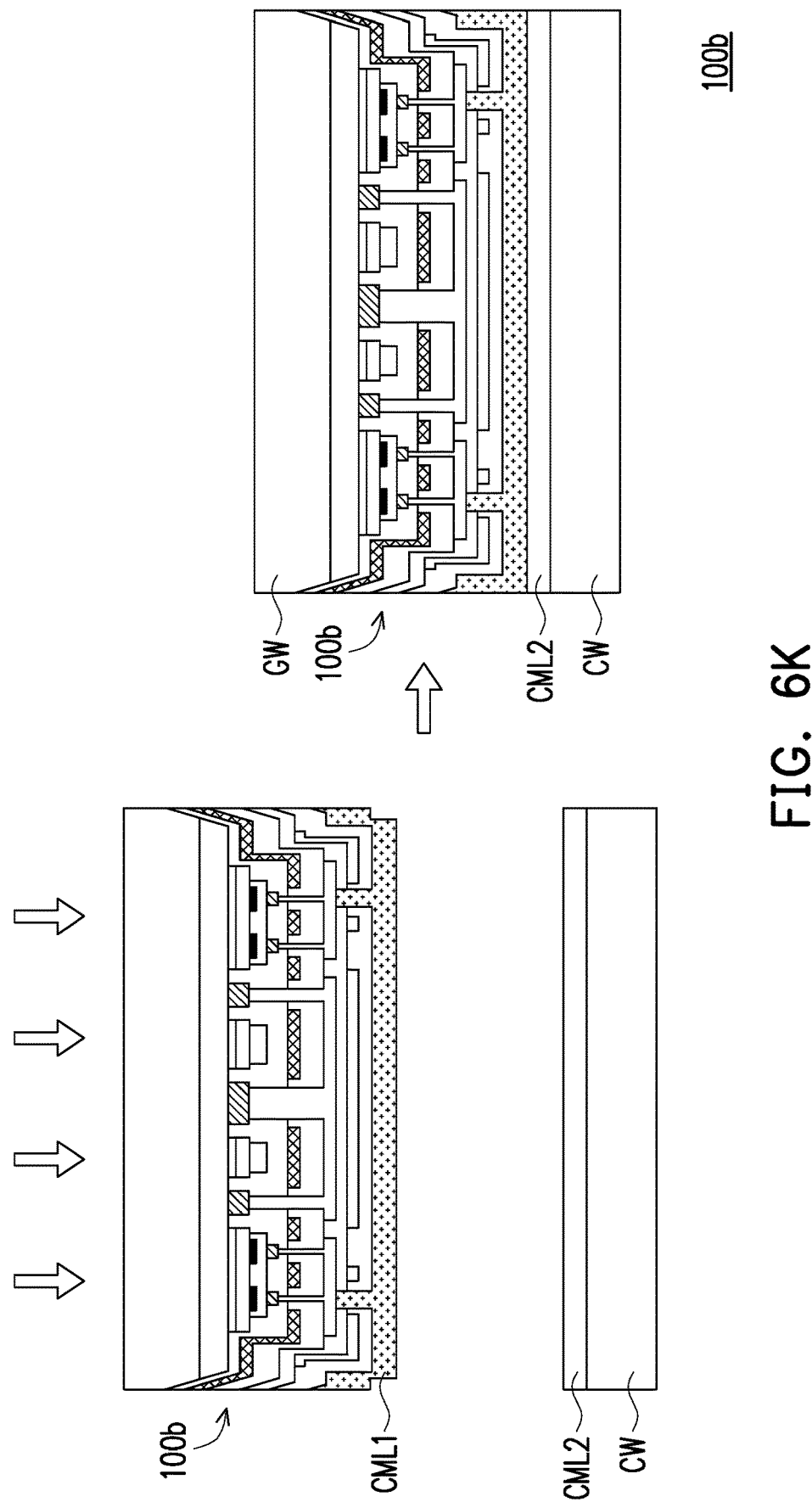

Following FIG. 6I, with reference to FIG. 6J and FIG. 6K, the steps of FIG. 6J and FIG. 6K are similar to those of FIG. 4O and FIG. 4P. In FIG. 6J, the second connection metal layer CML2 is formed on the entire surface of the carrier wafer CW. For simplicity, FIG. 6K is described by using the light emitting diode device 100b in one single growth block as an example.

Figure 6L:
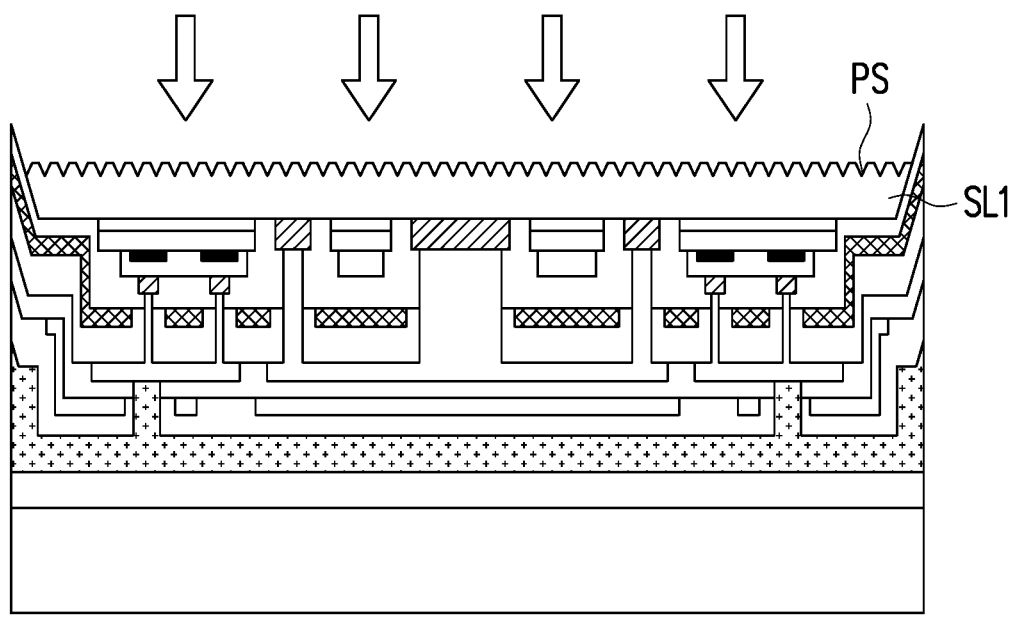

Referring to FIG. 6L, the laser lift-off process or the wet chemical etching process are used to remove the growth substrates GW of the light emitting diode device 100b and remove the metal (e.g., gallium) so as to expose a surface of the first-type semiconductor layer SL1 of the epitaxy stacked layer EPL. Similarly, because the epitaxy stacked layer EPL is the pattern previously formed on the surface of the growth wafer GW, the periodic structure PS is actually left on the surface of the first-type semiconductor layer SL1 after the growth wafer GW is removed.

Figure 6M:
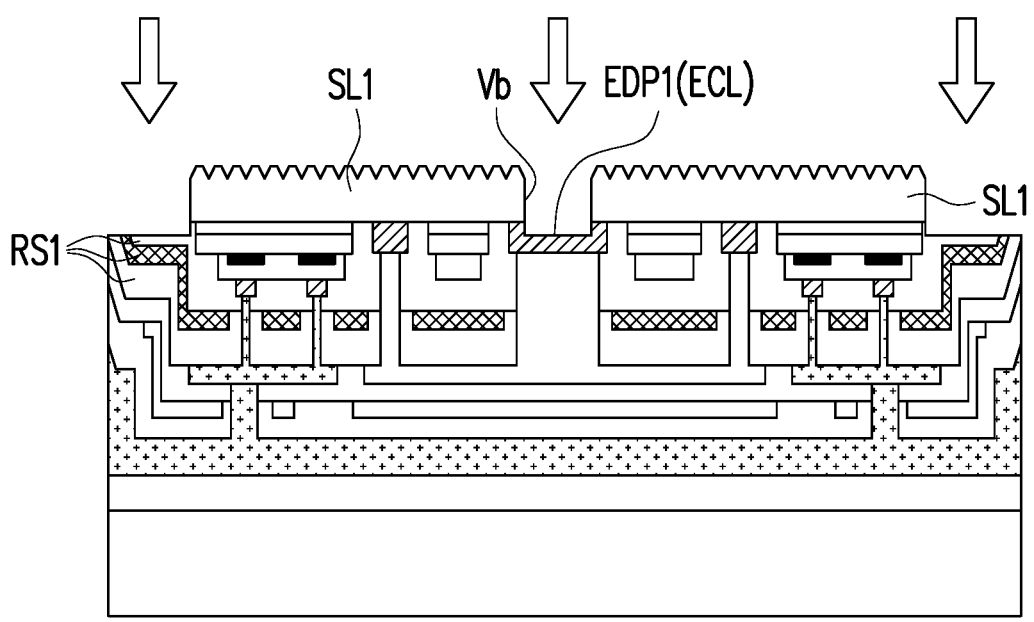

Referring to FIG. 6M, the etching process is performed on the periphery of the first-type semiconductor layer SL1 and the first reflective stacked layer RS1. Next, the etching process is performed on the first electrode portion EDP1 expected to be used as the etching block layer ECL in the first electrode E1 to form a via hole Vb.

Figure 6N:
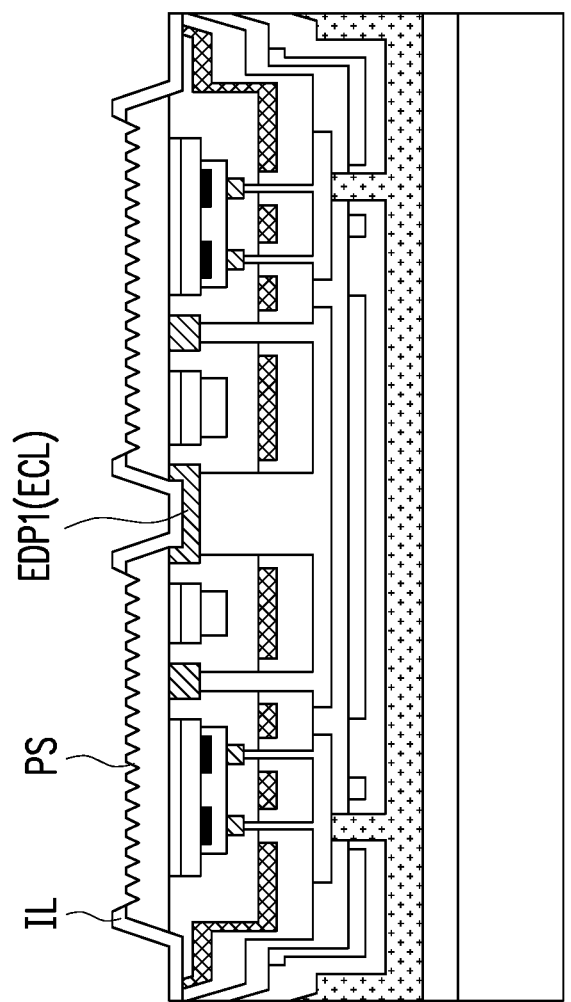
Figure 60:
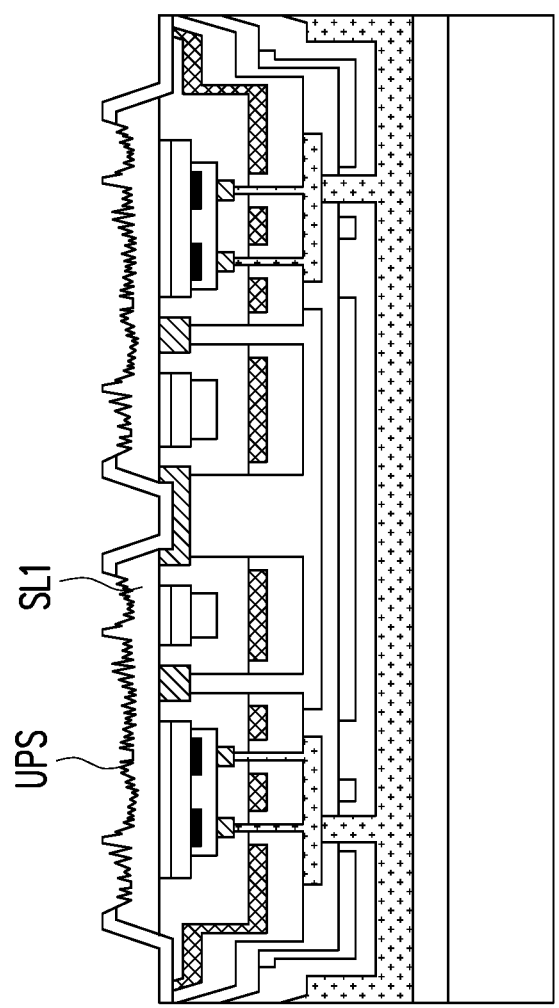

Referring to FIG. 6N, the insulation layer IL is formed on the first-type semiconductor layer SL1, the etching block layer ECL and the first reflective stacked layer RS1.

Referring to FIG. 6O, the wet chemical etching process is performed on the first-type semiconductor layer SL1 to form the non-periodic rough structure UPS on its surface.

Figure 6P:
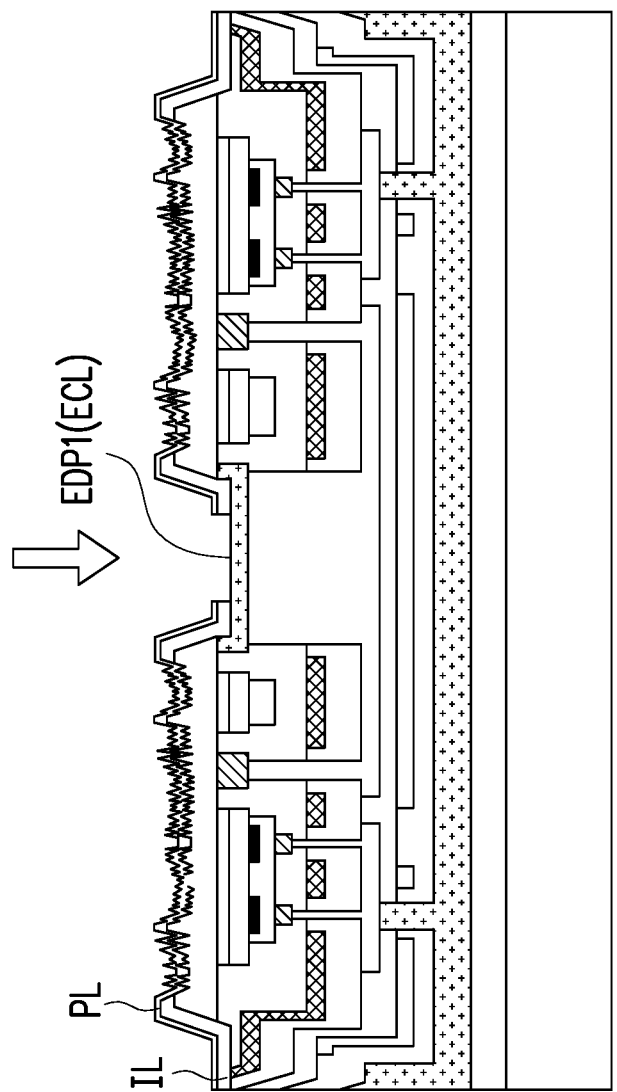

Referring to FIG. 6P, the protection layer PL is formed on the insulation layer IL, the etching block layer ECL and the first reflective stacked layer RS1. Then, the etching process is performed at the position of the etching block layer ECL to etch a portion of the protection layer PL and the insulation layer IL so as to expose a portion of the etching block layer ECL.

Figure 6Q:
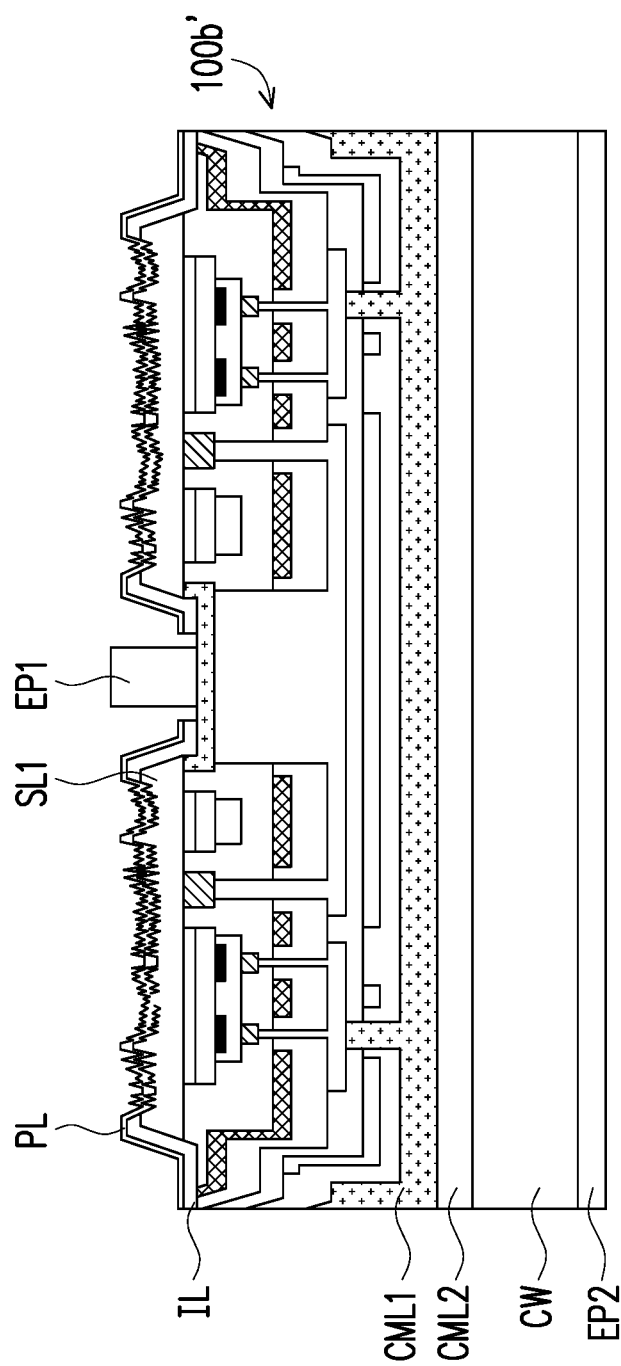

Referring to FIG. 6Q, the first electrode pad EP1 is formed at the position of the etching block layer ECL so that the first electrode pad EP1 is electrically connected to the etching block layer ECL. Further, the second electrode pad EP2 is formed on another surface of the carrier wafer CW. At this point, a plurality of light emitting diode devices 200b have been formed on the carrier wafer CW, and each of the preset disposition regions PD is provided with one light emitting diode device 200b. Next, the scribing process can be performed on the carrier wafer CW so that the light emitting diode devices 200b are separated apart from each other.

Next, a manufacturing method of the light emitting diode module 300b will be described in the following paragraphs.

Figure 6R:
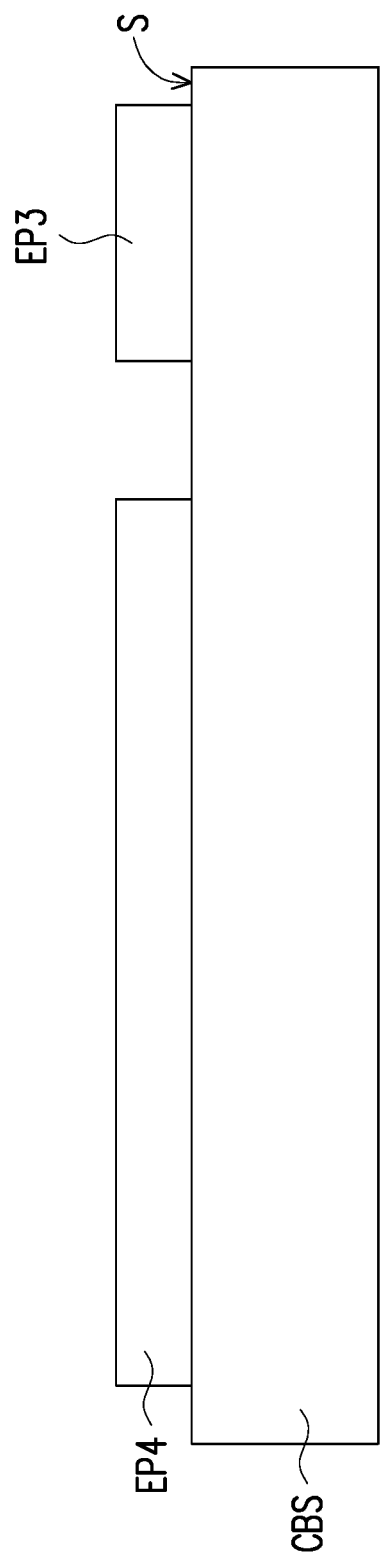

Referring to FIG. 6R and FIG. 6S, related descriptions of FIG. 6R and FIG. 6S are similar to those of FIG. 2W and FIG. 2V, and thus not repeated hereinafter. At this point, the light emitting diode module 300b has been substantially completed.

It should be noted that, in the embodiments of the invention, the light emitting diode devices 200, 200a and 200b are all illustrated as having the second electrode pad EP2. Nonetheless, in other embodiments not shown, if a material of the carrier substrate CW is selected as a conductive substrate, the second electrode pad can then be omitted.

To sum up, in the light emitting diode chip, the light emitting diode device and the light emitting diode module according to the embodiments of the invention, because the light-emitting layer is misaligned with the first electrode, most of the light beam will not be shielded by the first electrode but output when the light-emitting layer emits light. Further, because the first reflective layer is misaligned with the second electrode, most of the light beam will be output due to reflection of the first reflective layer when the light-emitting layer emits light. After being output through the via hole (e.g., the second via hole) of the first reflective layer, a small portion of the light beam will be output due to reflection of the second electrode. Therefore, the light emitting diode chip, the light emitting diode device and the light emitting diode module can have good luminous efficiency. Moreover, when the light emitting diode module is to be assembled, because the first electrode pad of the light emitting diode module has the same electrical property as the surrounding first-type semiconductor layer (the uppermost layer of the epitaxy stacked layer), when a wire of the first electrode pad is deviated and thus connected to an uppermost semiconductor layer of the epitaxy stacked layer in the wire bonding process, the possibility of short circuit and current leakage caused by different electrical properties can be significantly reduced. As a result, not only can a window be increased, stability of the light emitting diode module during assembly can also be increased.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A light emitting diode device, comprising:
a conductive layer having an upper surface and a lower surface;
an epitaxial stacked layer, comprising a first-type semiconductor layer, a second-type semiconductor layer and a light-emitting layer located between the first-type semiconductor layer and the second-type semiconductor layer, disposed on and electrically connected to the conductive layer, wherein the second-type semiconductor layer and the light-emitting layer are beneath the first-type semiconductor layer and expose a portion of a lower surface of the first-type semiconductor layer;
a first electrode layer disposed on the exposed portion of the lower surface of the first-type semiconductor layer;
a via hole passing through the first-type semiconductor layer and exposing a portion of the first electrode layer;
a first electrode pad disposed in the via hole and electrically connected to the first electrode layer;
an insulation layer covering an upper surface of the first-type semiconductor layer and extending into the via hole and exposing the first electrode pad;
a connection metal layer disposed on the upper surface of the conductive layer and electrically connected to the second-type semiconductor layer;
a reflective layer disposed between the connection metal layer and the second-type semiconductor layer; and
a second electrode pad disposed on the lower surface of the conductive layer.

2. The light emitting diode device according to claim 1, further comprising a second electrode disposed between the second-type semiconductor layer and the reflective layer, wherein the reflective layer has a plurality of second via holes therein to expose the second electrode.

3. The light emitting diode device according to claim 2, wherein the reflective layer comprises Distributed Bragg Reflector (DBR), Al, Al/Cu, Ag, Ag/Cu, Au, or their alloys or combinations thereof.

4. The light emitting diode device according to claim 3, further comprising a first insulation layer and a second insulation layer, wherein the first insulation layer and the second insulation layer sandwich the reflective layer and expose the second via holes in the reflective layer.

5. The light emitting diode device according to claim 3, wherein the reflective layer is electrically floating.

6. The light emitting diode device according to claim 2, further comprising a second connection metal layer disposed between the reflective layer and the connection metal layer, wherein the second connection metal layer is coupled to the second electrode through the second via holes in the reflective layer.

7. The light emitting diode device according to claim 2, further comprising an ohmic contact layer disposed between the second-type semiconductor layer and the second electrode.

8. The light emitting diode device according to claim 7, wherein the ohmic contact layer comprises Ni/Au, Au/Be, Au/Ge, their alloys or combinations thereof.

9. The light emitting diode device according to claim 7, wherein the ohmic contact layer comprises indium tin oxide (ITO).

10. The light emitting diode device according to claim 7, further comprising a current block layer disposed between the second-type semiconductor layer and the ohmic contact layer, wherein the second electrode aligns with the current block layer.

11. The light emitting diode device according to claim 10, wherein the current block layer comprises a material layer having a high resistance value that reduces a current to pass therethrough.

12. The light emitting diode device according to claim 11, wherein the current block layer comprises a dielectric material.

13. The light emitting diode device according to claim 12, wherein the current block layer comprises silicon oxide (SiOx), silicon nitride (SiNx) or Distributed Bragg Reflector (DBR).

14. The light emitting diode device according to claim 7, further comprising a patterned current block layer disposed between the second-type semiconductor layer and the ohmic contact layer, wherein the second electrode aligns with the patterned current block layer.

15. The light emitting diode device according to claim 2, further comprising an ohmic contact layer disposed between the second-type semiconductor layer and the second electrode, and a current block layer disposed between the second-type semiconductor layer and the ohmic contact layer, wherein the second electrode aligns with the current block layer.

16. The light emitting diode device according to claim 2, further comprising an ohmic contact layer disposed between the second-type semiconductor layer and the second electrode, and a patterned current block layer disposed between the second-type semiconductor layer and the ohmic contact layer, wherein the second electrode aligns with the patterned current block layer.

17. The light emitting diode device according to claim 1, wherein the first electrode layer comprises an etching block layer and a first electrode covering the etching block layer, wherein the first electrode pad is coupled to the etching block layer through the via hole.

18. The light emitting diode device according to claim 17, wherein the etching block layer comprises Cr, AL, Ti, Ni, Pt, Au, W, CuW or combinations thereof.

19. The light emitting diode device according to claim 17, wherein the etching block layer comprises indium tin oxide (ITO).

* * * * *